US006961423B2

(12) United States Patent
Pessoa et al.

(10) Patent No.: US 6,961,423 B2
(45) Date of Patent: Nov. 1, 2005

(54) METHOD AND APPARATUS FOR PERFORMING ADAPTIVE FILTERING

(75) Inventors: Lucio F. C. Pessoa, Cedar Park, TX (US); Roman A. Dyba, Austin, TX (US); Perry P. He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 426 days.

(21) Appl. No.: 10/178,176

(22) Filed: Jun. 24, 2002

(65) Prior Publication Data

US 2003/0235244 A1 Dec. 25, 2003

(51) Int. Cl.[7] .............................................. H04M 9/08
(52) U.S. Cl. ........................ 379/406.08; 379/406.01; 379/406.02; 379/406.04; 379/406.05; 379/406.06; 379/406.09
(58) Field of Search .................. 379/406.01–406.16

(56) References Cited

U.S. PATENT DOCUMENTS

| 4,363,100 A | 12/1982 | Agnew et al. |
| 4,645,883 A | 2/1987 | Horna et al. |
| 4,658,420 A | 4/1987 | Fukushi et al. |

(Continued)

FOREIGN PATENT DOCUMENTS

| EP | 0 300 265 A2 | 1/1989 |
| EP | 0792029 A2 | 3/1997 |
| WO | WO 95/17784 | 6/1995 |
| WO | WO 97/49196 | 12/1997 |
| WO | WO 00/30325 | 5/2000 |
| WO | WO 00/69080 | 11/2000 |

OTHER PUBLICATIONS

Melsa, et al. "Impulse Response Shortening for Discrete Multitone Transceivers," IEEE Transactions on Communications, vol. 44, No. 12, Dec. 1996, pp. 1662–1671.

Kumaresan, et al. "Instantaneous Non–Linear Operators for Tracking Multicomponent Signal Parameters," Department of Electrical Engineering, University of Rhode Island, Kingston, RI, pp. 404–407.

Maragos et al, "Energy Separation in Signal Modulations with Application to Speech Analysis," IEEE Transactions on Signal Processing, vol. 41, No. 10, Oct. 1993, pp. 3024–3051.

Velez, "Detection of Multi–tone Signals Based on Energy Operators," IEEE, 1994 pp. 229–232.

(Continued)

Primary Examiner—Sinh Tran
Assistant Examiner—Ramnandan Singh
(74) Attorney, Agent, or Firm—Joanna G. Chiu; Susan C. Hill

(57) ABSTRACT

A communication system having an echo canceller is disclosed. One embodiment of the echo canceller includes an adaptive filter used to provide an estimate of reflected echo which is removed from the send signal. The echo canceller may also include a near-end talker signal detector which may be used to prevent the adaptive filter from adapting when a near-end talker signal is present. The echo canceller may also include a nonlinear processor used to further reduce any residual echo and to preserve background noise. The echo canceller may also include a monitor and control unit which may be used to monitor the filter coefficients and gain of the adaptive filter to maintain stability of the echo canceller, estimate pure delay, detect a tone, and inject a training signal. The echo canceller may also include a nonadaptive filter used to reduce the length of the adaptive filter.

23 Claims, 32 Drawing Sheets

U.S. PATENT DOCUMENTS

| | | | |
|---|---|---|---|
| 4,751,730 A | | 6/1988 | Galand et al. |
| 4,771,396 A | * | 9/1988 | South et al. ................. 708/319 |
| 4,829,566 A | | 5/1989 | Lassaux et al. |
| 4,894,820 A | | 1/1990 | Miyamoto et al. |
| 5,029,204 A | | 7/1991 | Shenoi et al. |
| 5,042,026 A | | 8/1991 | Koike et al. |
| 5,274,705 A | | 12/1993 | Younce et al. |
| 5,343,522 A | | 8/1994 | Yatron et al. |
| 5,353,346 A | | 10/1994 | Cox et al. |
| 5,390,250 A | | 2/1995 | Janse et al. |
| 5,392,347 A | | 2/1995 | Ito et al. |
| 5,420,921 A | | 5/1995 | Lahdemaki |
| 5,446,787 A | | 8/1995 | Lofmark |
| 5,521,908 A | | 5/1996 | Younce et al. |
| 5,561,668 A | | 10/1996 | Genter |
| 5,587,998 A | * | 12/1996 | Velardo et al. ............. 370/289 |
| 5,615,302 A | | 3/1997 | McEachern |
| 5,664,011 A | * | 9/1997 | Crochiere et al. ..... 379/406.08 |
| 5,689,556 A | | 11/1997 | Gupta et al. |
| 5,721,782 A | | 2/1998 | Piket et al. |
| 5,737,410 A | | 4/1998 | Vähätalo et al. |
| 5,815,568 A | | 9/1998 | Trump |
| 5,949,888 A | | 9/1999 | Gupta et al. |
| 5,978,473 A | * | 11/1999 | Rasmusson ............ 379/406.08 |
| 6,055,310 A | | 4/2000 | Zhang et al. |
| 6,163,608 A | | 12/2000 | Romesburg et al. |
| 6,163,609 A | * | 12/2000 | Makinen et al. ....... 379/406.08 |
| 6,195,430 B1 | | 2/2001 | Eriksson et al. |
| 6,263,078 B1 | * | 7/2001 | McLaughlin et al. .. 379/406.08 |
| 6,266,367 B1 | | 7/2001 | Strait |
| 6,282,286 B1 | | 8/2001 | Reesor et al. |
| 6,321,200 B1 | | 11/2001 | Casey |
| 2002/0039415 A1 | | 4/2002 | Schulz et al. |
| 2002/0131583 A1 | * | 9/2002 | Youyoung |
| 2003/0133565 A1 | * | 7/2003 | Chang et al. |

OTHER PUBLICATIONS

Sicuranza, "Polynomial Filters for Image and Video Processing," First Int'l Workshop on Image and Signal Processing and Analysis, Jun. 14–15, 2000, pp. 15–26.

Felder et al., "Efficient Dual–Tone Multifrequency Detection Using the Nonuniform Discrete Fourier Transform," IEEE Signal Processing Letters, vol. 5, No. 7, Jul. 1998, pp. 160–163.

Doesthali et al., "A Low–Complexity ITU–Compliant Dual Tone Multiple Frequency Detector," IEEE Transactions on Signal Processing, vol. 48, No. 3, Mar. 2000, pp. 911–917.

Santhanam et al., "Multicomponent AM–FM Demodulation via Periodicity–Based Algebraic Separation and Energy–Based Demodulation," IEEE Transactions on Communications, vol. 48, No. 3, Mar. 2000, pp. 473–490.

Daly et al, "A Minimum Mean–Squared Error Interpretation of Residual ISI Channel Shortening for Discrete Multitone Transceivers," IEEE, 2001, pp. 2065–2068.

Chiu et al, "Time–Domain Channel Equalizer Design Using the Inverse Power Method," IEEE, 1999, pp. 973–977.

Kaiser, "On a Simple Algorithm to Calculate the 'Energy' of a Signal," IEEE, 1990, pp. 381–384.

Lin et al., "A Generalization to the Teager–Kaiser Energy Function & Application to Resolving Two Closely–Spaced Tones," IEEE, 1995, pp. 1637–1640.

* cited by examiner

NESD : NEAR-END SIGNAL DETECTION
STATE 0: CANDIDATE BACKUP NOT AVAILABLE
         GOOD BACKUP NOT AVAILABLE
STATE 1: CANDIDATE BACKUP AVAILABLE
         GOOD BACKUP NOT AVAILABLE
STATE 2: CANDIDATE BACKUP AVAILABLE
         GOOD BACKUP AVAILABLE
STATE 3: CANDIDATE BACKUP NOT AVAILABLE
         GOOD BACKUP AVAILABLE

METHOD AND APPARATUS FOR PERFORMING ADAPTIVE FILTERING

RELATED APPLICATIONS

This is related to U.S. patent application having Ser. No. 10/178,427, filed on even date, and entitled "Monitoring and control of an Adaptive Filter in a Communication System," U.S. patent application having Ser. No. 10/178,597, filed on even date, and entitled "Method and Apparatus for Non-Linear Processing of an Audio Signal," U.S. patent application having Ser. No. 10/178,154, filed on even date, and entitled "Method and Apparatus for Pure Delay Estimation in a Communication System," and U.S. patent application having Ser. No. 10/178,560, filed on even date, and entitled "Method and Apparatus for Tone Indication," all of which are assigned to the current assignee hereof.

FIELD OF THE INVENTION

The present invention relates generally to filtering, and more specifically, to a method and apparatus for performing adaptive filtering of a signal.

RELATED ART

Echo cancellation is used in a telecommunication network (such as in a Public Switching Telephone Network (PSTN) or Packet Telephony (PT) network) to ensure voice quality through elimination or reduction of electric or line echo from the telecommunication network. The source of this electric or line echo may be the impedance mismatch of a hybrid circuit which is a device used to convert signals from a four-wire communication network interface to a two-wire local subscriber loop and vice versa. Echoes with long delays in the communication network may be noticeable which may create significant or even unbearable disturbance during telephone voice communication. Therefore, a need exists for an echo canceller that is able to eliminate the echoes completely or to reduce them to an acceptable level within the telecommunication network. Also, a need exists for an echo canceller that is capable of detecting tones received via the telecommunication network while maintaining stability.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" and "negate" (or "deassert") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. The symbols "*" and "·" both indicate a multiplication operation. A FIFO or other type of data storage may be used to provide the delays used throughout this invention document.

Also, note that in the descriptions herein, variable names are generally used consistently with each group of related figures. Some variable names, though, may be reused to refer to different things in different groups of related figures. For example, in reference to a particular group of figures, M may refer to a measurement cycle, and in reference to a different group of figures, M may be used as a counter value. The description of each variable name in the equations and figures below, though, will be provided as they are used.

Connectivity

Figure 1:
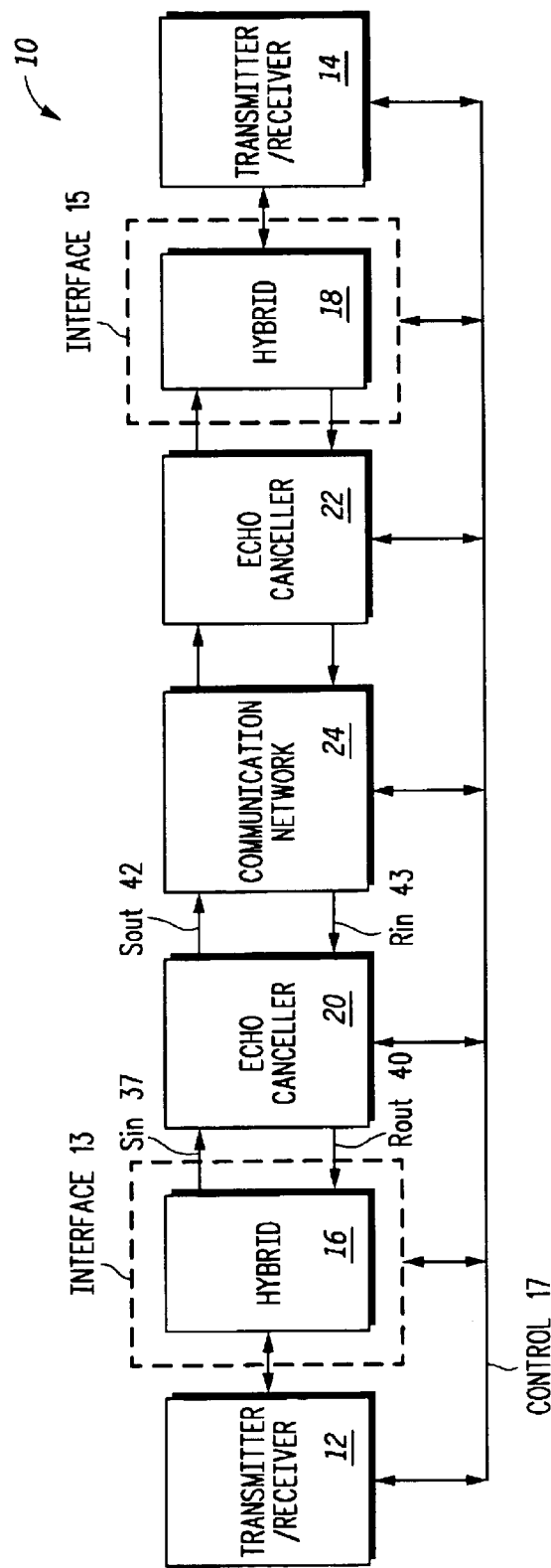
FIG. 1 illustrates a communication system in accordance with one embodiment of the present invention.

FIG. 1 illustrates one embodiment of a communication system 10. Communication system 10 includes transmitter/receiver 12, interface 13, hybrid circuit 16 (also referred to as hybrid 16), echo canceller 20, communication network 24, echo canceller 22, interface 15, hybrid 18, and transmitter/receiver 14. Interface 13 includes hybrid 16 and interface 15 includes hybrid 18. Transmitter/receiver 12 is bidirectionally coupled to hybrid 16 (where, in one embodiment, transmitter/receiver 12 is coupled to hybrid 16 via a two-wire connection such as a twisted pair). Hybrid 16 is coupled to echo canceller 20, providing a send signal Sin 37 to echo canceller 20 via unidirectional conductors and receiving a receive signal Rout 40 from echo canceller 20 via unidirectional conductors (where, in one embodiment, each of Sin 37 and Rout 40 are provided and received via a wire pair). Echo canceller 20 is coupled to communication network 24 and provides an echo cancelled send signal Sout 42 to communication network 24 and receives Rin 43 from communication network 24.

Similarly, transmitter/receiver 14 is bidirectionally coupled to hybrid 18 (where, in one embodiment, transmitter/receiver 14 is coupled to hybrid 18 via a two-wire connection such as a twisted pair). Hybrid 18 is coupled to echo canceller 22 via unidirectional conductors for providing signals to echo canceller 22 and unidirectional conductors for receiving signals from echo canceller 22 (where, in one embodiment, each set of unidirectional conductors may be a twisted wire pair). Echo canceller 22 is coupled to communication network 24 and provides an echo cancelled send signal to communication network 24 and receives a received signal from communication network 24. Control 17 may be a control bus that includes one or more control signals that may be provided to each of transmitter/receiver 12, hybrid 16, echo canceller 20, communication network 24, echo canceller 22, hybrid 18, and transmitter/receiver 14, as needed. Therefore, in one embodiment, control 17 is coupled to every unit within communication system 10, while in alternate embodiments, only a portion of the units may require communication with control 17.

Figure 2:
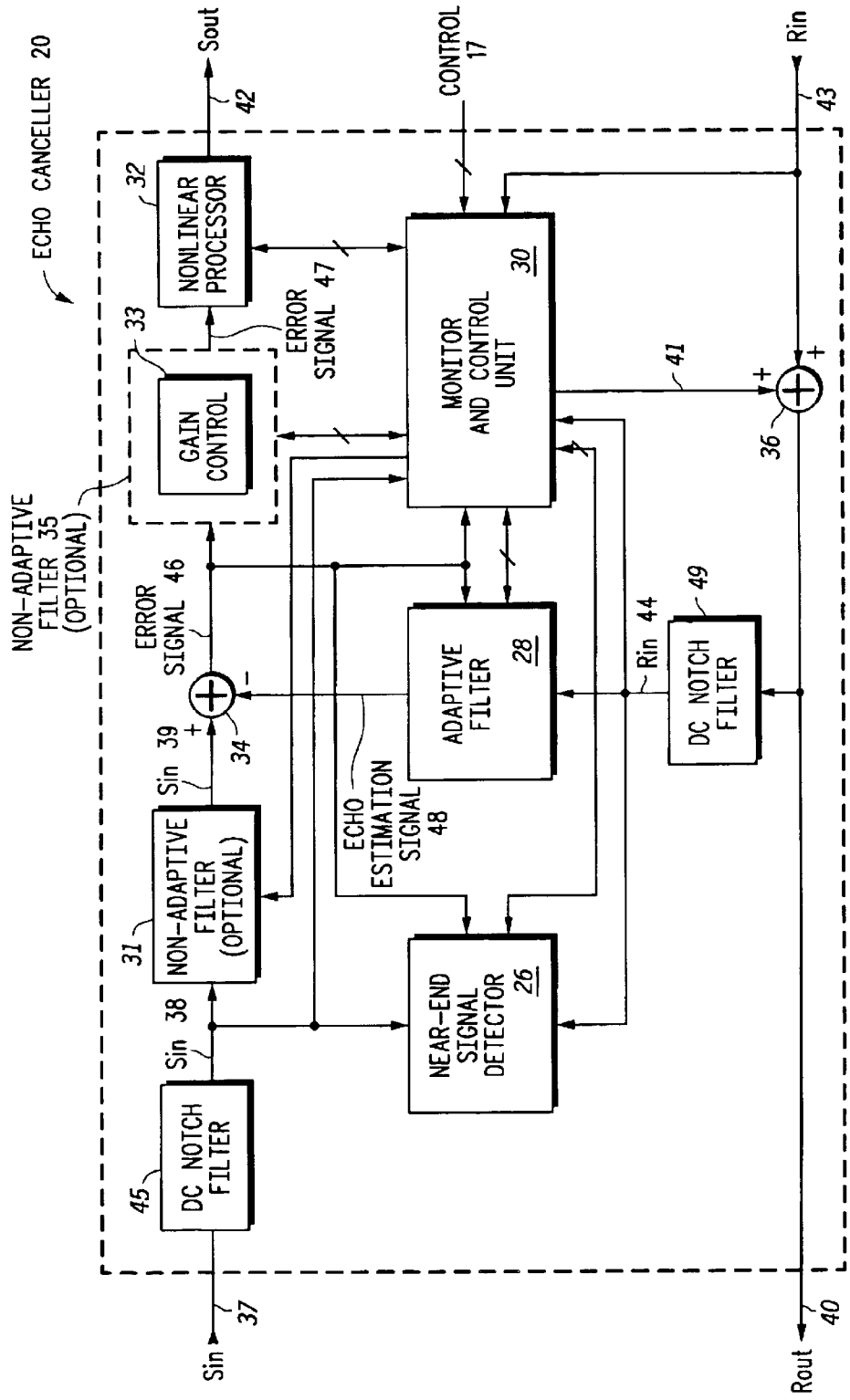
FIG. 2 illustrates an echo canceller of the communication system of FIG. 1 in accordance with one embodiment of the present invention.

FIG. 2 illustrates one embodiment of echo canceller 20 of FIG. 1. (Note that in the embodiments discussed in reference to FIG. 2, echo canceller 20 is referred to as the near end echo canceller while echo canceller 22 is referred to as the far end echo canceller. However, it should be appreciated that the echo canceller illustrated in FIG. 2 may also refer to echo canceller 22 in the case where echo canceller 22 is at the near end and echo canceller 20 at the far end of communication system 10.) Echo canceller 20 includes DC notch filter 45, optional non-adaptive filter 31, adder 34, optional non-adaptive filter 35, gain control 33, nonlinear processor 32, near-end signal detector 26, adaptive filter 28, monitor and control unit 30, DC notch filter 49, and adder 36. DC notch filter 45 receives Sin 37 and outputs Sin 38 to near-end signal detector 26 and monitor and control unit 30. If non-adaptive filter 31 is present, then Sin 38 is also provided to non-adaptive filter 31 which is coupled to receive controls from monitor and control unit 30 and outputs Sin 39 to adder 34. However, if non-adaptive filter 31 is not present, then Sin 38 is the same as Sin 39 which is input to adder 34. Adder 34 receives Sin 39 and echo estimation signal 48 from adaptive filter 28 and provides an error signal 46 to gain control 33, near-end signal detector 26, and monitor and control unit 30. Gain control 33 is bidirectionally coupled to monitor and control unit 30 and is coupled to provide error signal 47 to nonlinear processor 32. If non-adaptive filter 35 is present in echo canceller 20, then, in one embodiment, gain control 33 is within non-adaptive filter 35 which also receives error signal 46, is bidirectionally coupled to monitor and control unit 30 and provides error signal 47. Nonlinear processor 32 is bidirectionally coupled to monitor and control unit 30 and provides Sout 42. Monitor and control unit 30 is also coupled to control 17, receives Rin 43, provides training signal 41 to adder 36, receives Rin 44 from DC notch filter 49, and is bidirectionally coupled to adaptive filter 28 and near-end signal detector 26. DC notch filter 49 receives the output of adder 36 (Rout 40) and provides Rin 44 to near-end signal detector 26, adaptive filter 28, and monitor and control unit 30. Adder 36 receives training signal 41 and Rin 43 and provides Rout 40.

Figure 3:
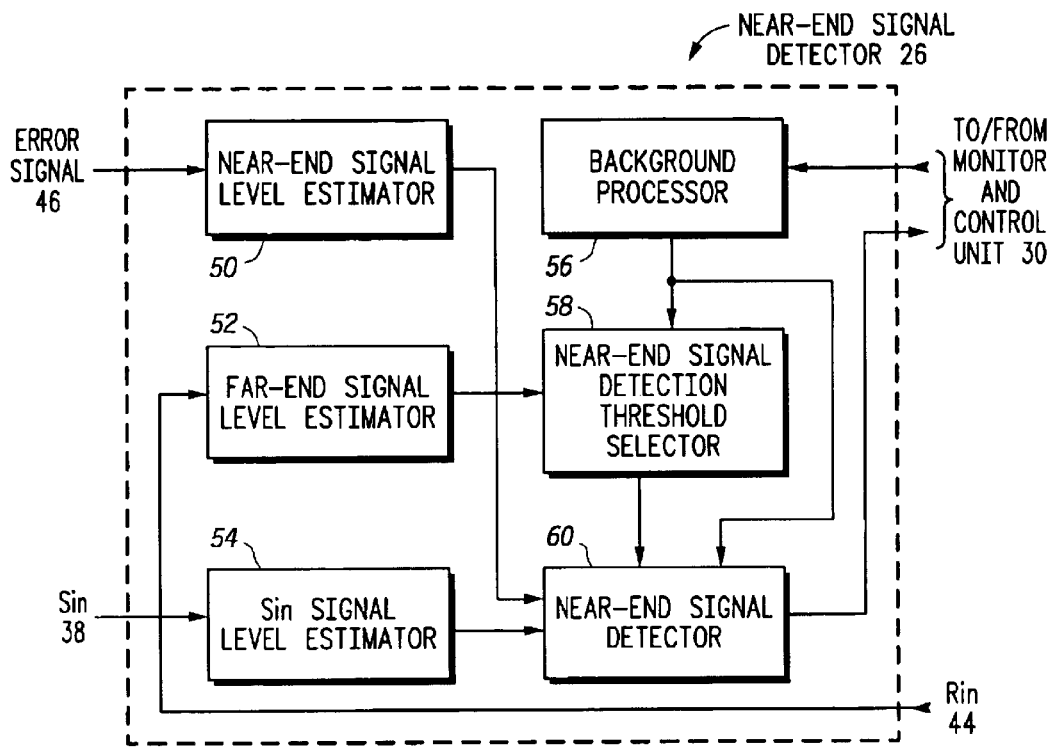
FIG. 3 illustrates a near-end signal detector of the echo canceller of FIG. 2 in accordance with one embodiment of the present invention.

FIG. 3 illustrates one embodiment of near-end signal detector 26 of FIG. 2. Near-end signal detector 26 includes near-end signal level estimator 50, far-end signal level estimator 52, Sin signal level estimator 54, background processor 56, near-end signal detection threshold selector 58, and near-end signal detector 60. Near-end signal level estimator 50 receives error signal 46 and is coupled to near-end signal detector 60. Far-end signal level estimator is coupled to receive Rin 44 and is also coupled to near-end signal detection threshold selector 58. Sin signal level estimator 54 is coupled to receive Sin 38, and is also coupled to near-end signal detector 60. Background processor 56 is coupled to monitor and control unit 30, near-end signal detection threshold selector 58, and near-end signal detector 60. Near-end signal detector 60 is also coupled to near-end signal detection threshold selector 58 and monitor and control unit 30.

Figure 4:
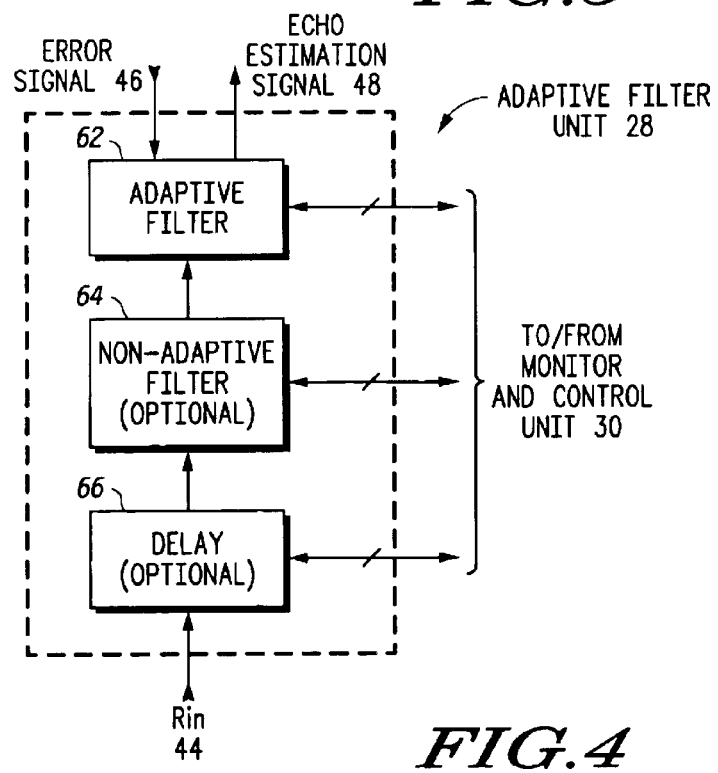
FIG. 4 illustrates an adaptive filter of the echo canceller of FIG. 2 in accordance with one embodiment of the present invention.

FIG. 4 illustrates one embodiment of adaptive filter 28 of FIG. 2. Adaptive filter 28 includes adaptive filter 62, optional non-adaptive filter 64, and optional delay 66. Assuming both non-adaptive filter 64 and delay 66 are present in adaptive filter 28, delay 66 receives Rin 44, and is coupled to non-adaptive filter 64 and monitor and control unit 30. Non-adaptive filter 64 is coupled to delay 66, adaptive filter 62, and monitor and control unit 30. Adaptive filter 62 is coupled to receive error signal 46 and coupled to provide echo estimation signal 48, and is also coupled to monitor and control unit 30. If non-adaptive filter 64 is not present, then delay 66 is coupled directly to adaptive filter 62. If delay 66 is not present, then non-adaptive filter 64 receives Rin 44. If neither delay 66 nor non-adaptive filter 64 are present, adaptive filter 62 receives Rin 44.

Figure 5:
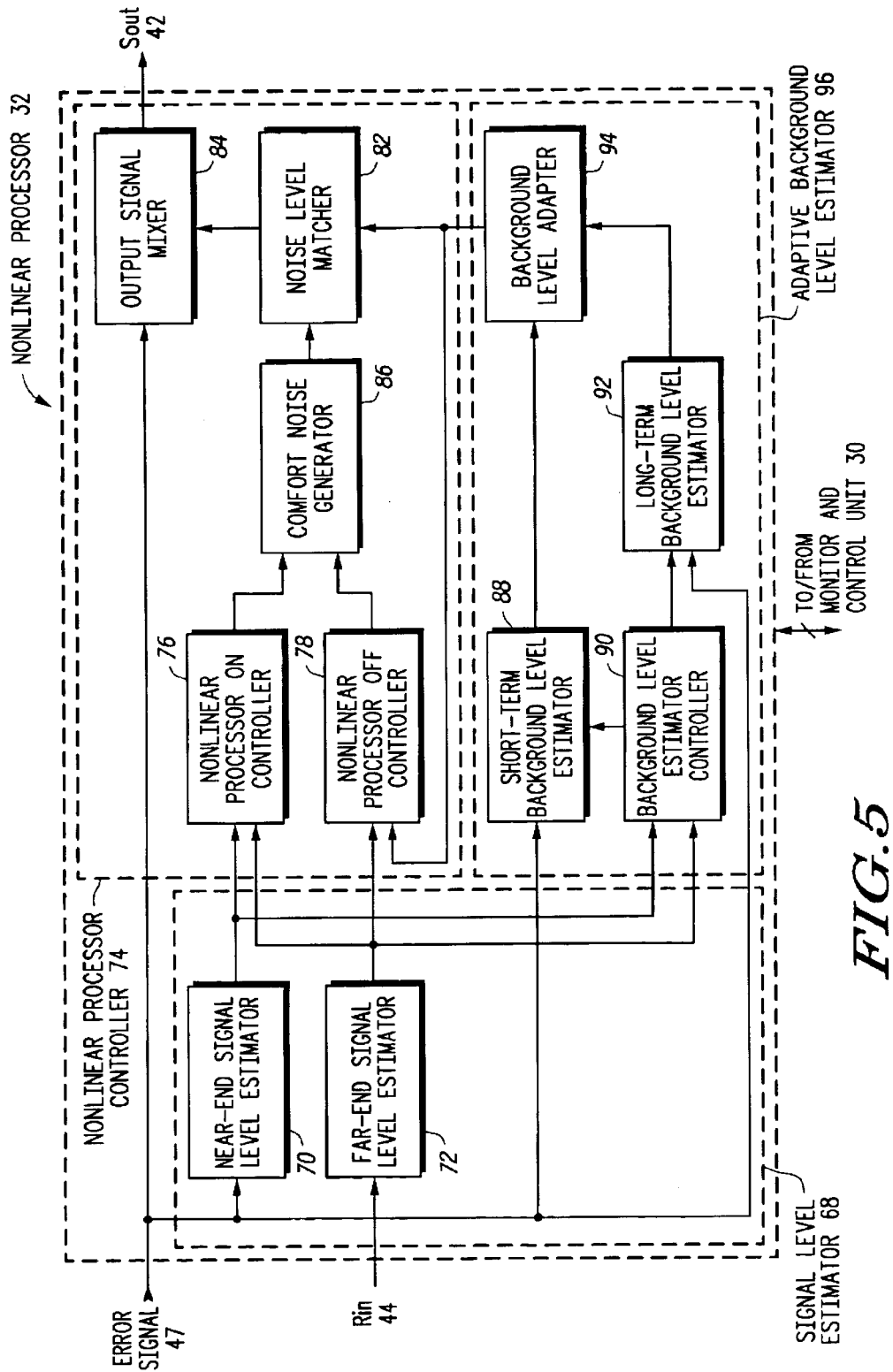
FIG. 5 illustrates a nonlinear processor of the echo canceller of FIG. 2 in accordance with one embodiment of the present invention.

FIG. 5 illustrates one embodiment of nonlinear processor 32 of FIG. 2. Nonlinear processor 32 includes signal level estimator 68, nonlinear processor controller 74, and adaptive background level estimator 96, and is bidirectionally coupled to monitor and control unit 30. Signal level estimator 68 includes near-end signal level estimator 70 and far-end signal level estimator 72. Nonlinear processor controller 74 includes nonlinear processor ON controller 76, nonlinear processor OFF controller 78, comfort noise generator 86, noise level matcher 82, and output signal mixer 84. Adaptive background level estimator 96 includes short-term background level estimator 88, background level estimator controller 90, long-term background level estimator 92, and background level adapter 94. Near-end signal level estimator 70 receives error signal 47 and is coupled to nonlinear processor ON controller 76 and background level estimator controller 90. Far-end signal level estimator 72 receives Rin 44 and is coupled to nonlinear processor ON controller 76, nonlinear processor OFF controller 78, and background level estimator controller 90. Nonlinear processor ON controller 76 and nonlinear processor OFF controller 78 are coupled to noise generator 86 which is coupled to noise level matcher 82. Output signal mixer 84 is coupled to noise level matcher 82, receives error signal 47, and provides Sout 42. Short-term background level estimator 88 is coupled to background level adapter 94 and receives error signal 47. Background level estimator controller 90 is coupled to short-term background level estimator 88 and long-term background level estimator 92. Long-term background level estimator 92 receives error signal 47 and is coupled to background level adapter 94 which is coupled to noise level matcher 82.

Figure 6:
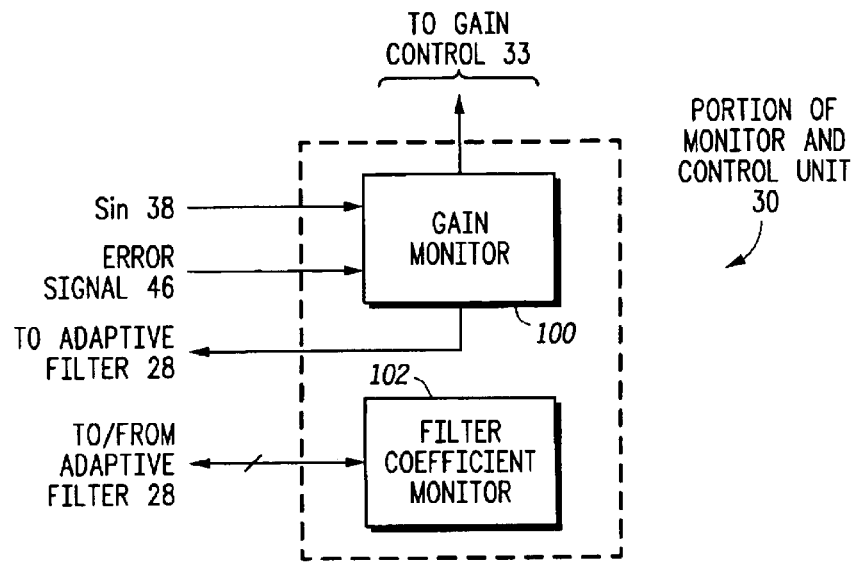
FIGS. 6–8 illustrate portions of a monitor and control unit of the echo canceller of FIG. 2 in accordance with various embodiments of the present invention.

FIG. 6 illustrates one embodiment of a portion of monitor and control unit 30 which includes a gain monitor 100 and a filter coefficient monitor 102. Gain monitor 100 receives Sin 38, error signal 46, and is coupled to adaptive filter 28 and gain control 33. Filter coefficient monitor 102 is coupled to adaptive filter 28.

Figure 7:
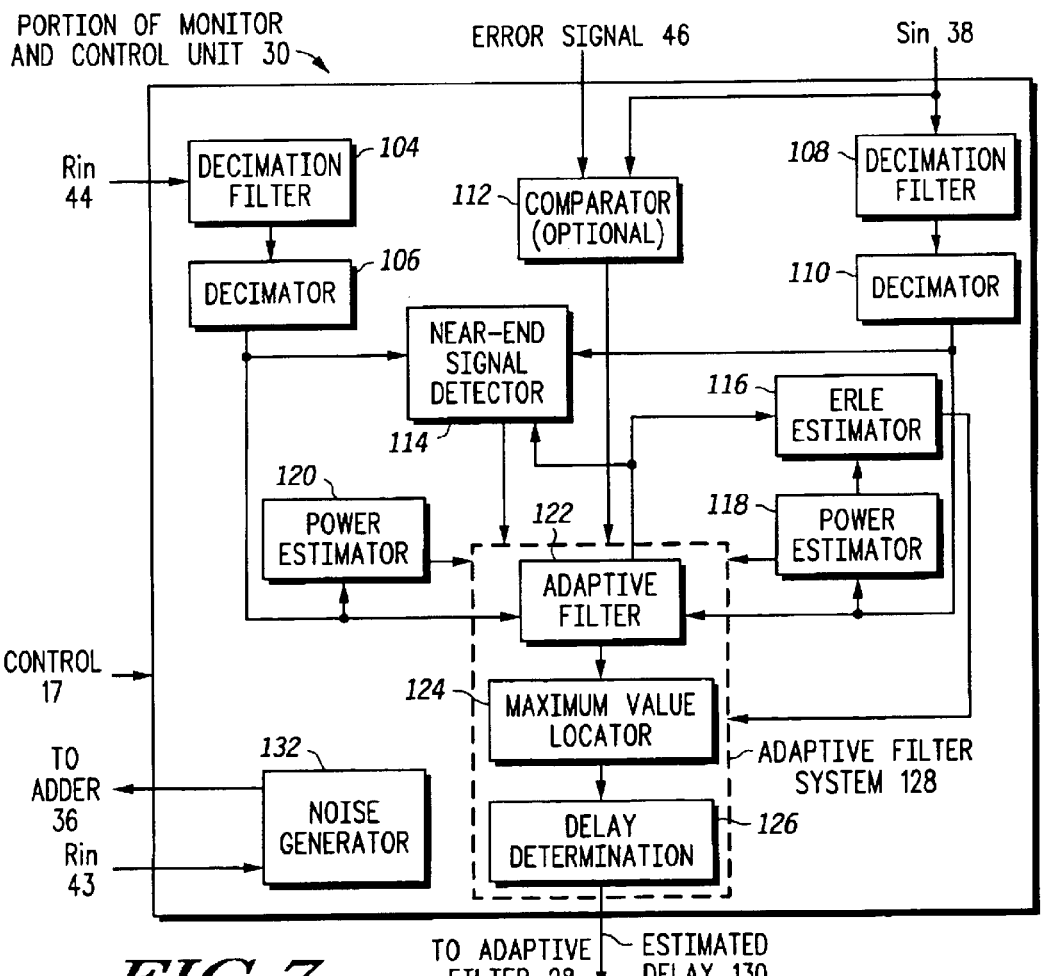

FIG. 7 illustrates one embodiment of another portion of monitor and control unit 30 which includes decimation filters 104 and 108, decimators 106 and 110, near-end signal detector 114, optional comparator 112, Echo Return Loss Enhancement (ERLE) estimator 116, power estimators 120 and 118, adaptive filter system 128, and noise generator 132. Adaptive filter system 128 includes adaptive filter 122, maximum value locator 124, and delay determination 126. Decimation filter 104 receives Rin 44 and is coupled to decimator 106. Decimation filter 108 receives Sin 38 and is coupled to decimator 110. Decimator 106 is coupled to near-end signal detector 114, power estimator 120, and adaptive filter 122. Power estimator 120 and near-end signal detector 114 are coupled to adaptive filter system 128. Optional comparator 112, if present in monitor and control unit 30, receives error signal 46 and Sin 38, and is coupled to adaptive filter system 128. Decimator 110 is coupled to power estimator 118 and adaptive filter 122. Power estimator 118 is coupled to ERLE estimator 116 and adaptive filter system 128, and adaptive filter 122 is coupled to near-end signal detector 114, ERLE estimator 116, and maximum value locator 124. Maximum value locator 124 is coupled to delay determination 126 which provides estimated delay 130 to adaptive filter 28. Noise generator 132 receives Rin 43 and is coupled to provide injected signal 41 to adder 36. The portion of monitor and control unit 30 of FIG. 7 is also coupled to control 17.

Figure 8:
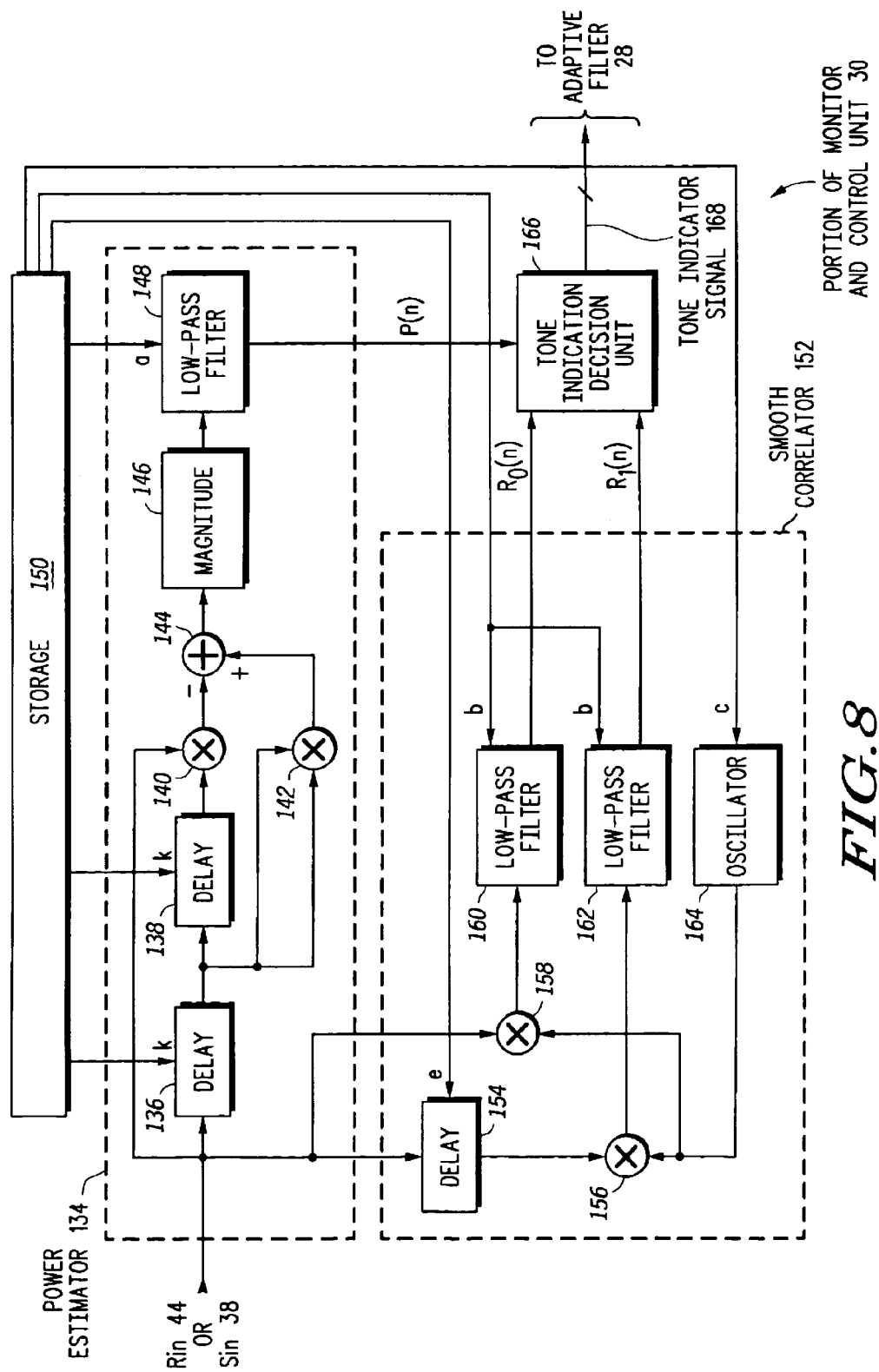

FIG. 8 illustrates one embodiment of yet another portion of monitor and control unit 30 including storage 150, power estimator 134, smooth correlator 152, and tone indication decision unit 166. Power estimator 134 includes delay 136, delay 138, multipliers 140 and 142, adder 144, magnitude 146, and low-pass filter 148. Smooth correlator 152 includes delay 154, multipliers 156 and 158, low-pass filters 160 and 162, and oscillator 164. Storage 150 is coupled to delay 136, delay 138, low-pass filter 148, delay 154, low-pass filters 160 and 162, and oscillator 164. Delay 136 receives Rin 44 or Sin 38 and is coupled to delay 138 and multiplier 142. Delay 138 is coupled to multiplier 140 which also receives Rin 44 or Sin 38. Adder 144 is coupled to multipliers 140 and 142 and magnitude 146 which is coupled to low-pass filter 148 which is coupled to tone indication decision unit 166. Delay 154 receives Rin 44 or Sin 38, and is coupled to multiplier 156. Multiplier 158 also receives Rin 44 or Sin 38 and is coupled to low-pass filter 160, oscillator 164, and multiplier 156. Multiplier 156 receives delay 154 and is coupled to low-pass filter 162 and oscillator 164. Tone indication decision unit 166 receives $R_0(n)$ from low-pass filter 160 and $R_1(n)$ from low-pass filter 162 and provides tone indicator signal 168 to adaptive filter 28.

Note that FIGS. 1–8 illustrate one embodiment of blocks found within communication system 10 and echo canceller 20. Alternate embodiments may include various different elements than those illustrated, more elements than those illustrated, or less elements than those illustrated, depending on the functionality desired. Furthermore, the blocks within FIGS. 1–8 can be grouped differently or connected differently and still achieve similar results. Therefore, FIGS. 1–8 are only meant to provide examples used to illustrate the concepts that will be discussed below. Also, although the connections in FIGS. 1–8 may have been drawing as a single conductor (unidirectional or bidirectional) or as multiple conductors (unidirectional or bidirectional), a variety of different connections may be used. For example, a multiple conductor can be replaced with a variety of different single unidirectional or bidirectional conductors. Similarly, single conductors can be expanded into multiple unidirectional or bidirectional conductors. Signals can be communicated serially via a single conductor or cane be communicated in parallel via multiple conductors. Also, signals can be time multiplexed via single or multiple conductors. Therefore, the connections illustrated in FIGS. 1–8 can be implemented in a variety of different ways while still achieving the desired functionality. Also, as will be described further below, the designs of FIGS. 1–8 can be implemented in hardware, software, or a combination of hardware and software.

Operation:

Transmitter/receiver 12, provides and receives data signals to and from hybrid 16. Hybrid 16 provides for a four-wire to two-wire conversion between transmitter/receiver 12 and communication network 24. Therefore, transmitter/receiver 12 can be any device used for communicating over communication network 24, such as, for example, a telephone or a modem, that is coupled to hybrid 16 via a two-wire subscriber line. Therefore, hybrid 16 provides an interface between a local subscriber loop (having transmitter/receiver 12) and a communication network (communication network 24). Transmitter/receiver 14 and hybrid 18 functional analogously to transmitter/receiver 12 and hybrid 16, respectively.

In communications between transmitter/receiver 12 and transmitter/receiver 14, electrical or line echo is introduced into the communication by hybrid 16 and hybrid 18. The source of this echo is the impedance mismatch within hybrid 16, as well as the impedance mismatch within hybrid 18. For example, if the impedance within hybrid 16 were perfectly matched, all of the energy from received signal Rout 40 would be transmitted to transceiver/receiver 12. However, if there is any impedance mismatch within hybrid 16, some of the energy from received signal Rout 40 would be reflected back through send signal Sin 37. If the round trip delay through communication network 24 (from transmitter/receiver 14, in the case of echo introduced by hybrid 16) is sufficiently long, the reflected echo received by transmitter/receiver 14 from Sin 37 will be noticeable during the communication. This may result in noticeable echoes or even unbearable disturbance during a telephone voice communication. In one example, a sufficiently long delay may refer to a round trip delay of greater than 40 milliseconds. As the round trip delay increases, the echoes may become worse and thus more noticeable and disruptive. (If, on the other hand, the round trip delay is significantly smaller, the echo may not be disruptive since it may be indistinguishable from the side tone.) The round trip delay may include a variety or combination of different delays, including transmission delay, processing delay, computation delay, etc. Depending on the communication system, the round trip delay may be sufficiently large to disrupt communication. Therefore, echo cancellers 20 and 22 may be used to reduce the line echo in communication system 10. For example, the echo introduced by hybrid 16 from a signal received via Rout 40 (from transmitter/receiver 14) and reflected back via Sin 37 is processed via echo canceller 20 to reduce the reflected echo prior to sending the signal Sout 42 through communication network 24 back to transmitter/receiver 14.

As discussed above, line echo is introduced by the impedance mismatch within hybrid 16 and the impedance mismatch within hybrid 18. Also, acoustic echo may be introduced into the communication via transmitter/receiver 12 and transmitter/receiver 14. For example, if transmitter/receiver 12 is a speaker phone, the received signal, after being output via the speaker, will bounce around the surrounding environment, and some of the signal may be redirected back into the microphone of transmitter/receiver 12 and also be reflected back to transmitter/receiver 14. In one embodiment, echo canceller 20 may also function to reduce some aspects of acoustic echo in addition to line echo.

In one embodiment, communication network 24 may include a packet telephony network (including, for example, voice over internet protocol (IP), data over packet, asynchronous transfer mode (ATM), etc., and could either apply to wireless or wireline systems) or Public Switching Telephone Network (PSTN). In alternate embodiments, communication system 10 may refer to any type of communication system. Any communication pathway may be used as interface 13 or interface 15.

Control 17 provides a control pathway among transmitter/receiver 12 and 14, hybrid 16 and 17, echo canceller 20 and 22, and communication network 24. Control signals transmitted via control 17 are generally not in-line signals. For example, control 17 may include an enabling/disabling signal to enable or disable echo canceller 20 or 22. Control 17 may also include a signal to indicate whether the telephone is on or off the hook.

In the embodiments described herein, transmitter/receiver 12 will be referred to as the near end with respect to echo canceller 20 and transmitter/receiver 14 will be referred to as the far end with respect to echo canceller 20. Therefore, the embodiments herein will be discussed with reference to echo canceller 20; however, it should be understood that echo canceller 22 operates analogously to echo canceller 20. That is, in an alternate embodiment, transmitter/receiver 14 may be referred to as the near end with respect to echo canceller 22 and transmitter/receiver 12 the far end with respect to echo canceller 22.

FIG. 2 illustrates one embodiment of echo canceller 20, where, as mentioned above, transmitter/receiver 12 is the near end and transmitter/receiver 14 is the far end. Sin 37 is the send signal transmitted from transmitter 12, via hybrid 16. Echo canceller 20 provides an echo cancelled send signal Sout 42 to receiver 14 via communication network 24 and hybrid 18. Rin 43 is a receive signal received from transmitter 14 via hybrid 18 and communication network 24. Echo canceller receives Rin 43 and provides this send signal Rin 43 as Rout 40 to receiver 12 via hybrid 16.

Figure 37:
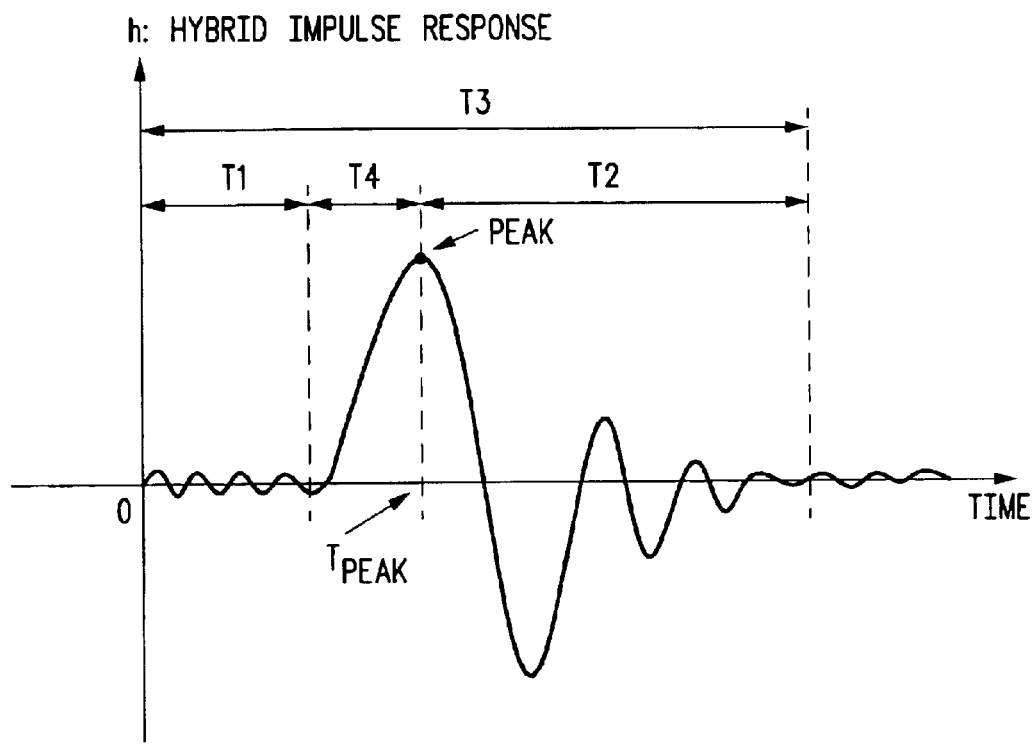
FIGS. 37–38 illustrate, in graph form, examples of impulse responses, in accordance with embodiments of the present invention.

As discussed above, Sin 37 may include reflected echo introduced by the impedance mismatch within hybrid 16. Therefore, echo canceller 20 reduces (or eliminates) the introduced reflected echo and provides the echo cancelled send signal Sout 42. That is, if the impedance in hybrid 16 is perfectly matched, a signal received at the input of the hybrid 16 (e.g. Rout 40) would result in virtually no response from hybrid 16 (at Sin 37) because there would be no reflected echo (in the ideal and practically unattainable case). However, if the hybrid is in imbalanced state (a typical case, e.g. where the impedance is mismatched), a signal received via Rout 40 results in a response as shown in FIG. 37. A corresponding impulse response (h) of the hybrid circuit, as seen from the viewpoint of its input (Rout 40) and output (Sin 37) is illustrated in FIG. 37. Adaptive filter 28 within echo canceller 20 attempts to "imitate" the hybrid response of Sin 37 (to any input signal Rout 40) and subtracts it out via adder 34. Note that the signal Rout 40 is linearly distorted (including its pure transposition in time, i.e., it is shifted in time by a parameter called pure delay). This distortion can be illustrated in the impulse response of the hybrid 16 of FIG. 37. Note that the impulse response includes both a pure delay portion and a dispersion time. The pure delay refers to the portion of the impulse response from the beginning to where some significant values start to occur, as denoted by T1 in FIG. 37. The dispersion time refers to the portion of the impulse response duration from where the significant responses start to happen to where the responses virtually disappear, as denoted by T4+T2 in FIG. 37. The shape of the impulse response (as per the portion corresponding to the dispersion time segment) can be translated into the frequency characteristic of the hybrid (as seen from Rout 40/Sin 37 input/output ports).

Sin 37 is provided to DC notch filter 45 to remove the DC component from Sin 37. Note that in an alternate embodiment, a high pass filter may be used in place of DC notch filter 45. Similarly, the output of adder 36 (Rout 40) is provided to DC notch filter 49 to remove the DC component from Rout 40 (however, in alternate embodiments, a high pass filter may be used instead). The use of DC notch filters may be computationally cheaper than high pass filters and also result in no rippling effect which helps maintain the gain flat through pass band of the filter. In an alternate embodiment, a single shared DC notch filter may be used to perform the functions of DC notch filter 45 and DC notch filter 49.

Note that adder 36 receives Rin 43 and training signal 41 and provides the sum of the two signals as output Rout 40; however, if training signal 41 is zero, output Rout 40 is simply the same is input Rin 43. For the discussions immediately following, it will be assumed that training signal 41 is zero and that Rout 40 is equal to Rin 43. Also, note that non-adaptive filter 31 and non-adaptive filter 35 are optional and will be discussed further below. For discussions immediately following, it will be assumed that Sin 38 and Sin 39 are equal and error signal 47 is a gain adjusted version of error signal 46, without the effects of non-adaptive filter 35.

Sin 39, therefore, is the send signal which includes any near end talker signal (Sgen) that is transmitted by transmitter 12 and any reflected echo introduced from Rout 40 by hybrid 16. Therefore, Sin 39 can be expressed as "Sgen+echo". Adaptive filter 28 provides an estimation of the reflected echo, echo estimation signal 48, to adder 34, which outputs error signal 46. Therefore, error signal 46 can be expressed as "Sin 39−estimated echo 48" or, substituting the above expression for Sin 39, as "Sgen+echo−estimated echo". When the estimated echo is accurate (i.e. equal or substantially equal to the actual echo), then error signal 46 will include only Sgen without any substantial echo. This is the ideal case. However, if the estimated echo is not accurate, error signal 46 will include both Sgen and a residual echo component. In this case, error signal 46 can be expressed as "Sgen+residual echo" where residual echo is "echo−estimated echo". When Sgen is absent (that is, when the near end is silent, meaning no signal is being transmitted from transmitter 12), error signal 46 represents only the residual echo. In this case, error signal 46 may be used to perform an adaptive process to minimize the residual echo, as will be discussed in more detail below. However, if Sgen is present, error signal 46 cannot be used to perform the adaptive process because adaptive filter 28 uses the error to adapt, and with the presence of Sgen, error signal 46 is no longer just the error. Therefore, the detection of Sgen is necessary to determine whether the adaptive process may be performed. Near-End Signal Detector 26, coupled to receive Sin 38 (which in this example is equal to Sin 39) and Rin 44, uses error signal 46 and control signals from monitor and control unit 30 to detect the presence of Sgen (i.e. to detect the presence of a near end talker at transmitter 12.)

In adaptive filter unit 28, the echo estimation signal 48, y(k), is calculated by $y(k)=X^T(k) \cdot H(k)$, where $X(k)=[x(k), x(k-1), \ldots, x(k-N+1)]^T$ is the input signal vector extending over the duration of the FIR filter span; x(n)=Rin 44. H(k) is a filter coefficient vector for the k-th iteration where $H(k)=[h_0(k), h_1(k), \ldots, h_{N-1}(k)]^T$. The actual update of the filter coefficients is governed by a general LMS-type algorithm: $H(k+1)=H(k)+step\_size \cdot error(k) \cdot X(k)$, where error (k) corresponds to error signal 46; step_size controls the adaptation rate; and H(k+1) is a new filter coefficient vector.

Any residual echo in error signal 46 may further be reduced or removed by nonlinear processor 32. Nonlinear processor 32 receives error signal 47 (which in this embodiment is a gain adjusted version of error signal 46) and control signals from monitor and control unit 30 to produce Sout 42, which, ideally, includes no echo. In addition to reducing or removing the residual echo, nonlinear processor 32 also attempts to preserve or match the background noise of the near end talker signal (Sgen). Matching the background noise allows for improved communication quality by maintaining continuity of the true background noise. Without this continuity, the far end listener may hear only silence from the near end talker when the far end talks. Alternatively, a synthesized background noise may be provided when the far end talks; however, this may result in disruptive switching between true background noise (when the near end talks) and synthesized background noise (when the far end talks). Therefore, matching background noise helps minimize this disruptive switching.

Monitor and control unit 30 includes a filter coefficient monitor (such as filter coefficient monitor 102 which will be discussed further in reference to FIG. 6), which is used to determine whether a true hybrid exists such that adaptive filter 28 does not attempt to adapt to invalid hybrids. Monitor and control unit 30 also includes a gain monitor to control gain control 33 within optional adaptive filter 35. One purpose of gain control 33 is to maintain the stability of communication system 10. Monitor and control unit 30 also includes a pure delay determinator and a sparse window locator (both of which will be described in more detail with reference to FIG. 7) in order to improve the efficiency of adaptive filter 28. Monitor and control unit 30 also includes a tone indicator and a tone detector (to be described in more detail with reference to FIG. 8). The tone indicator and tone detector may be used to detect signaling tones within communication system 10. These signaling tones may include, for example, a 2100 Hz tone with a phase reversal for disabling the echo canceller when data is to be sent following the signaling tone. Therefore, the echo canceller may be disabled as necessary. On the other hand, if adaptive filter 28 is exposed to a tone (such as, for example, a single or multiple frequency sinusoidal) transmitted by either transmitter 12 or transmitter 14, instability of communication system 10 may result. Therefore, detection of a tone may be used to prevent adaptive filter from diverging and causing instability.

In the embodiments described above, echo canceller 20 did not include non-adaptive filters 31 and 35. However, in an alternate embodiment, non-adaptive filter 31, coupled between DC notch filter 45 and adder 34, can be used to reduce the length of adaptive filter 28 (as will be discussed further in reference to FIG. 4). In this embodiment, non-adaptive filter 31 receives Sin 38 and control signals from monitor and control unit 30 to produce Sin 39. Also, in one embodiment having non-adaptive filter 31, echo canceller may also include a non-adaptive filter 35 coupled between adder 34 and nonlinear processor 32. Non-adaptive filter 35 may include gain control 33 or may be a separate unit. In this embodiment, non-adaptive filter 35 compensates the effects of non-adaptive filter 31, so that the near-end signal Sgen is not distorted. Non-adaptive filter 35 receives error signal 46, control signals from monitor and control unit 30, and provides error signal 47 to nonlinear processor 32. (Non-adaptive filters 31 and 35 will be discussed further below in reference to FIG. 4).

Monitor and control unit 30 also provides training signal 41 to adder 36 in order to inject a signal into Rin 43 to produce Rout 40. The injection of training signal 41 may be used to estimate the pure delay of the hybrid echo path (the path from Rout 40, through hybrid 16, and back to Sin 37). The pure delay refers to the minimum time delay from Rout 40 to Sin 37. The injection of training signal 41 may be used to estimate the pure delay when the far end signal is absent at the beginning of the communication (such as at the start of a phone conversation). Note that training signal 41 is optional. Monitor and control unit 30 may also receive control 17 to enable or disable all or a portion of the functional modules.

Figure 9:
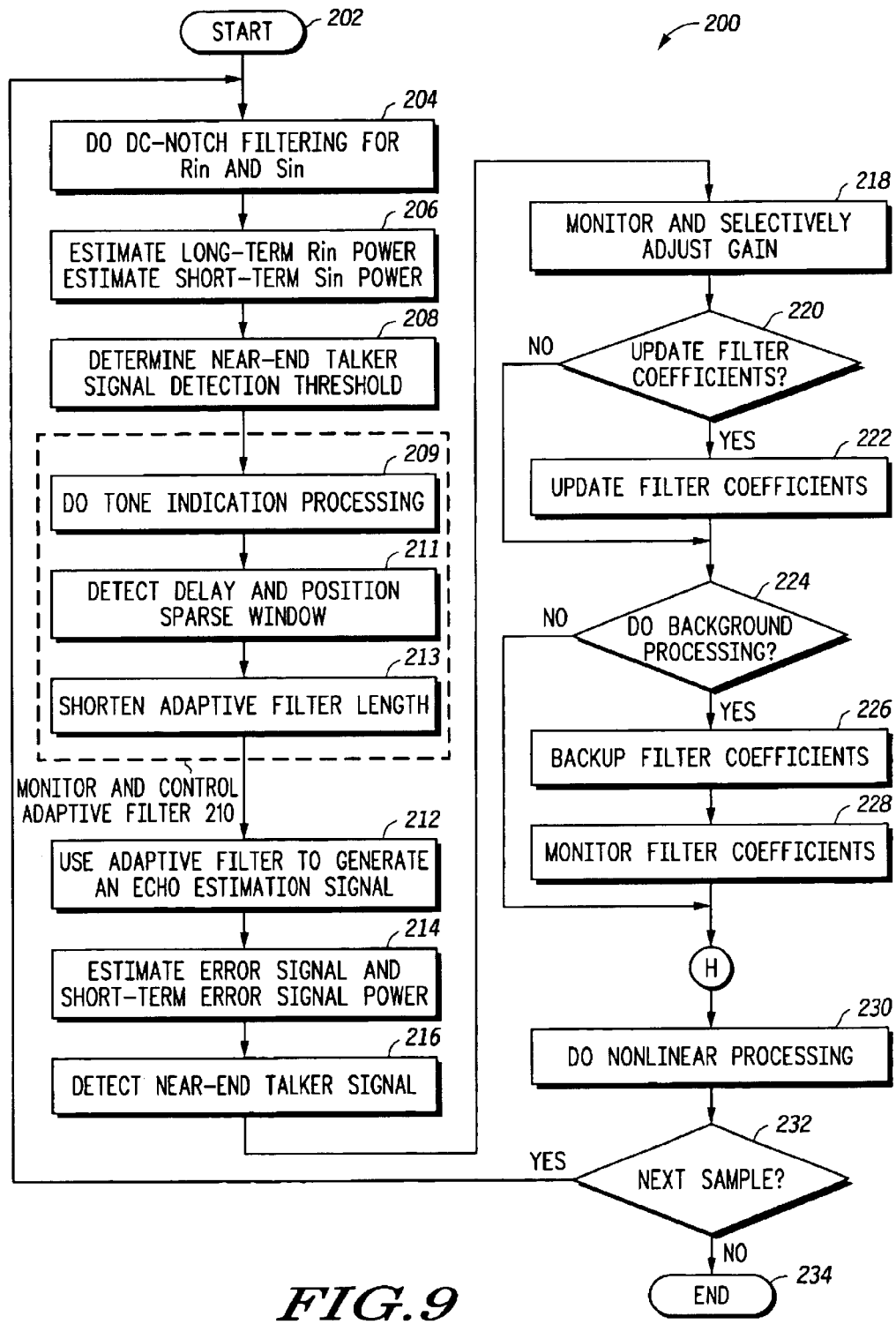
FIG. 9 illustrates, in flow diagram form, operation of the echo canceller of FIG. 2 in accordance with one embodiment of the present invention.

FIG. 9 includes a flow 200 that illustrates operation of echo canceller 20 in accordance with one embodiment of the present invention. Flow 200 is a broad overview of the functionality provided by an echo canceller such as echo canceller 20 of FIG. 2. Details of each step within flow 200 will be provided in more detail below in reference to FIGS. 3–8 and 10–38. Flow 200 begins at start 202 and flow proceeds to block 204 where DC notch filtering is performed on both Rin and Sin. Note that if adder 36 is present or training signal 41 is present, then DC notch filtering is performed on the output of adder 36 (Rout 40) rather than Rin 43. DC notch filter 45, as mentioned above, removes the DC component from Sin 37 and produces Sin 38. Similarly, DC notch filter 49 removes the DC component from Rin 43 (or Rout 40, depending on training signal 41) and produces Rin 44. Flow 200 then proceeds to block 206 where long-term power of Rin 44 and short-term power of Sin 38 are estimated. Note that long-term power and short-term power are relative terms. That is, long-term power refers to the power measured over a longer period of time as compared to short-term power. These powers may be calculated by near-end signal detector 26 of echo canceller 20.

The powers calculated in block 206 are then used to determine a near end talker signal detection (NESD) threshold. This NESD threshold will then be used to determine the existence of a near end talker signal (i.e. Sgen). This determination may also be performed by near-end signal detector 26 of echo canceller 20. Flow 200 then proceeds to block 210 where adaptive filter 28 is monitored and controlled. Block 210 includes blocks 209, 211, and 213. Note that the functions within monitor and control adaptive filter 210 are optional. That is, any combination of blocks 209, 211, and 213 may be performed, or none may be performed. In block 209, tone indication processing is performed. This tone indication processing may be performed by monitor and control unit 30, as was described above in reference to FIG. 2, and as will be described further in reference to FIG. 8. Flow 200 then proceeds to block 211 where delay (in one embodiment, pure delay) is detected, and a filtering window with proper size (sparse window) is positioned. That is, monitor and control unit 30 may detect the delay and position the sparse window such that the length (i.e. number of taps) for adaptive filter 28 is reduced.

Another way of shortening adaptive filter length is accomplished by block 213. One embodiment is to use a combination of non-adaptive filter 31 and 33 in conjunction with adaptive filter 28, but with a much shorter filter length. Details will be provided in FIGS. 28–35.

After monitoring and controlling adaptive filter 210, flow 200 proceeds to block 212 where an adaptive filter is used to generate an echo estimation signal. For example, this may correspond to adaptive filter 28 generating echo estimation signal 48, as was introduced above in reference to FIG. 2. Flow 200 then proceeds to block 214 where the error signal and the short-term power of the error signal are estimated. That is, block 214 may correspond to adder 34 of FIG. 2, which estimates error signal 46 by subtracting echo estimation signal 48 from Sin 39. Monitor and control unit 30 may then be used to estimate the short-term power of error signal 46.

Afterwards, flow proceeds to block 216 where the NESD threshold is used to detect a near-end talker signal. That is, in block 216, it is detected whether Sgen exists (whether a signal is being transmitted from transmitter 12 of FIG. 1). This may be performed by near-end signal detector 26 of FIG. 2. Flow proceeds to block 218 where the gain of gain control 33 is monitored and selectively adjusted to maintain stability of adaptive filter 28 and of communication system 10 (the details of which will be described in more detail below). Flow 200 then proceeds to decision diamond 220 where it is determined whether the filter coefficients need to be updated. For example, as discussed above, if Sgen exists, error signal 46 includes both a near-end talker signal (Sgen) and a residual echo component. In this case, adaptive filter 28 should not be updated because error signal 46 is not representative of just the residual echo. Flow then proceeds to decision diamond 224. However, if it is determined that Sgen does not exist (i.e. that the near-end talker is silent), then the adaptive filter 28 can be updated, and flow proceeds to block 222 where the filter coefficients of adaptive filter 28 are updated prior to continuing to decision diamond 224.

At decision diamond 224, it is determined whether any background processing is necessary. In one embodiment, background processing is performed periodically during operation of echo canceller 20. In alternate embodiments, it can be done at different times, such as in response to various adaptive filter processing states. If background processing is not to be performed, flow proceeds to step 230 where nonlinear processing is performed. However, if background processing is to be performed, flow proceeds to block 226 where the filter coefficients are backed up. That is, the filter coefficients of adaptive filter 28 may be stored (such as in a storage unit which may be located either within echo canceller 20 or external to echo canceller 20). Flow then proceeds to block 228 where the filter coefficients are monitored to determine whether or not a hybrid exists for echo canceller stability control.

After background processing, if any, flow proceeds to nonlinear processing 230 where any remaining residual echo is reduced or removed and where background noise is inserted, if necessary. If there are more samples being received via Rin 43 and Sin 37 (at decision diamond 232), processing continues with the next sample back at block 204, else, the flow is complete at end 234. Note that in telephony applications, the sampling rate for signals is generally 8 kHz since the signals usually include speech. Therefore, in one embodiment, the sampling rate is 8 kHz, where a sample of Rin 43 and Sin 37 is received every 0.125 ms. However, in alternate embodiments, different sampling rates may be used. For example, a higher sampling rate is generally required for music applications. Furthermore, in digital applications, the sampling rate may depend on the transmission rate of the digital information.

Note that the steps in FIG. 9 represent one embodiment of the present invention. Alternate embodiments may perform the steps in various different order, where some steps may even be performed more often, less often, or concurrently with other steps. Also, some of the steps in flow 200 may be optional, while other embodiments may use additional or different steps to perform any desired operations. Therefore, one of ordinary skill should appreciate that many variations are possible and that flow 200 is only one example of operation of an echo canceller. Similarly, echo canceller 20 also illustrates only one possible embodiment. Alternative embodiments may use more or less blocks or units to perform all, less then all, or even different functions than those illustrated in FIG. 2. Therefore, echo canceller 20 of FIG. 2 should only be viewed as one example. Also note that the blocks in FIG. 2 and the steps of FIG. 9 can all be performed by software running on a data processor (e.g. a microprocessor, digital signal processor, etc.), by hardware, or by a combination of hardware and software.

FIG. 3 illustrates one embodiment of near-end signal detector 26. Operation of near-end signal detector 26 will be described with reference FIGS. 10–13. Near-end signal detector 26 and the flows of FIGS. 10–13 allow for a fast and reliable detection which is not affected by the echo path delay and the echo return loss (ERL), which is the attenuation of a signal from Rout port to Sin port of an echo canceller, due to transmission and hybrid loss in the echo path. When a near-end talker signal is detected (i.e. when the existence of Sgen is detected), the adaptation process (affecting the coefficients of adaptive filter 28 in order to minimize the average power of the residual echo) is stopped, as discussed above, to prevent the adaptation from diverging since the existence of a near-end talker signal indicates that error signal 46 is not solely the error due to echo. Note that the adaptation process is stopped when a near-end signal is detected, regardless of whether the near-end signal is during a single-talk situation (i.e. only a near-end talker is present) or a double-talk situation (when both a near-end talker and a far-end talker is present). In addition to stopping the adaptation process, filter coefficients may need to be restored from backed up filter coefficients. Furthermore, when both near-end and far-end signals are absent, the adaptation process is also halted to prevent echo canceller 20 from adapting on channel noise or on low error signals, thus minimizing computation. Therefore, echo canceller 20 operates to adapt when necessary, such as when the far-end signal is relatively strong, and the near-end signal is absent. In this situation, adaptive filter 28 can be adapted to correctly estimate the echo as echo estimation signal 48. Also, as will be discussed below, the threshold for the near-end talker signal detection is "gear-shifted" (i.e. adjusted), depending upon the state of the adaptive filter process.

Figure 11:
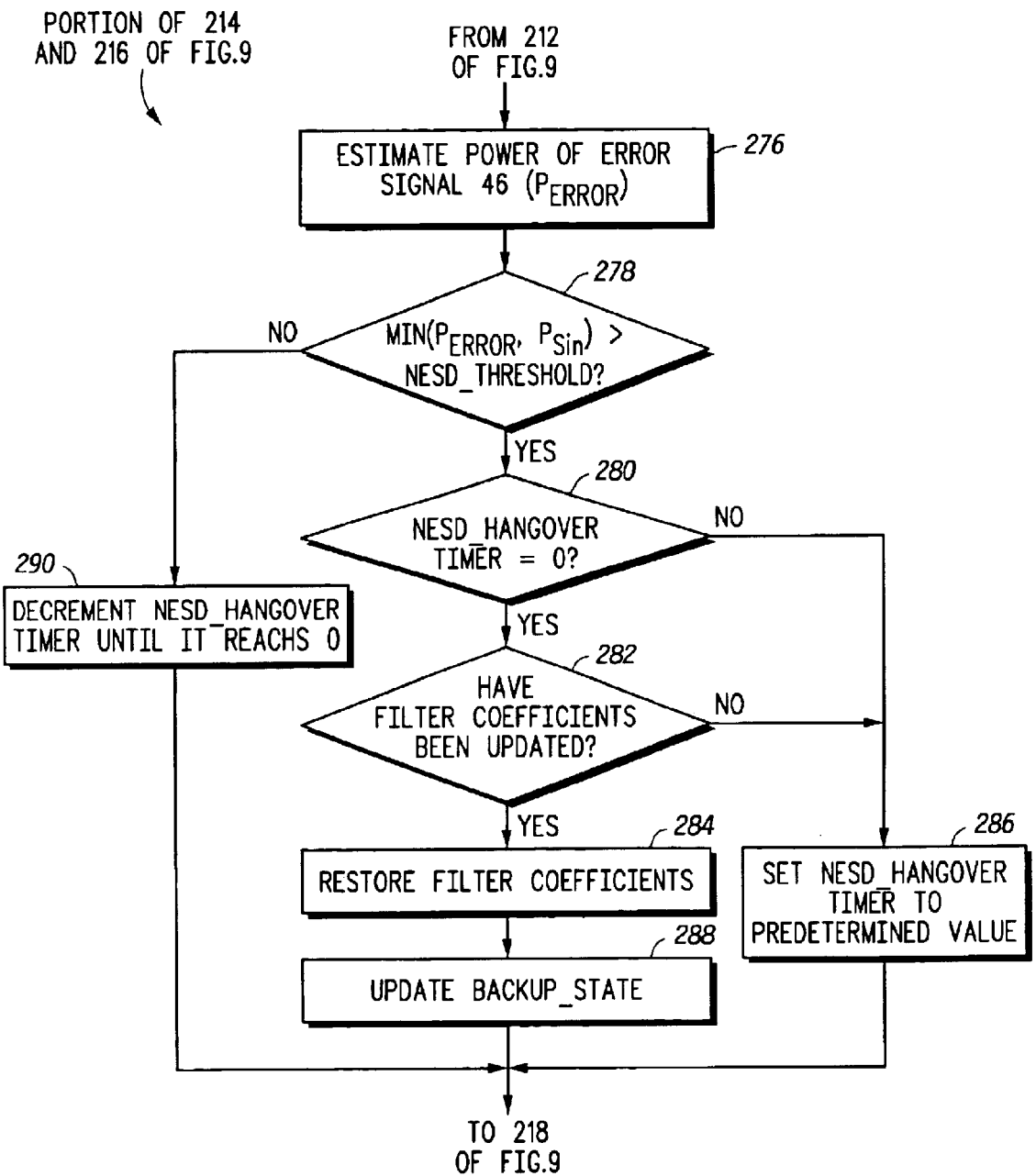
Figure 12:
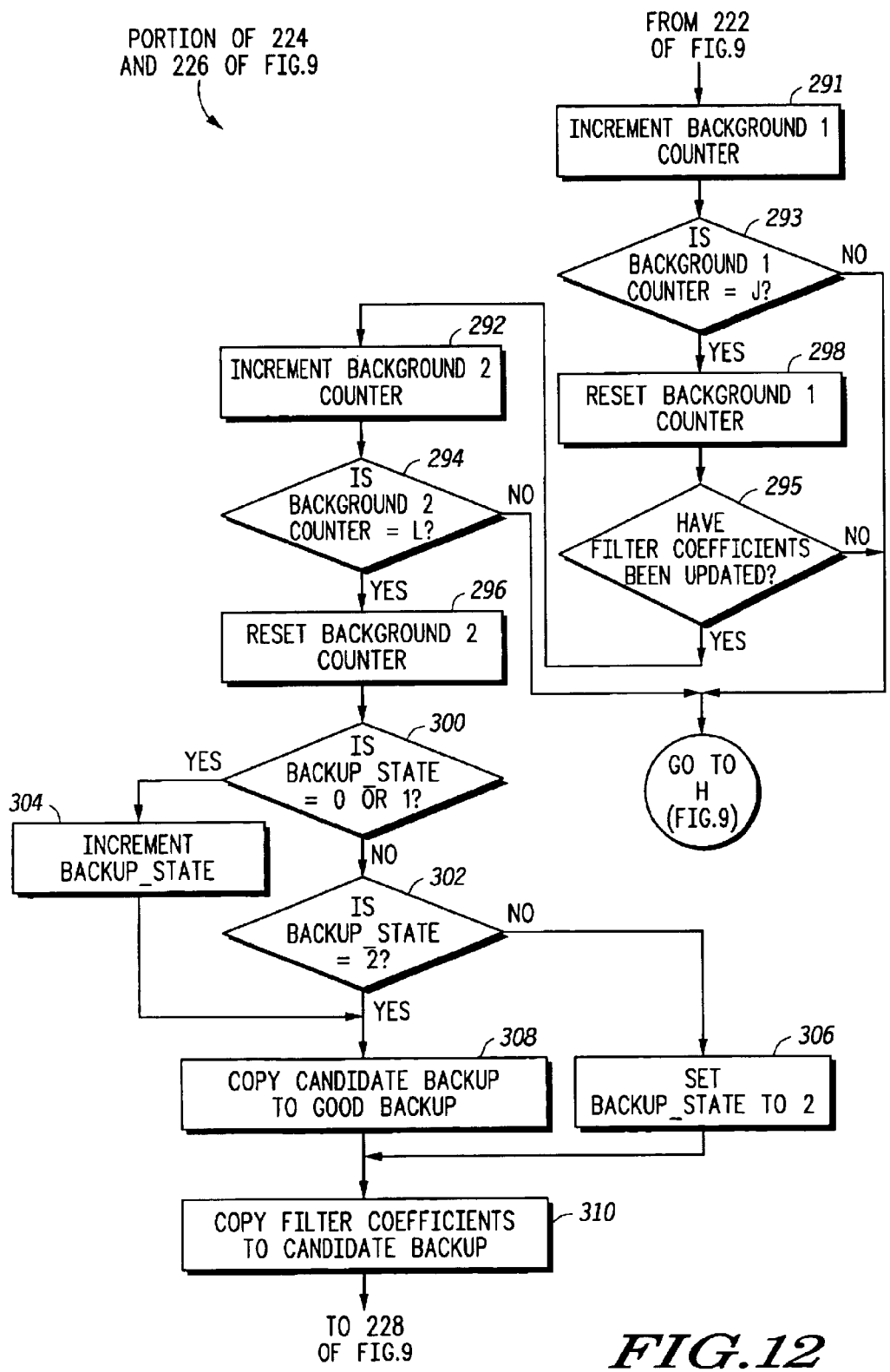
Figure 13:
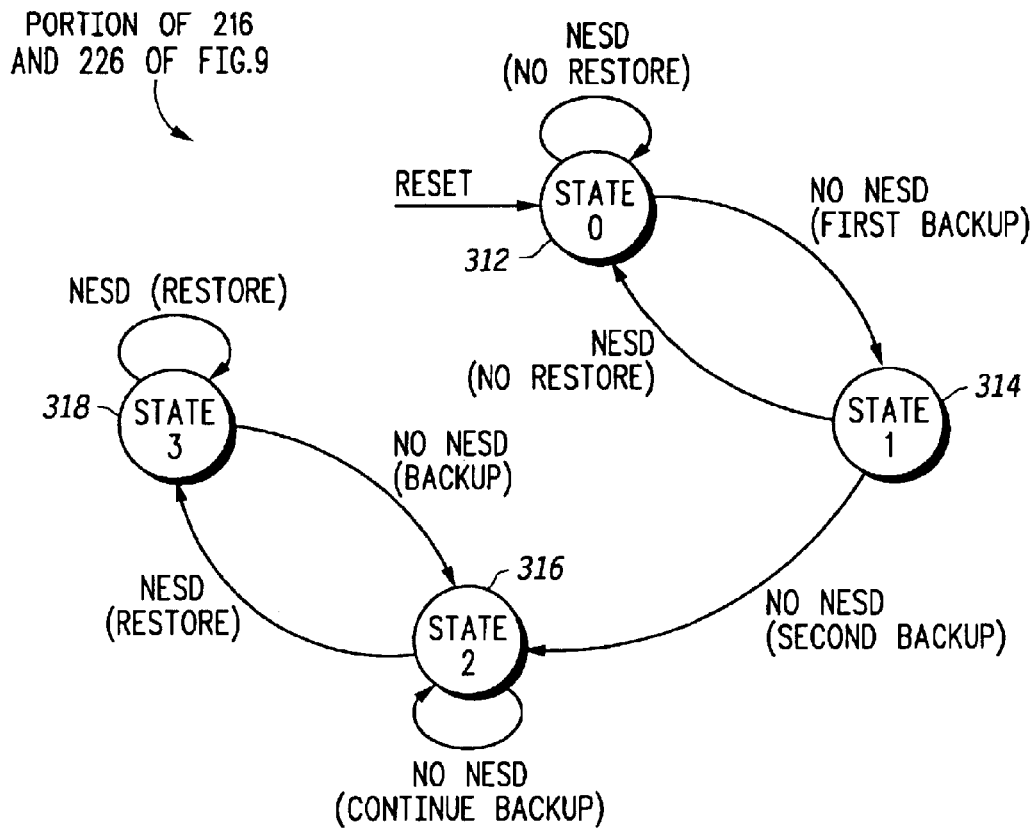

The embodiments discussed in FIGS. 10–13 also provide a method for backing up and restoring coefficients for adaptive filter 28. The process may be governed by a state machine, as illustrated in FIG. 13, which minimizes the number and the frequency of backups and prevents adaptive filter 28 from diverging.

FIG. 3 illustrates one embodiment of near-end signal detector 26. Signal level estimators track the levels of the near-end signal (Sgen), far-end signal (Rin), and the send path input signal (Sin). Therefore, near-end signal level estimator 50 receives error signal 46, far-end signal level estimator 52 receives Rin 44, and Sin signal level estimator 54 receives Sin 38. The signal level estimations are then used to control near-end signal detection (NESD) threshold selector 58 and near-end signal detector 60. Background processor 56 monitors the processing status of adaptive filter 28 and controls NESD threshold selector 58 and near-end signal detector 60. Note that in general, each signal level estimator may apply a low-pass filter on the signal to be measured, and the estimation can be done in either power or magnitude. Also, the following descriptions of FIGS. 3 and 10–13 assume that signals are sampled at a rate of 8 kHz (which is a common rate for normal speech applications, as discussed above).

One embodiment of Sin signal level estimator 54 obtains the power of Sin ($P_{Sin}$) using the following equation:

$$P_{Sin}(n) = [(N-1)P_{Sin}(n-1)+(Sin(n))^2]/N \qquad \text{Equation 1}$$

In the above equation, Sin(n) is the send path input to echo canceller 20 at time n, $P_{Sin}$(n) is the estimated send path input signal power at time n, and N is a smoothening factor, which, in one embodiment, is assumed to be 32. In alternate embodiments, a range of N values may be used. In general, N should be chosen to be large enough so that the power estimation on Sin is not too sensitive to rapid variations of Sin. On the other hand, N cannot be so large such that the power estimation of Sin is sensitive enough to track the changes of speech signal level, and the delay for the power estimation is minimum. Alternatively, the power can be estimated using a moving average method with window size of 2*N-1 samples. It can be shown that this approach provides equivalent bandwidth to the power estimator as per Equation 1.

Near-end signal level estimator 50 receives error signal 46 and obtains the near-end signal power at time n. As discussed above, though, there is no direct access to the near-end signal (Sgen) for echo canceller 20. That is, Sin 38 is a mixture of Sgen and the reflected echo from Rin 44. Therefore, one embodiment of near-end signal level estimator 50 uses the difference between Sin 39 (which is a filtered version of Sin 38, assuming a filter is present between DC notch filter 45 and adder 34 in FIG. 2) and echo estimation signal 48. Therefore, error signal 46 is provided to near-end signal level estimator 50. Error signal 46 is the closest estimation of Sgen available to echo canceller 20, but the accuracy of this is estimation is a function of the convergence state of adaptive filter 28. Ideally, when the adaptive filter is fully converged, the estimation of the echo (echo estimation signal 48) is accurate. In practice, as was described above, echo estimation signal 48 is generally not equal to the reflected echo from Rin 44, and therefore, error signal 46 is not simply Sgen, but instead is Sgen+residual echo. As the adaptive process continues over a certain window of time, the error introduced by the residual echo is minimized. Therefore, one embodiment of near-end signal level estimator 50 uses the following equation:

$$P_{error}(n) = [(N-1)P_{error}(n-1)+(\text{error signal } 46)^2]/N \qquad \text{Equation 2}$$

In the above equation, error signal 46 is the difference between Sin 39 and echo estimation signal 48 at the output of adder 34, $P_{error}$(n) is the estimated near-end signal power at time n, and N is a smoothening factor of the estimator (which is 32 in the current embodiment).

One embodiment of far-end signal level estimator 52 obtains a short-term power of Rin and uses this to calculate an average power of Rin over some of the past short-term power estimations of Rin, which covers the range of the echo path. For example, one embodiment determines short-term power of Rin using the following equation:

Equation 3:

$$P_{Rin}(kN) = \frac{1}{N}\sum_{i=0}^{N-1}(Rin(kN-i))^2 \qquad k=1,2,\ldots$$

In the above equation, Rin(kN−i) is the receive path input to echo canceller 20 at time kN−i, $P_{Rin}$(kN) is the estimated far-end signal power at time kN (note that $P_{Rin}$(kN) is estimated every N samples, instead of every sample, to reduce computation cost). N is the window size (which is 32 in one embodiment). Therefore, equation 4 calculates the power of Rin within the current window (of size N) every N samples where k keeps track of the windows. That is, the first window (for k=1) may be defined by samples 1–32, the next window (for k=2) may be defined by samples 33–64, etc. The average power of the far-end signal can then be obtained using the following equation:

Equation 4:

$$AVGP_{Rin}(kN) = \frac{1}{M}\sum_{i=0}^{M-1} P_{Rin}((k-i)N) \qquad k=1,2,\ldots$$

In the above equation, the "$P_{Rin}$((k−i)N)" are the past M snapshots of the far-end signal power estimations at time (k−i)N, where i=M−1, M−2, . . . ,0. AVG $P_{Rin}$(kN) is the average of the far-end signal level estimation at time kN, and M is the window size for the average where M=16 for an echo canceller designed to cover echo path delay up to 64 ms (i.e. M*N=16*32=512 samples). For example, if the current window is $16^{th}$ window (i.e. k=16), then the value of AVG $P_{Rin}$(kN) takes the average of the $P_{Rin}$(kN) values that were calculated for each of the 16 (i.e. M) previous windows, i.e. the average of: $P_{Rin}$(16*N), $P_{Rin}$(15*N), . . . , $P_{Rin}$(2*N), $P_{Rin}$(N). If there is not enough previous data (i.e. less than M windows have been processed), then only those available values can be used to determine the average and a zero may be utilized for values that have not yet been calculated. For example, for the $3^{rd}$ window (k=3), only two previous $P_{Rin}$(kN) values are available, and therefore, AVG $P_{Rin}$(kN) would be an average of 3 values and not M values. Note also that AVG $P_{Rin}$(kN) is calculated every N samples, as will be seen in reference to FIG. 10, and after calculating AVG $P_{Rin}$(kN), the value of k can be incremented to indicate the start of a next window of N samples.

In an alternate embodiment, far-end signal level estimator 52 can estimate the average power of Rin using either equation 1 or 2 above with N=256. As with equation 4, the measurements AVG $P_{Rin}$(kN) should also be taken every 32 samples. Note also that all the above level estimations can be done using magnitude rather than power. Also, note that equations 1 and 2 above process data at a nominal rate while equations 3 and 4 perform sub-rate calculations on sequential N-size windows (thus performing calculations once every N samples). Alternate embodiments may structure the above equations in any manner and are not restricted to those equations given above.

Figure 10:
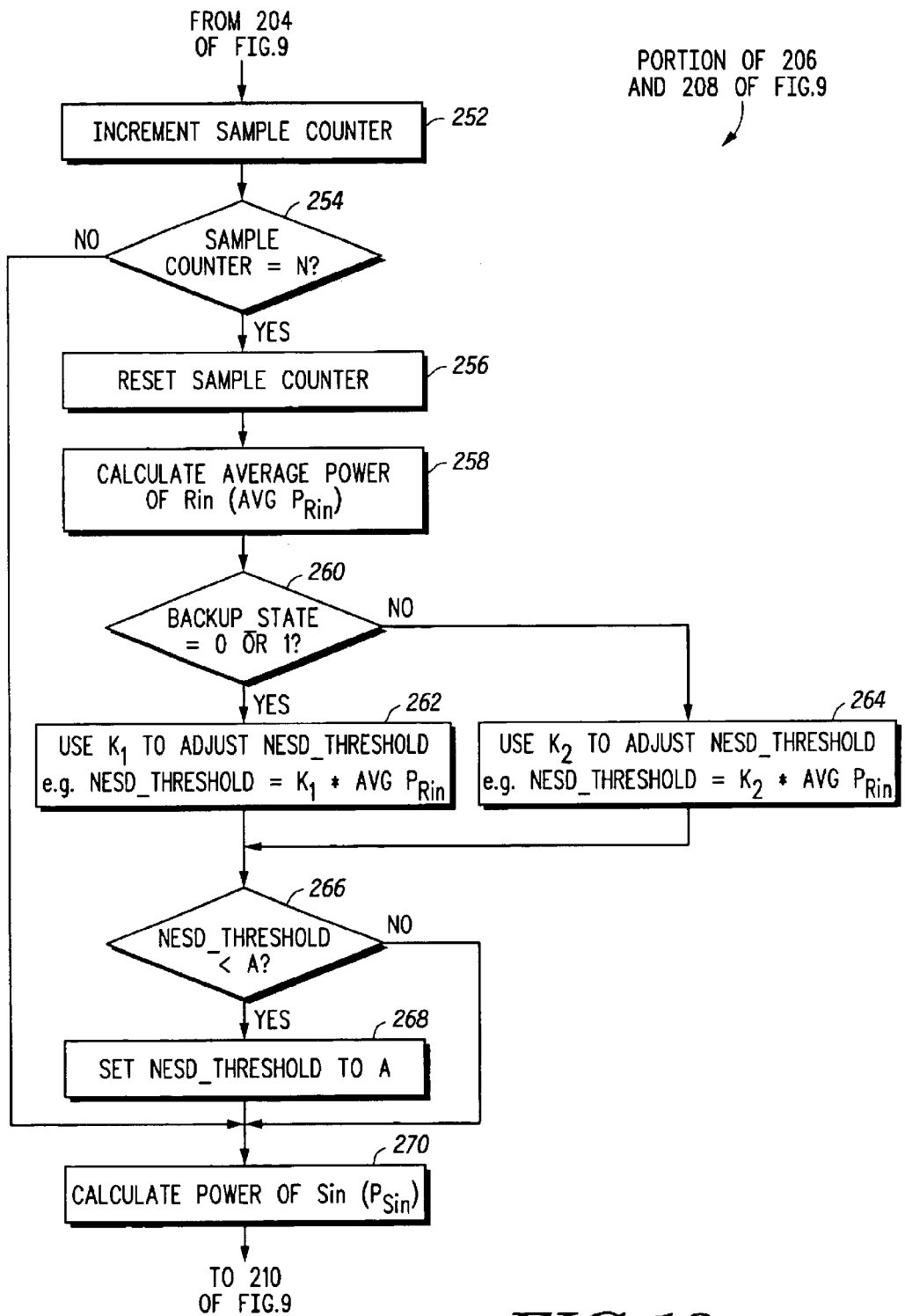
FIGS. 10–13 illustrate, in flow diagram form, operation of a near-end signal detector of the echo canceller of FIG. 2 and a method of backing up and restoring filter coefficients for an adaptive filter of the echo canceller of FIG. 2, in accordance with one embodiment of the present invention.

The level estimations for the near-end (Sgen), far-end (Rin), and send path input (Sin) signals are used in the control of the near-end talker signal detection. FIG. 10 therefore shows one embodiment of blocks 206 and 208 of FIG. 9 where the near-end signal detection threshold (NESD_Threshold) is determined. The threshold is reevaluated once every N samples, where N is 32 in the current embodiment. In block 250, the short-term power of Rin, $P_{Rin}$, is determined (e.g. see equation 3 above) where the current time, n, corresponds to the current sample being analyzed. In block 252, the sample counter is incremented, thus providing a new value of n. The sample counter is therefore incremented during each pass through flow 200 of FIG. 9 (thus during each pass of 206 and 208).

Flow proceeds to decision diamond 254, where it is determined whether the sample counter has reached the window size, N. If not, flow proceeds to block 270 (and note that the NESD_Threshold is not updated). In block 270, the power of Sin ($P_{Sin}$) is calculated (e.g. see equation 1 above). If the sample counter has reached N, then flow proceeds to block 256 where the counter is reset such that the path of blocks 256 through 268 is only taken every N samples (which in one embodiment occurs every 32 samples with N being 32). After the sample counter is reset (reset to zero, in one embodiment), flow proceeds to block 258 where the average power of Rin, AVG $P_{Rin}$, is calculated (e.g. see equation 4 above). Afterwards, flow proceeds to decision diamond 260 where it is determined whether BACKUP_STATE is 0 or 1 (note that BACKUP_STATE will be described in more detail in reference to FIG. 13). If so, flow proceeds to block 262 where K1 is used to adjust NESD_Threshold as shown below in equation 5:

$$NESD\_Threshold = K1 * AVG\ P_{Rin} \qquad \text{Equation 5}$$

However, if BACKUP_STATE is not 0 or 1, then flow proceeds to block 264 where K2 is used to adjust NESD_Threshold as shown below in equation 6:

$$NESD\_Threshold = K2 * AVG\ P_{Rin} \qquad \text{Equation 6}$$

Therefore, NESD_Threshold is reevaluated once every N samples, and depending upon the state of the adaptive filters (i.e. BACKUP_STATE, corresponding to a state machine which will described further in reference to FIG. 13), NESD_Threshold can be determined as either K1*AVG $P_{Rin}$ or K2*AVG $P_{Rin}$. K1 and K2 are NESD threshold scaling factors. During the initial phase of the adaptation process of adaptive filter 28 (i.e. when BACKUP_STATE is 0 or 1), NESD_Threshold can be relatively large, providing more opportunity for adaptive filter 28 to adapt. On the other hand, when adaptive filter 28 has passed the initial adaptation phase (i.e. when BACKUP_STATE is 3 or 4), NESD_Threshold may be reduced to prevent the adaptation process from diverging. In one embodiment, K1 is set to a value within a range of 1 to 2 while K2 is set to a value within a range of 0.25 to 1. For example, in one embodiment, K1 is 1 and K2 is 0.5, depending upon hybrid conditions. Furthermore, these values of K1 and K2 can be set either statically or dynamically during the adaptive process. Alternate values outside the ranges given above may be used, and other methods, other than the use of a state machine having 4 states (e.g. BACKUP_STATES 0–3) may be used to determine when the adaptation process is still in its initial phase.

After adjusting NESD_Threshold in block 262 or 264, flow proceeds to decision diamond 266 where it is determined whether NESD_Threshold is less than A. If not, flow proceeds to block 270 where the $P_{Sin}$ is calculated. If so, NESD_Threshold is set to A in block 268. That is, NESD_Threshold is limited at a minimum level of A (where, in one embodiment, A may correspond to a value in a range of −40 to −45 dBm0) in the case where AVG $P_{Rin}$ is too small. Flow then proceeds to block 270.

After the flow of FIG. 10 is completed, monitoring and controlling of adaptive filter 28 is performed (see block 210 of FIG. 9) if necessary. (Note that blocks 209, 210, and 211 will be described in more detail in reference to FIGS. 20–34 below.) Afterwards, adaptive filter generates echo estimation signal 48 in block 212, and flow proceeds to blocks 214 and 216 which are illustrated in further detail in reference to FIG. 11. That is, the flow of FIG. 11 illustrates a portion of blocks 214 and 216 of FIG. 9 which detail the control of the near-end talker signal detection (i.e. the detection of Sgen).

In block 276, the power of error signal 46 ($P_{error}$) is estimated (see equation 2 above). Flow then proceeds to decision diamond 278 where it is determined whether the smaller of $P_{error}$ and $P_{Sin}$ is greater than NESD_Threshold (i.e. whether MIN($P_{error}$, $P_{Sin}$)>NESD_Threshold). If so, flow proceeds to decision diamond 280 where it is determined whether NESD_Hangover timer has counted down to zero. If it has, then a near-end signal has been detected. That is, a near-end signal is detected only when MIN($P_{error}$, $P_{Sin}$)>NESD_Threshold and no near-end signal has been detected during a certain time window in the past (corresponding to the NESD_Hangover timer). If at decision diamond 278, the MIN($P_{error}$, $P_{Sin}$) is not greater than NESD_Threshold, flow proceeds to block 290 where the value of the NESD_Hangover timer is decremented until it reaches zero, thus introducing a pause determined by the NESD_Hangover time. If at decision diamond 280, the NESD_Hangover timer is not zero, the NESD_Hangover timer is set to a predetermined value in block 286.

If a near-end signal (Sgen) has been detected, flow proceeds from decision diamond 280 to decision diamond 282 where it is determined whether the filter coefficients have been updated. If so, it is assumed that the coefficients are mostly likely corrupted due to the presence of a near-end signal. That is, because the signal being used for the coefficient update is no longer the pure residual echo, but a mixture of the residual echo and Sgen, the coefficients are no longer representative of the estimated echo. In this case, flow proceeds to block 284 where the filter coefficients are restored or replaced by a proven "good" set of filter coefficients. The method of backing up and restoring the filter coefficients will be described below in reference to FIGS. 12 and 13. Flow then proceeds to block 288 where BACKUP_STATE is updated. If the filter coefficients have not been updated at decision diamond 282, then the coefficients are not assumed to be corrupted because they have not been adapted using a mixture of residual echo and Sgen. In this case, flow proceeds to block 286 where the NESD_Hangover timer is set to the predetermined value.

The duration of the NESD_Hangover time that is used for the NESD_Hangover timer is chosen to ensure that Sgen is no longer present before starting filter coefficient adaptation as well as to avoid any unnecessary filter coefficient adaptation and restore. For example, in one embodiment, the NESD_Hangover time is 160 samples, or 20 milliseconds. Therefore, the duration of the NESD_Hangover time prevents near-end signal detector 26 from being overly sensitive thus minimizing the switching between the detection of a near-end talker signal and detection of a lack of near-end talker signal. However, if the NESD_Hangover time is set too long, near-end signal detector 26 may not be sensitive enough to accurately detect a near-end talker signal when necessary.

Therefore, under different combinations of the signal levels (i.e. power) of Sgen and Rin, different action regarding the filter coefficients (e.g. the coefficients of adaptive filter 28) is taken. For example, these actions can be summarized using the following table:

TABLE 1

| Item | Sgen | Sin | Rin | Action | Description |
|------|------|-----|-----|--------|-------------|
| 1 | low | low | low | no update | no near-end or far-end talker signals present |
| 2 | low | low | high | update coefficients | single far-end talker signal with large hybrid attenuation |
| 3 | low | high | low | n/a | not a valid combination |
| 4 | low | high | high | update coefficients | single far-end talker signal with small hybrid attenuation |
| 5 | high | low | low | n/a | not a valid combination |
| 6 | high | low | high | n/a | not a valid combination |
| 7 | high | high | low | freeze update and restore filter coefficients | single near-end talker signal present |
| 8 | high | high | high | freeze update and restore filter coefficients | double-talk (both near-end and far-end talker signals present) |

Since Sin is a mixture of Sgen and the echo or Rin, several combinations listed in the above table are not valid ones under normal operation mode (meaning that the connection is not broken or that no extra signals are injected into the circuit). These invalid combinations are Item 3 (because Sin cannot be high when both Sgen and Rin are low), Items 5 and 6 (because Sin cannot be low when Sgen is high). Three sets of actions are used for the remaining 5 combinations. Firstly, the condition for the coefficient adaptation process is when Rin is high while Sgen is low (during a single far-end talking period, regardless of whether Sin is high or low, i.e. items 2 and 4, respectively) Under these conditions, the error (error signal 46) is due mainly to residual echo (because Sgen is low), and the effect of Sgen on adaptation is minimal. Secondly, the conditions for stopping the filter coefficient adaptation processor and for restoring previously determined "good" filter coefficients are when Sgen is high (during a near-end talking period, regardless of single talk or double talk, i.e. items 7 and 8, respectively). Thirdly, no update is necessary when both the near-end and the far-end talkers are silent (item 1).

The methods described above for the detection of Sgen allows for the ability to cancel echoes when the echo return loss is close to or less than 6 dB. Therefore, at close to or less than 6 dB (such as in item 4 of Table 1 above), the methods above use the minimum of Sgen (which, as described above, may be estimated as error signal 46, assuming that the residual error is small or negligible) and Sin which results in no false detection under these conditions, unlike previous solutions which may be heavily affected by variations in echo return loss at these lower levels (closer to or less than 6 dB) and therefore tend to falsely detect the presence of Sgen when it is actually not present. Furthermore, the methods above enable the adaptation process to continue when the echo return loss is up to 0 dB (no hybrid attenuation), allowing the echoes to be cancelled, unlike in prior solutions where the adaptation process was stopped at levels such as 6 dB.

Also, the methods described above in reference to FIGS. 10 and 11 allow for fast detection of Sgen even when its level is relatively low compared with Rin (corresponding to item 8 in Table 1 above). For example, the prior solutions set the double talk detection threshold as Sin energy larger or equal to ¼ of Rin energy (i.e., corresponding to 6 dB loss introduced by hybrid circuit). If the hybrid attenuation is 10 dB, then that 4 dB difference in the detection threshold would be large enough to allow significant amount of Sgen signal exist without being detected as double talk. Therefore, these prior solutions were not able to always detect near-end talk signals, or detected them too late. The method described above use the minimum of Sgen (which, as described above, may be estimated as error signal 46, assuming that the residual error is small or negligible) and Sin as compared with Rin for the near-end signal detection, the detection threshold (NESD_Threshold) setting is independent of the echo return loss resulting in a near-end signal detection that is faster and more reliable than previously available solutions.

Furthermore, the methods described above in reference to FIGS. 10 and 11 allow for the ability of differentiating between double talk (item 8 in Table 1 above) and single far-end talk (item 4 in Table 1 above) with some noisy near-end background. When the near-end background noise level is relatively high, prior solutions detect this situation as a double talk situation and stops the adaptation process. Since the background noise may persist for a long period of time, even for the duration of an entire telephone call, the adaptive filter may not ever get the change to converge. Therefore, the use of the minimum of Sgen and Sin versus Rin for the near-end signal detection described herein above allows the detection threshold (NESD_Threshold) be set such that the adaptive process will continue even when the background noise level is relatively high. (Note that the only true double-talk condition is when both Rin and Sgen signal levels are high. However, the adaptation process described herein should be stopped and the filter coefficients restored when near-end talker signal is detected, regardless whether during a single near-end talk period, or in a double-talk period.)

FIG. 12 illustrates a portion of decision diamond 224 and block 226 of FIG. 9 where it is determined whether background process is to be performed and if so, backing up the filter coefficients. The flow of FIG. 12 deals mainly with the filter coefficient (of adaptive filter 28) backup policy. One embodiment of the backup policy ensures that the good filter coefficients are being backed up periodically, to minimize the number of backups, and to minimize the frequency of backups. FIG. 12 begins with block 291 where the background 1 counter is incremented. Flow proceeds to decision diamond 293 where it is determined whether the background 1 counter has reached a predetermined counter value, J. If not flow proceeds to point H (after block 228 in FIG. 9). If so, flow proceeds to block 298 where background 1 counter is reset (to zero), and then to decision diamond 295 where it is determined whether the filter coefficients of adaptive filter 28 have been updated. If not, flow proceeds to point H.

If so, flow proceeds to block 292 where the background 2 counter is incremented.

Flow then proceeds to decision diamond 294 where it is determined whether the background 2 counter has reached a predetermined counter value, L. If not, flow proceeds to point H. If so, flow proceeds to block 296 where background processing is performed. That is, background processing, in this embodiment, is performed at most every J*L samples, and these values, J and L, can be set to any value which helps to determine the frequency of background processing. For example, in one embodiment, J is 160 samples and L is 10, where background processing is performed at most every J*L, or 1600, samples. That is, if, after J samples, the filter coefficients of adaptive filter 28 have not been updated, then flow proceeds to point H, and the background 2 counter is not incremented. Therefore, the background 2 counter is incremented and compared to L only if the coefficients have been updated during the current window of J samples. In block 296, the background 2 counter is reset (in this embodiment, reset to zero). Flow continues from block 296 to decision diamond 300.

In decision diamond 300, it is determined whether the current BACKUP_STATE (which will be described in more detail in reference to FIG. 13) is 0 or 1. If so, the BACKUP_STATE is incremented in block 304 and flow proceeds to block 308. If the BACKUP_STATE is not 0 or 1, flow proceeds to decision diamond 302 where it is determined whether BACKUP_STATE is 2. If not, flow proceeds to block 306 (indicated that BACKUP_STATE is 3) where BACKUP_STATE is set to 2 and flow proceeds to block 310. If BACKUP_STATE is 2 at decision diamond 302, flow proceeds to block 308 where the Candidate backup coefficients are copied to the Good backup coefficients. (Note that Candidate and Good backup coefficients will be described below in reference to FIG. 13.) Flow then continues to block 310 where the current filter coefficients are copied to the Candidate backup coefficients. That is, in block 308, the Candidate backup coefficients become the Good backup coefficients, and the current filter coefficients become the Candidate backup coefficients, where the current backup coefficients, Candidate backup coefficients, and Good backup coefficients can all be stored in a storage unit or separate storage units either in echo canceller 20 or in storage location outside of echo canceller 20. Afterwards, flow proceeds to block 228 of FIG. 9.

One embodiment of the present invention uses two coefficient backups marked as Candidate backup coefficients and Good backup coefficients, and has a combination of 4 different BACKUP_STATES (0 to 3). FIG. 13 therefore illustrates a state machine that controls the backup and restoring process of the filter coefficients of adaptive filter 28.

The state machine of FIG. 13 includes 4 BACKUP_STATES 0–3. STATE 0 indicates that neither Candidate backup coefficients are available and nor Good backup coefficients are available. STATE 1 indicates that Candidate backup coefficients are available but no Good backup coefficients are available. STATE 2 indicates that both Candidate and Good backup coefficients are available. STATE 3 indicates no Candidate backup coefficients are available but that Good backup coefficients are available. Note that the state machine of FIG. 13 implements a portion of blocks 216 and 226 of FIG. 9.

In one embodiment, the state machine starts with STATE 0 upon reset or initialization. The state machine transitions to STATE 1 if no near-end signal (Sgen) is detected in the last L entries to the background processing. Therefore, the minimum time window for the first backup of the filter coefficients is J*L samples (where L is 10 in the current embodiment, and J*K is therefore 1600 samples or 200 ms, assuming a sampling rate of 8 kHz). For this state transition, near-end signal has not been detected, and a first backup is performed by copying the current filter coefficients to the Candidate backup coefficients. Upon the detection of a near-end signal (Sgen), the state machine transitions back to STATE 0 because the stored Candidate backup coefficients may be corrupted due to the delay in the detection of the near-end signal, Sgen. The state machine remains in STATE 0 until no near-end signal is detected in the last L entries to the background processing at which point, the state machine again transitions to STATE 1 as was described above.

In STATE 1, if no near-end signal is detected in another L entries of the background processing, the state machine transitions to STATE 2 where a second backup is performed by copying the Candidate backup coefficients to the Good backup coefficients and copying the current filter coefficients to the Candidate backup coefficients. In this state, both the Candidate and Good backup coefficients are available and the state machine will remain in this state if no near-end signal is detected. Note that in one embodiment, both Candidate and Good backup coefficients are renewed in sequential backups during the second backup, even though the state is not changed. Also, in one embodiment the two copies performed upon transition to STATE 2 from STATE 1 are performed with a single copy by first marking the Candidate backup coefficients as the Good backup coefficients (through the use of a pointer, for example), and then copying the current filter coefficients to the Candidate backup coefficients (which used to be marked as the Good backup coefficients).

In STATE 2, when a near-end signal is detected, the state machine transitions to STATE 3 where the Candidate backup coefficients are again considered corrupted but the Good backup coefficients are still considered good because these Good backup coefficients have been proven to be good after at least a J*L time window. The state machine remains in STATE 3 so long as the near-end signal persists, or will go back to STATE 2 if the near-end signal is no longer present.

Note that in alternate embodiments, each entry to the background processing (L) can occur on each sample rather than every J samples. Also, the state machine of FIG. 13 can be implemented in a variety of different ways and may include more, less, or different states than those illustrated.

FIG. 6 illustrates one embodiment of a portion of monitor and control unit 30 of FIG. 2, which, in combination with gain control 33 of FIG. 2 controls the stability of system 10 and of adaptive filter 28. For example, system 10 is considered unstable if it produces sustained artifacts due to a set of filter coefficients (of adaptive filter 28) that are very different from the impulse response of hybrid 16. As mentioned above with respect to FIG. 37, the coefficients of adaptive filter 28 attempt to "imitate" the impulse response of hybrid 16 and subtract it out from the outgoing signal in an attempt to cancel out the reflected echo. However, if the coefficients of adaptive filter 28 vary too much from the impulse response, artifacts such as voice or data signal distortions or even system howling may occur. The instability of system 10 can occur under the following two conditions: (1) echo cancellers 20 and 22 being in a closed-loop system and stimulated by certain type of signals thus resulting in a gain of greater than 1 for system 10 and (2) echo canceller 20 being in an open-loop system.

Figure 14:
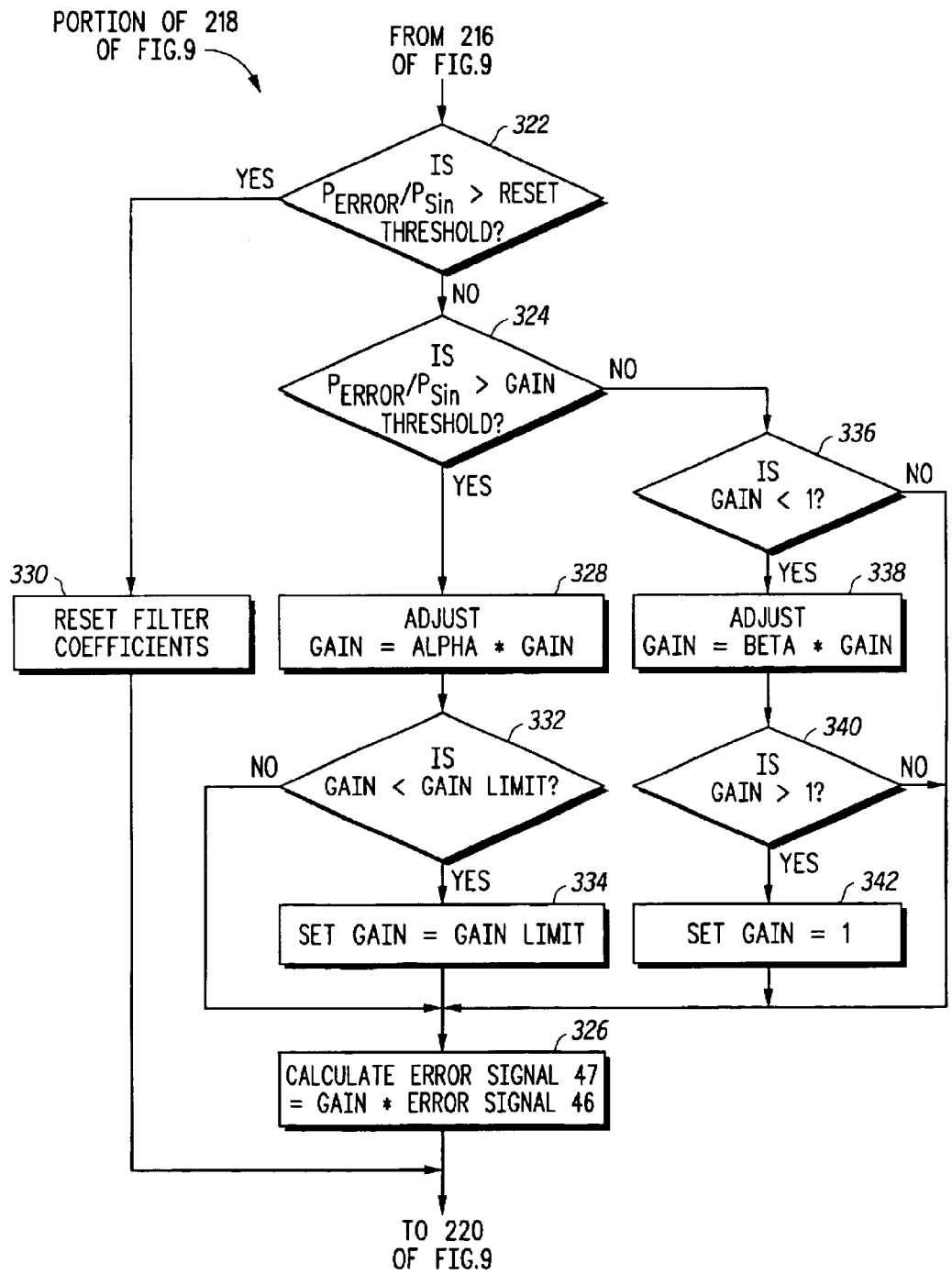
FIG. 14 illustrates, in flow diagram form, a dynamic gain-control method for monitoring the gain of the echo canceller of FIG. 2 in accordance with one embodiment of the present invention.

FIG. 14 illustrates one embodiment of a dynamic gain-control method to monitor the gain of echo canceller 20, which may be performed by gain monitor 100 which is coupled to adaptive filter 28 and gain control 33. The dynamic gain-control method of FIG. 14 ensures the stability of echo cancellers 20 and 22 in a closed-loop system. For example, if error signal 46 is greater than Sin 38 (which in theory should not occur, but in practice can occur), the gain of echo canceller 20 is greater than or equal to one. If the same happens in echo canceller 22 (resulting in a gain of echo canceller 22 also being greater than or equal to one), then the entire loop gain of the closed-loop system with echo cancellers 20 and 22 may be greater than one which can produce an artifact known as howling. Therefore, the method of FIG. 14 attenuates error signal 46 when the ratio of the power of error signal 46 ($P_{error}$) versus the power of Sin 38 ($P_{Sin}$) within a certain time window (see equations 1 and 2 above) is larger than an adaptive threshold. In addition, the method of FIG. 14 resets adaptive filter 28 when $P_{error}$ or is many times larger than $P_{Sin}$. The method of FIG. 14 therefore prevents the overall loop gain of the closed-loop system to reach greater than one over time, which ensures stability of system 10. Furthermore, the method of FIG. 14 also speeds up the re-convergence of adaptive filter 28 upon a sudden change in hybrid characteristics.

Therefore, FIG. 14 illustrates a portion of block 218 of FIG. 9. That is, after detecting whether a near-end talker signal exists in block 216 of FIG. 9, flow proceeds to block 218 where the gain of echo canceller 20 is monitored and selectively adjusted. Therefore, flow begins with decision diamond 322 where it is determined whether the ratio of $P_{error}$ to $P_{Sin}$ ($P_{error}/P_{Sin}$) is greater than a reset threshold. If so, flow proceeds to block 330 where the filter coefficients of adaptive filter 28 are reset (i.e. set to zero, in one embodiment). Alternatively, the coefficients can be reset to any value. Therefore, the reset threshold may be used to determine whether $P_{error}$ or is too much greater than $P_{Sin}$, thus requiring the reset of adaptive filter 28 to prevent instability. The reset threshold can therefore be any value, and in one embodiment is set to 8.

If $P_{error}/P_{Sin}$ is not greater than the reset threshold, flow continues to decision diamond 324 where it is determined whether $P_{error}/P_{Sin}$ is greater than a gain threshold. The gain threshold is generally less than the reset threshold and in one embodiment, is set to 1. This gain threshold is a threshold for starting activation of gain attenuation. If $P_{error}/P_{Sin}$ is greater than the gain threshold, flow proceeds to block 328 where the gain is adjusted using alpha, as shown in equation 7 below:

$$\text{gain}=\text{alpha}*\text{gain} \quad \text{Equation 7}$$

Alpha is generally less than 1 such that error signal 46 is attenuated. Therefore, in one embodiment, alpha is 0.9996. Flow proceeds to decision diamond 328 where it is determined whether the gain is less than a gain limit. If so, flow proceeds to block 334 where the gain is set to a gain limit. This ensures that the gain never falls below a predetermined level, which in one embodiment, is 0.5. For example, it is generally not desirable to cut off the send path transmission path completely (i.e., gain=0), even under some abnormal situations, such as the hybrid being in an open-loop circuit. Flow then proceeds to block 326. If, at decision diamond 332 it is determined that the gain is not less than the gain limit, flow proceeds to block 326 where error signal 47 is calculated as shown in equation 8 below:

$$\text{error signal } 47 = \text{gain}*\text{error signal } 46 \quad \text{Equation 8}$$

If, at decision diamond 324, it is determined that $P_{error}/P_{Sin}$ is not greater than the gain threshold, flow proceeds to decision diamond 336 where it is determined whether the gain is less than 1. If not, flow proceeds to block 326 where error signal 46 is attenuated; however, if it is less than 1, then flow proceeds to block 338 where the gain is adjusted as shown below in equation 9:

$$\text{gain}=\text{beta}*\text{gain} \quad \text{Equation 9}$$

Beta is generally greater than 1 because since the gain was previously attenuated, it needs to be recovered. Therefore, in one embodiment, beta is 1.0004. Flow then proceeds to decision diamond 340 where it is determined whether the gain is greater than 1. If so, flow proceeds to block 326 where error signal 46 is attenuated, and if not, flow proceeds to block 342 where the gain is set to 1. After block 342, flow proceeds to block 326 where error signal 46 is not attenuated because error signal 47 is simply equal to error signal 46*1 (since the gain was set to 1 in block 342). Therefore, in summary, if $P_{error}/P_{Sin}$ is greater than or equal to the reset threshold, the filter coefficients of adaptive filter 28 are reset. If $P_{error}/P_{Sin}$ is less than the reset threshold but greater than or equal to the gain threshold, then the error is attenuated by the gain value (e.g. in block 326). However, if $P_{error}/P_{Sin}$ is also less than the gain threshold, then the error is left unattenuated (i.e. error signal 47=error signal 46). Therefore, it can be appreciated how the flow of FIG. 14 helps maintain stability of system 10.

Figure 15:
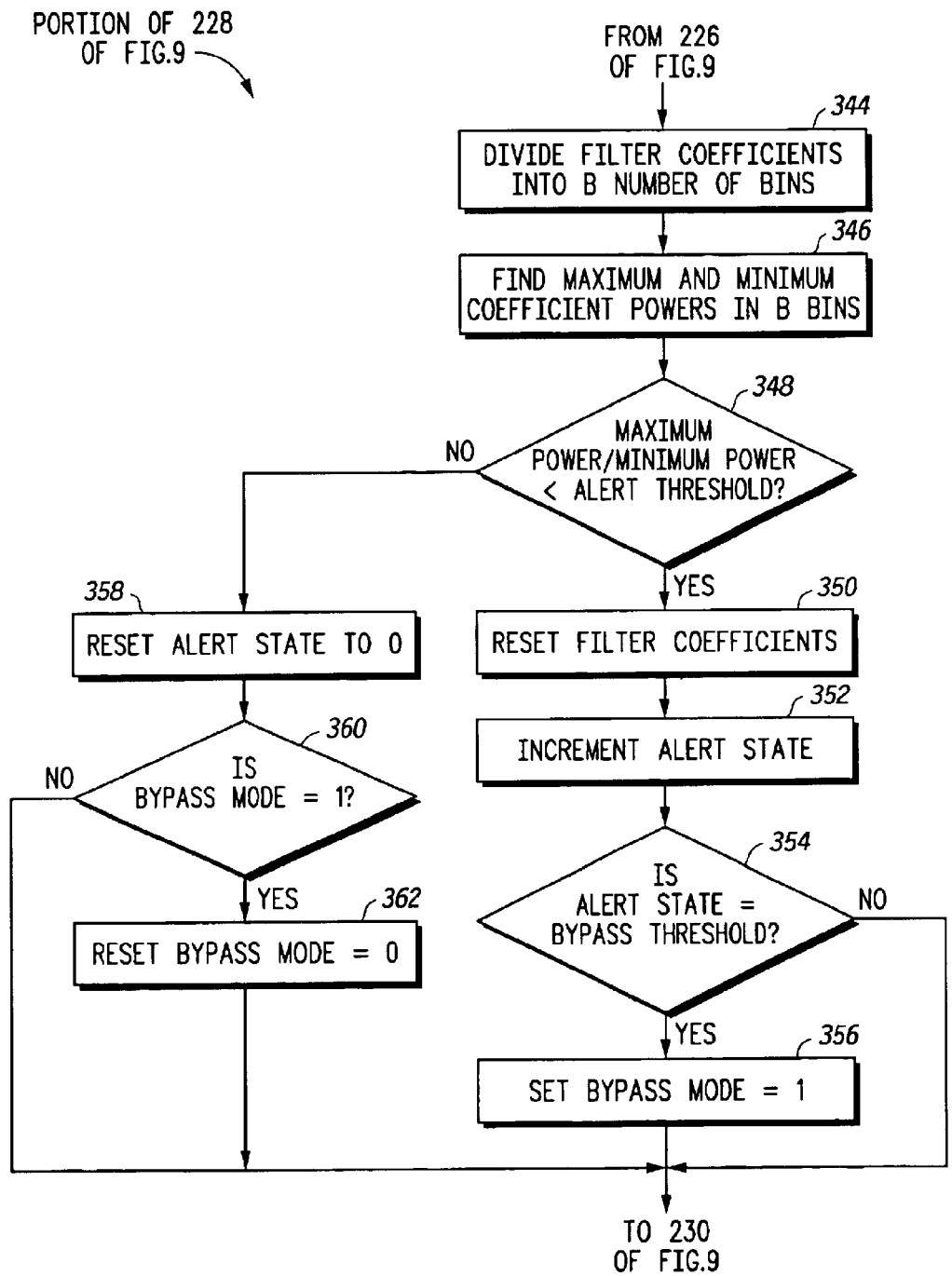
FIG. 15 illustrates, in flow diagram form, a filter coefficient monitoring method for monitoring the distribution of filter coefficients of an adaptive filter of the echo canceller of FIG. 2, in accordance with one embodiment of the present invention.

FIG. 15 illustrates one embodiment of a filter coefficient monitoring method to monitor the distribution of filter coefficients of adaptive filter 28, which may be performed by filter coefficient monitor 102 within monitor and control unit 30 and coupled to adaptive filter 28. The method of FIG. 15 ensures the stability of echo canceller 20 in an open-loop system. The monitoring method detects the formation of a set of filter coefficients of adaptive filter 28 having a relatively uniform distribution. Since an impulse response by hybrid 16 is expected, a uniform distribution of the coefficients of adaptive filter 28 indicates that no hybrid exists, thus indicating the possibility of an open-loop condition. Therefore, upon detecting a uniform distribution of the coefficients of adaptive filter 28, the filter coefficients are reset, and echo canceller 20 is placed in an alert state for further monitoring. When the filter coefficients are reset repeatedly during a certain time window, it is assumed that echo canceller 20 is in an open-loop condition and echo canceller 20 is bypassed. That is, adaptive filter 28 should only adapt if a true hybrid exists. Furthermore, adaptive filter 28 in an open-loop system with continuous sinusoidal inputs via Rin and non-zero signals as Sin (e.g. sinusoidal tones) may diverge especially fast, thus increasing the need for the detection of an open-loop system.

Therefore, FIG. 15 illustrates a portion of block 228 of FIG. 9. That is, after backing up the filter coefficients in block 226 of FIG. 9 (and described above), flow proceeds to block 228 where the coefficients of adaptive filter 28 are monitored. Therefore, flow begins with block 344 where the filter coefficients of adaptive filter 28 are divided into B number of bins. (B is selected to be number of the filter coefficients/16.) Flow proceeds to block 346 where the maximum and minimum coefficients power of the B bins is determined. That is, if the filter coefficients are divided into B bins, each bin will have associated with it a power value of the coefficients within that bin (e.g. an average power of the coefficients within that bin), and in block 346, a maximum power value of the B bins and a minimum power value of the B bins is selected. Flow continues to decision diamond 328 where it is determined whether a ratio of the maximum power value and the minimum power value (i.e.

maximum power/minimum power) is less than an alert threshold. If the filter is adapted towards a real hybrid, the ratio of the maximum power over the minimum power should be far greater than 1. On the other hand, if the ratio of the maximum power over the minimum power is close to 1, it is a clear indication that the filter is not adapting to a real hybrid. A ratio is chosen as an alert threshold for signaling the possibility of the absence of a hybrid. The alert threshold is chosen based on statistical analysis of the adaptive filter behaviors under various hybrids. In one embodiment, the alert threshold is chosen to be 8.

After the comparison, flow continues to block 350 where the filter coefficients of adaptive filter 28 are reset to zero (or set to any other predetermined reset value or values). Flow continues to block 352 where the alert state is incremented. (The alert state indicates how many times the filter coefficients have been reset during the current period of time in which the ratio of maximum power to minimum power is less than the alert threshold Note that the current period of time is the same J*L as was discussed above with reference to FIG. 12, because upon exiting block 310 of FIG. 12, flow proceeds with block 228 of FIG. 9 which is described in FIG. 15, beginning with block 344 of FIG. 15. That is, FIG. 15 is considered part of the background processing that is entered at most every J*L samples, as shown in FIGS. 9 and 12.) After block 352, flow proceeds to decision diamond 354 where it is determined whether the alert state is equal to a bypass threshold. If not, then echo canceller 20 is not placed in bypass mode and therefore adaptive filter 28 continues to adapt. However, if alert state has reached the bypass threshold in decision diamond 354, flow proceeds to block 356 where bypass mode is set to 1 indicating that an open-loop condition has been detected (i.e. no hybrid exists) and therefore echo canceller 20 is to be bypassed so as not to adapt to a non-existent hybrid.

If, at decision diamond 348, it is determined that the ratio of maximum power to minimum power is not less than the alert threshold, flow proceeds to block 358 where the alert state is reset to 0. Flow proceeds to decision diamond 360 where it is determined whether bypass mode is 1 and if so, it is reset to 0 in block 362. The branch to 358 therefore allows for a reconnection of hybrid 16 where adaptive filter 28 begins to adapt again.

FIG. 5 illustrates a portion of nonlinear processor 32 of FIG. 2. As was described above, in addition to reducing or removing the residual echo, nonlinear processor 32 also attempts to preserve or match the background noise of the near-end talker signal which allows for improved communication quality. In general, nonlinear processor 32 detects if the residual echo is below a certain threshold and replaces it with comfort noise, rather than silence, to avoid a sudden disappearance of the telephone line background noise. Such sudden disappearance of background noise may lead to an impression that the telephone connection has been broken.

One prior art method used today uses a synthesized background noise; however, this may result in disruptive switching between true background noise and the synthesized background noise. For example, one prior art method used today uses white noise as comfort noise. However, white noise is far different from natural background noise and therefore sounds disruptive. An alternate solution available today repeatedly outputs pre-stored background noise signals to match background noise. However, this method requires additional storage space and results in the noticeable repetition of background noise which may also be disruptive to communication.

Therefore, FIG. 5 and FIGS. 16–19 provide one embodiment of nonlinear processor 32 which preserves or matches natural background noise in echo canceller 20 in order to reduce artifacts caused by the nonlinear processing of echo cancellation such as the disruptive artifacts discussed in the previous paragraph. Nonlinear processor 32 utilizes short term level estimator 88 and long term signal level estimator 92 to find a reliable estimation for the level of the true background noise signals, and to adjust its thresholds (NLP_ON and NLP_OFF thresholds, to be discussed below. The short-term estimator produces a rapid level estimation of the background noise signals at the beginning of a call. The long term estimator, on the other hand, is adaptive in nature aiming at reliably tracking the background noise signal level over time. A decision of activating nonlinear processor 32 is made based on the relative levels of the far-end signals, the near-end signals, and the background noise signals. When the background noise signals become noticeable, nonlinear processor 32 preserves the original background noise signals by passing them through echo canceller 20. When the background noise signals are low and the residual echo becomes audible, nonlinear processor 32 replaces the residual echo with comfort noise signals of a level a couple of dB lower than the estimated background noise signal level. The generated comfort noise signals are also gradually blended into the original background noise signals to minimize the transition audibility. Therefore, nonlinear processor 32 preserves the natural background noise when possible or matches the background noise with minimum audible effects.

The preservation or matching of natural background noise in echo canceller 20 is performed in four basic steps: (1) estimating the levels of the background noise signals, the far-end talker signals, and near-end talker signals; (2) determining the thresholds for nonlinear processor 32; (3) generating comfort noise if nonlinear processor 32 is needed; and (4) mixing the comfort noise into the background noise if nonlinear processor 32 is needed.

Nonlinear processor 32 of FIG. 5 includes adaptive background level estimator 96 which includes short-term background level estimator 88, background level estimator controller 90, long-term background level estimator 92, and background level adapter 94. The estimation for the background noise level is done by short-term background level estimator 88 and long-term background level estimator 92. Short-term background level estimator 88 provides the initial rapid estimation when opening a call, and long-term background level estimator 92 gradually adapts to the level of the background noise signals over time. Note that the adaptation rate of long-term background level estimator 92 to a higher noise level is slower than the adaptation rate to a lower noise level when the background noise level changes. Therefore, estimators 88 and 92 are active when both the levels of the near-end and far-end talker signals are below predetermined thresholds. That is, if a values are available for a long-term background level estimation, only estimator 92 is used. Therefore, short-term background level estimator 88 is generally only used at the beginning (i.e. at the beginning of a call) when long-term background level estimator 92 is not available yet. (The levels of the near-end and far-end talker signals are determined by near-end signal level estimator 70 and far-end signal level estimator 72, respectively.)

The threshold for turning on nonlinear processor 32 (performed by nonlinear processor ON controller 76) is different than the threshold for turning it off (performed by nonlinear processor OFF controller 78). Nonlinear processor ON controller 76 enables (or turns on) nonlinear processor 32 when the near-end talker signals are insignificant and the far-end talker signals are active. Nonlinear processor OFF controller 78 disables (or turns off) nonlinear processor 32 when the near-end talker signals are relatively high, or the background noise signals are very noticeable. The trade-off between eliminating the residual echo and preserving the actual background noise is made as follows. When the background noise signals are relatively high, nonlinear processor 32 is disabled to allow the background noise to pass through echo canceller 20. In this case, the negligible residual echo is buried by the much noticeable background noise signals, due to a masking effect. When the background noise signals are relatively low, nonlinear processor 32 is enabled because the residual echo is more audible when it is present with rather quiet background noise signals. In both cases, through, the residual echo is small due to good convergence depth achieved by adaptive filter 28.

When nonlinear processor 32 is enabled, comfort noise is generated (by comfort noise generator 86) and the noise levels are matched (by noise level matcher 82) to minimize the audible "noise gating" (i.e. noise switching from one background to another or from one background to silence) for the perceived speech. Several types of comfort noise signals may be chosen to be close to natural background noise signals In addition, the comfort noise gradually replaces the actual background noise (performed by output signal mixer 84) to smoothen the transition, and the level of the comfort noise is set to be a couple of dB lower than the estimated background noise level.

Figure 16:
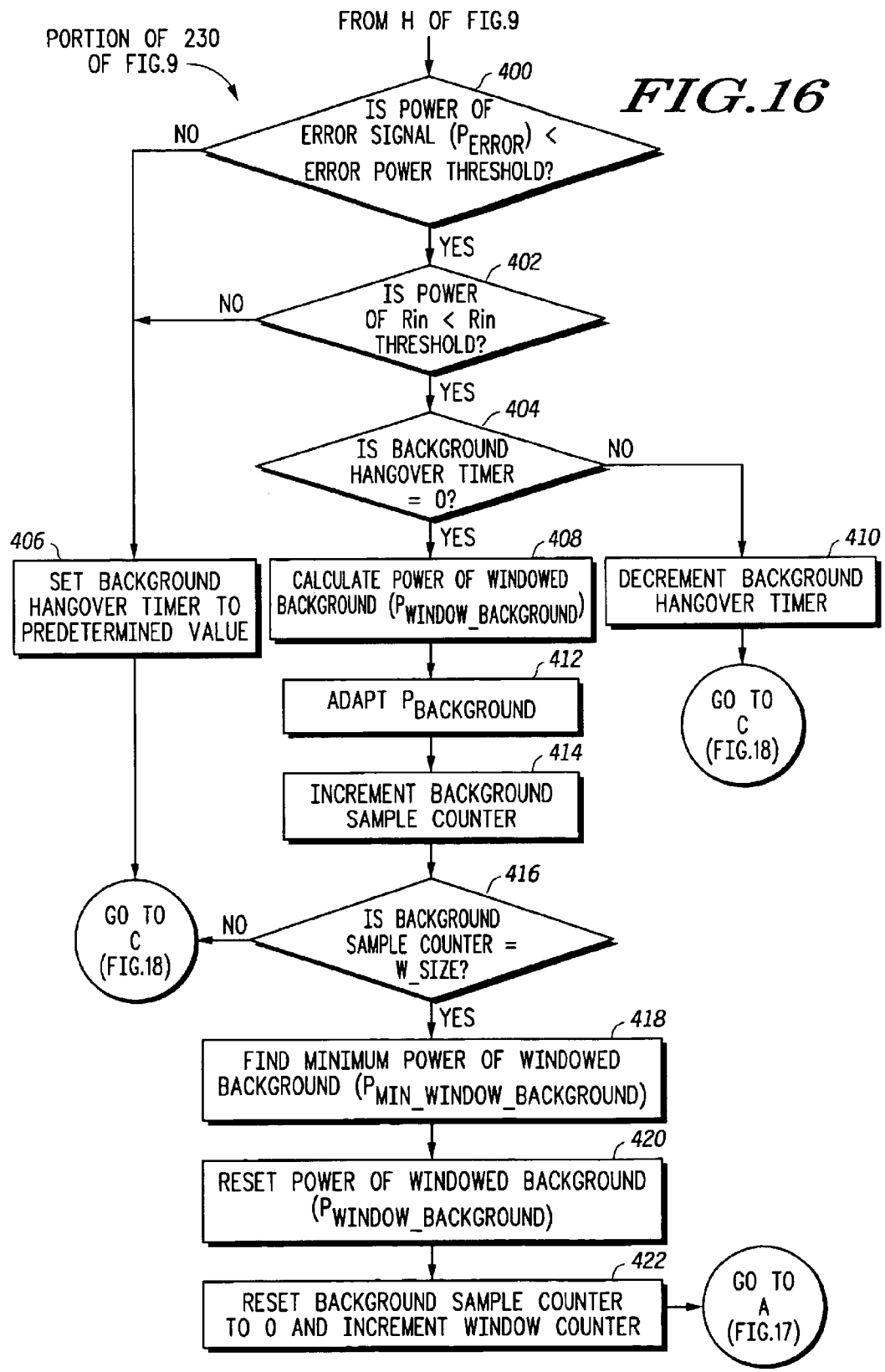
FIGS. 16–19 illustrate, in flow diagram form, operation of a nonlinear processor in the echo canceller of FIG. 2, in accordance with one embodiment of the present invention.

FIG. 16 illustrates a method for performing adaptive background level estimation in accordance with one embodiment of the present invention. In general, the level of the background noise signals can be estimated only when the following 3 conditions are met (corresponding to decision diamonds 400, 402, and 404 of FIG. 16) (1) no near-end talker signal, (2) no far-end talker signal (i.e., no residual echo) and (3) the above two conditions have been meet for a certain period of time. First, in decision diamond 400, it is determined whether the level of the near-end talker signals ($P_{error}$) are below an error power threshold. The error power threshold is defined as a threshold to determine whether the error signal is considered as the background noise signal, or near-end talker signal. In one embodiment, the error threshold is $-39$ dBm0. This check reduces the likelihood of mixing the near-end talker signals with the background noise signals, because the background energy estimation to be described below cannot include the near-end talker signals. If $P_{error}$ is less than the error threshold, flow proceeds to decision diamond 402 where the second condition is checked. In decision diamond 402, it is determined whether the level of the far-end talker signals ($P_{Rin}$) are less than an Rin threshold in order to exclude the residual echo in the background level estimation. The Rin threshold is defined as an Rin signal level significant enough to generate noticeable residual echo before the non-linear processor. In one embodiment, Rin threshold is $-27$ dBm0. If $P_{Rin}$ is less than Rin threshold, flow proceeds to decision diamond 404 where it is determined whether the first two conditions have been met for a certain time window (i.e. the background hangover time). That is, if background hangover timer=0, then the first two conditions have been met for the time window defined by background hangover time, and flow proceeds to block 408. The background hangover time is used to ensure that the far- and the near-end talker signals have been absent for a certain time window. In one embodiment, the background hangover time is 160 samples, or 20 ms, assuming a sampling rate of 8 kHz.

If $P_{error}$ is not less than the error threshold at decision diamond 400 or if $P_{Rin}$ is not less than the Rin threshold at decision diamond 402, flow proceeds to block 406 where the background hangover timer is set to a predetermined value, e.g. the background hangover time discussed in the previous paragraph. Then flow proceeds to point C. (Note that at point C, flow continues to FIG. 18, which will be described further below.) If, at decision diamond 404, the background hangover timer is not 0, then the background hangover timer is decremented in block 410 and flow proceeds to point C.

However, when the 3 conditions of decision diamonds 400, 402, and 404 are met, flow proceeds to block 408 where the background level ($P_{background}$) is adapted to a desired one determined in a later step ($P_{new\_background}$). (Note that $P_{new\_background}$ will be calculated and discussed in reference to block 426 in FIG. 17; therefore, during a first iteration through block 408, $P_{new\_background}$ may have any appropriate initial value, such as an initial value representative of a comfort noise level.) The adaptation is done for every sample to smooth the transition from one signal level to another in the comfort noise level matching. Therefore, the adaptation is performed as shown in equation 10 below.

$$P_{background}(n)=[(R-1)P_{background}(n-1)+ P_{new\_background}]/R \qquad \text{Equation 10}$$

In equation 10, $P_{background}(n)$ is the estimated background power level at time n; $P_{new\_background}$ is the new background power level to be adapted (and is determined in the fourth step); and R is a factor controlling the adaptation rate, which is set to either FAST_RATE or SLOW_RATE. (Note that R may be set in block 428 of FIG. 17, or blocks 480, 472, or 476 of FIG. 19, as will be described in more detail below. Also, note that in one embodiment, the adaptation rate for FAST_RATE is set as $2^9$ and for SLOW_RATE is set as $2^{11}$.)

After block 408, the estimation of the power level of the background noise signal begins, which includes 3 major steps. The first step in estimating the power level of the background noise signals is to calculate the background power level within a window. Therefore, flow proceeds to block 412 where the power of a windowed background ($P_{window\_background}$) is calculated as shown below in equation 11.

Equation 11:

$$P_{window\_background} = \frac{1}{w\_size} \sum_{n=0}^{w\_size-1} (\text{error signal } 46)^2$$

In equation 11, $P_{window\_background}$ is the windowed background power level estimation, error signal 46 is the difference between Sin 39 and echo estimation signal 48 at the output of adder 34 of FIG. 2, and w_size is the window size for the average. In one embodiment, w_size is 64 samples. Next, flow proceeds to block 414 where the background sample counter is incremented.

The second step includes finding the minimum $P_{window\_background}$ over a certain number of time windows, w_count. (In one embodiment, w_count is 128 samples; however, in alternate embodiments, w_count can be any value depending on the number of time windows desired for calculating the minimum $P_{window\_background}$.) Therefore, the calculation of block 418 (shown in equation 12 below) is performed once every w_size samples. For performing the second step, flow proceeds to decision diamond 416 where it is determined whether the background sample counter is w_size. If not, flow proceeds to point C (in FIG. 18). If so, flow proceeds to block 418 where the minimum power of windowed background is determined as shown in equation 12 below.

$$P_{min\_window\_background} = MIN(P_{old\_min\_window\_background}, P_{window\_background})$$
Equation 12

Therefore, $P_{min\_window\_background}$ is determined by selecting the minimum between the old minimum power (the minimum power determined during the previous iteration through block 418) and $P_{window\_background}$ determined in block 412. Flow then proceeds to block 420 where $P_{window\_background}$ is reset to zero. Flow proceeds to block 422 where the background sample counter is reset to 0 and the window counter is incremented. Flow then proceeds to point A which continues with FIG. 17 (beginning with decision diamond 424).

The third step in the adaptive background level estimation is to determine $P_{new\_background}$ for the background level adaptation discussed in reference to block 408 and to determine the adaptation rate used in block 408. There are two different approaches depending upon whether it is the first time to determine $P_{new\_background}$. Therefore, in decision diamond 424 it is determined whether this is the initial estimation (indicating no long-term data is available, such as at the beginning of a call). If so, flow proceeds to block 426 where $P_{new\_background}$ is set to the $P_{window\_background}$ calculated in the first step. Flow then proceeds to block 428 where the adaptation rate R is set to FAST_RATE. However, if at decision diamond 424 it is determined that this is not the initial estimation (indicating that $P_{new\_background}$ is already available because long term data, e.g. N previous samples, is available), flow proceeds to decision diamond 430. Note that if it is not the initial estimation, the process of determining $P_{new\_background}$ is done once every w_count windows. Therefore, at decision diamond 430, it is determined whether the window counter has reached w_count. If not, flow proceeds to point C (in FIG. 18). However, if so, flow proceeds to block 432 where is $P_{new\_background}$ calculated. Flow then proceeds to block 434 where the adaptation rate R is determined. (The details of the determinations of $P_{new\_background}$ and R will be described further in reference to FIG. 19). Flow proceeds to block 436 where the window counter is reset to 0 and then to block 438 where $P_{min\_window\_background}$ is reset to 0. Flow then proceeds to point C.

Figure 19:
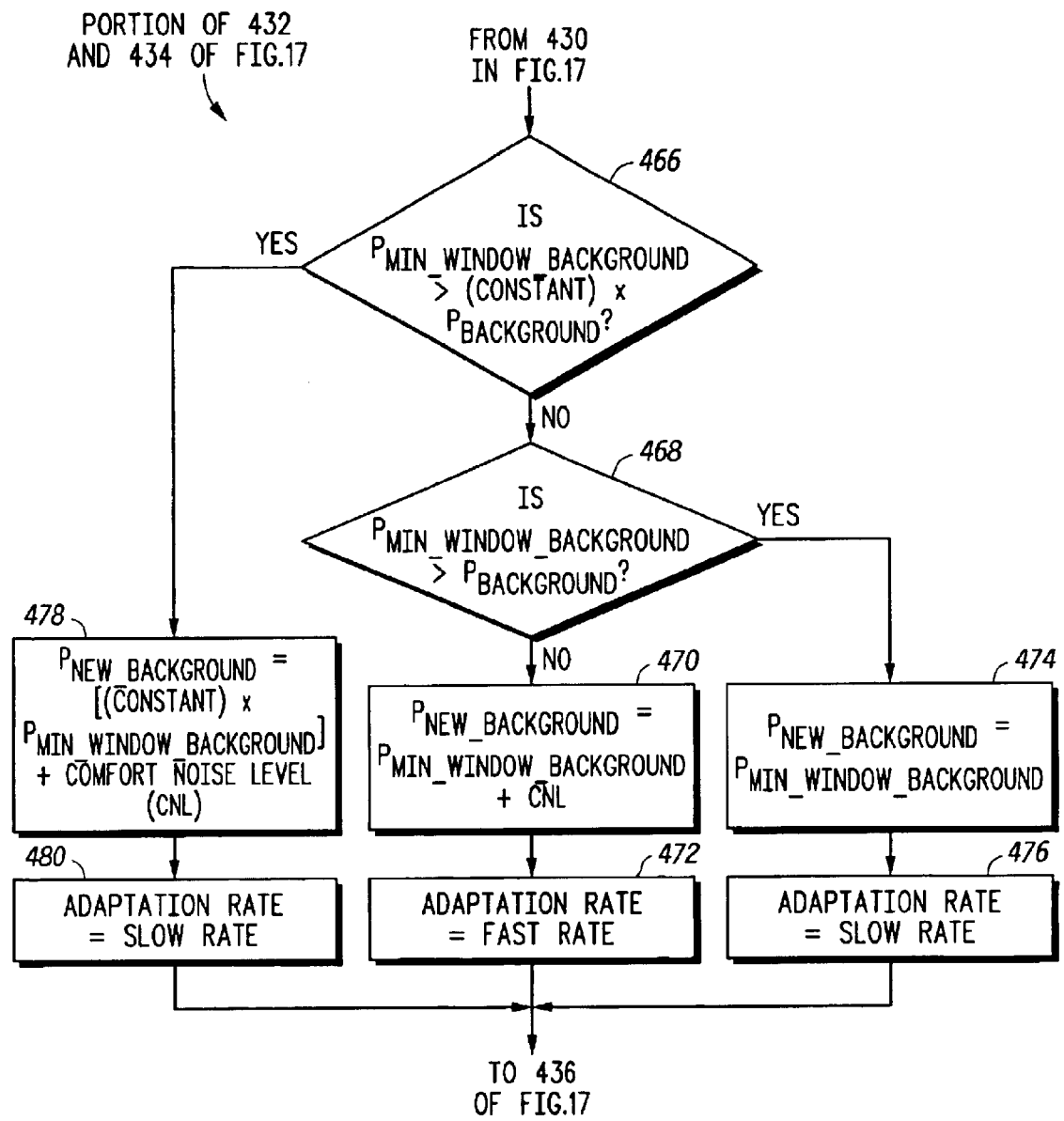

FIG. 19 illustrates the method for determining $P_{new\_background}$ and R when $P_{new\_background}$ is available. The method of FIG. 19 avoids $P_{new\_background}$ having a large jump from a lower level to a higher level but places no such constrain when the change is from a higher level to a lower level since this change is faster. Therefore, in one embodiment $P_{new\_background}$ is capped to be no more than two times $P_{background}$. The method of FIG. 19 also sets a faster adaptation rate (FAST_RATE) if the adaptation is from a higher level to a lower level, and sets a slower rate (SLOW_RATE) if the adaptation is from a lower level to a higher level. The different rates are used because in terms of background noise levels, it generally sounds better to have a slow change from low to high, but a rather fast change from high to low.

Figure 17:
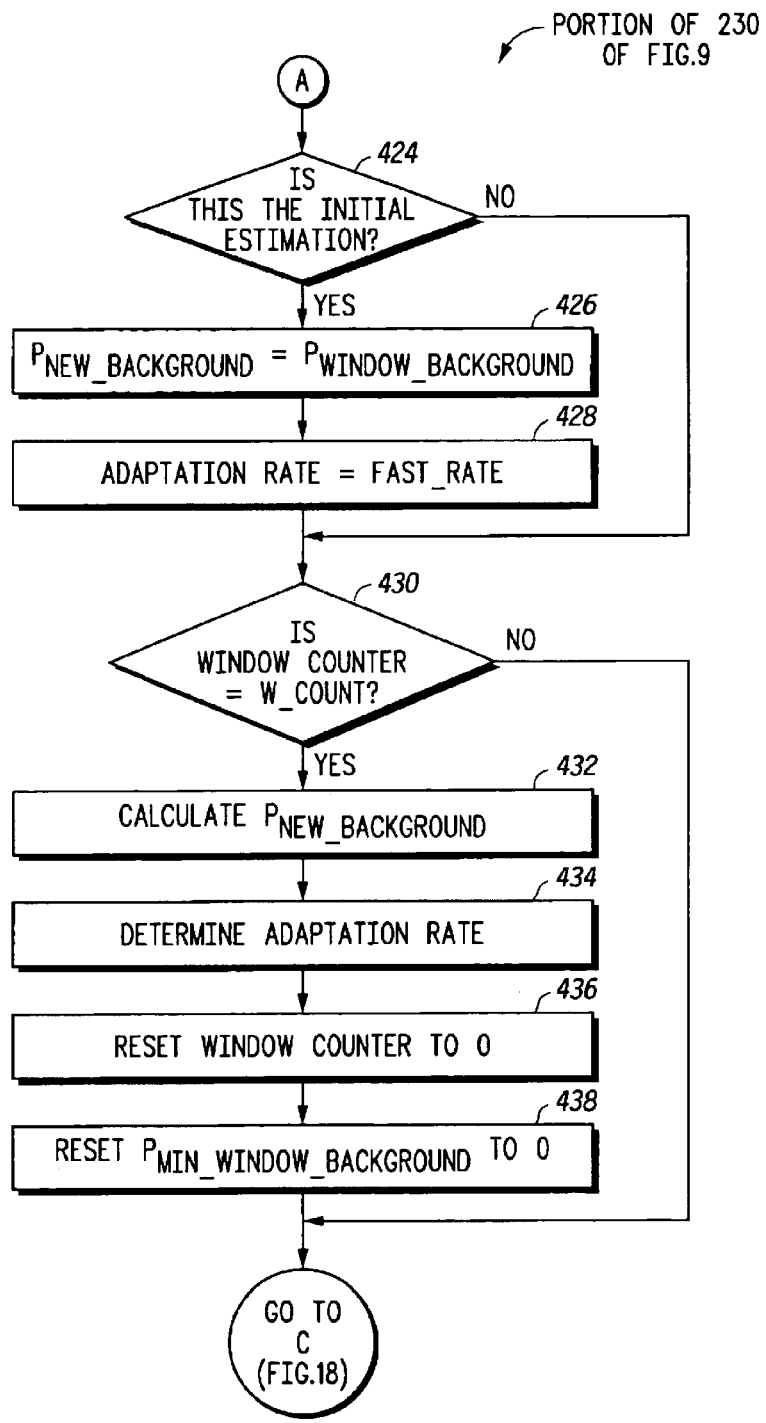

In FIG. 19, which illustrates a portion of blocks 432 and 434 of FIG. 17, flow begins with decision diamond 466 where it is determined whether $P_{min\_window\_background}$ is greater than a constant times $P_{background}$, i.e. whether "$P_{min\_window\_background} > constant * P_{background}$," where, in one embodiment, the constant is 0.5. If so, flow proceeds to block 478 where $P_{new\_background}$ is set to "(constant* $P_{min\_window\_background}$)+comfort noise level". In one embodiment, the constant in block 478 is 2 (where this 2 corresponds to the 0.5 of the previous sentence). Flow proceeds to block 480 where the adaptation rate is set to SLOW_RATE. Flow then proceeds to block 436 of FIG. 17.

If at decision diamond 466, $P_{min\_window\_background}$ is not greater than "constant* $P_{background}$," then flow proceeds to decision diamond 468 where it is determined whether $P_{min\_window\_background}$ is greater than $P_{background}$. If so, flow proceeds to block 474 where $P_{new\_background}$ is set to $P_{min\_window\_background}$. Flow then proceeds to block 476 where the adaptation rate R is set to SLOW_RATE. Flow then proceeds to block 436 of FIG. 17. However, if at decision diamond 468 it is determined that $P_{min\_window\_background}$ is not greater than $P_{background}$, then flow proceeds to block 470 where $P_{new\_background}$ is set to "$P_{min\_window\_background}$+comfort noise level". Flow then proceeds to block 472 where the adaptation rate R is set to FAST_RATE and then to block 436 of FIG. 17.

Therefore, note that comfort noise level (CNL) is added (in blocks 478 and 470) in order to prevent $P_{new\_background}$ from being silent, when $P_{background}$ or $P_{min\_window\_background}$ happens to be 0. For example, in one embodiment, CNL is set to −66 dBm0. Alternatively, CNL can be in a range of −60 to −72 dBm0. Also, although the flow of FIG. 19 was performed using power level estimations, the same flow can be accomplished using magnitude estimations.

Figure 18:
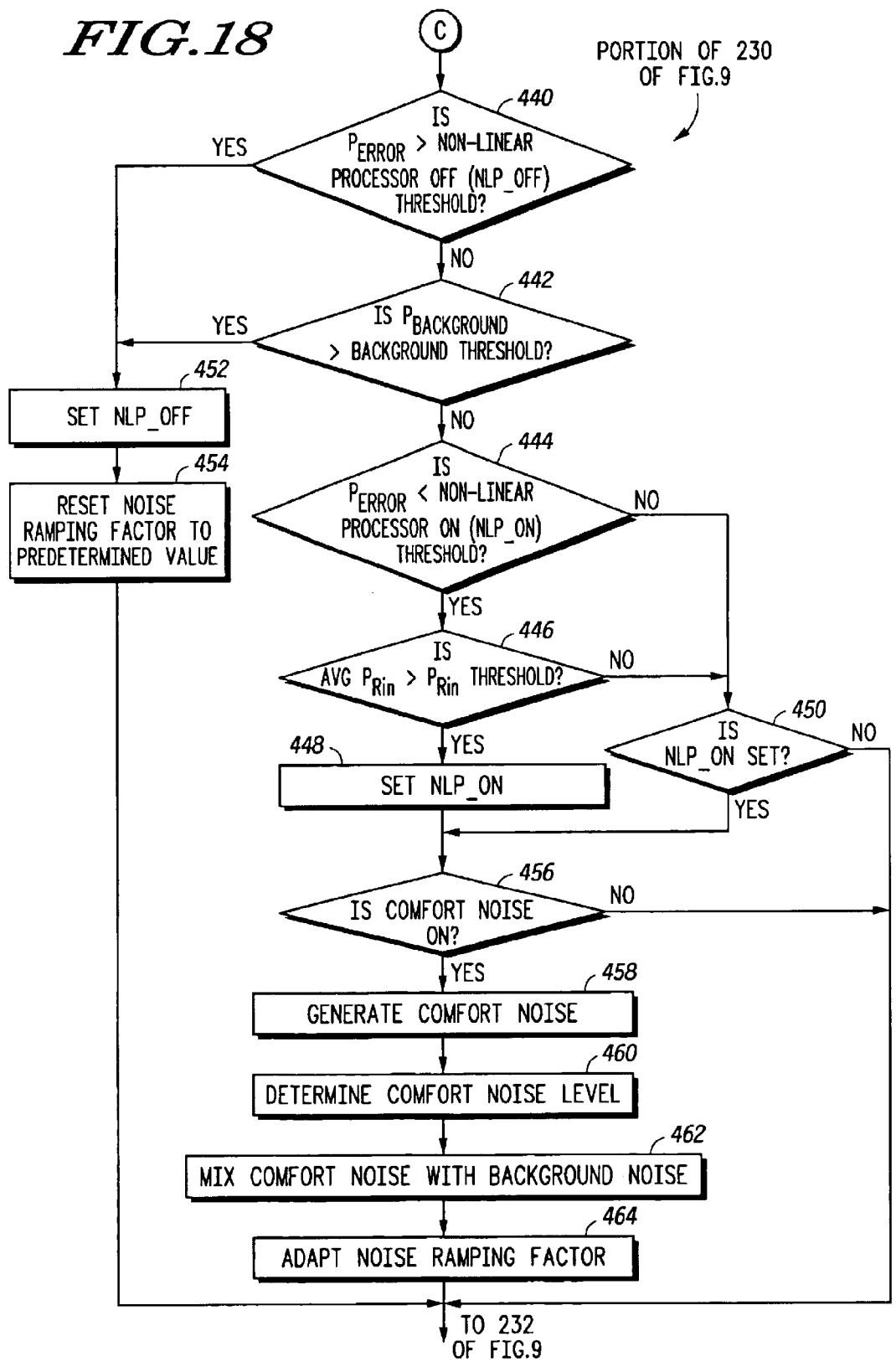

FIG. 18 illustrates a method of nonlinear processor control using all the level estimations obtained above, in accordance with one embodiment of the present invention. That is, FIG. 18 illustrates a portion of block 230 of FIG. 9 where nonlinear processing is performed. In FIG. 18, flow begins at points C (which can be reached, for example, from block 406, block 410, or decision diamond 416 of FIG. 16, or from block 438 in FIG. 17). From point C, flow continues to decision diamond 440 where it is determined whether $P_{error}$ is greater than the nonlinear processor off (NLP_OFF) threshold. If so, flow proceeds to block 452 where NLP_OFF is set (indicating that nonlinear processor 32 is turned off) and then to block 454 where the noise ramping factor is reset to a predetermined value. The noise ramping factor is used to smoothen the signal level transition from low to high. (After block 454, flow proceeds to block 232 of FIG. 9.) If, at decision diamond 440, it is determined that $P_{error}$ is not greater than the NLP_OFF threshold, flow proceeds to decision diamond 442 where it is determined whether $P_{background}$ is greater than a background threshold. If so, flow proceeds to block 452 where nonlinear processor 32 is turned off and then to block 454. Therefore, nonlinear processor 32 is turned off when $P_{error}$ is greater than the NLP_OFF threshold or when $P_{background}$ is greater than the background threshold. In one embodiment, the NLP_OFF threshold is set as −27 dBm0 and the background threshold as −39 dBm0.

If it is determined at decision diamond 442 that $P_{background}$ is not greater than the background threshold, flow proceeds to decision diamond 444 where it is determined whether $P_{error}$ is less than a nonlinear processor on (NLP_ON) threshold. If so, flow proceeds to decision diamond 446 where it is determined whether AVG $P_{Rin}$ is greater than a $P_{Rin}$ threshold. If so, then flow proceeds to block 448 where NLP_ON is set (indicating that nonlinear processor 32 is turned on). Therefore, nonlinear processor 32 is turned on when $P_{error}$ is less than the NLP_ON threshold and AVG $P_{Rin}$ is greater than the $P_{Rin}$ threshold. The condition of AVG $P_{Rin}$ being greater than the $P_{Rin}$ threshold ensures that nonlinear processor 32 is turned on only when necessary (because noticeable echo can only be the case when the far-end talker signals are relatively strong). On the other hand, the condition of $P_{error}$ being less than the NLP_ON threshold further ensures that the residual echo has to be small and that the near-end talker signals are not mistakenly considered as residual echo to be removed. Therefore, in one embodiment, the $P_{Rin}$ threshold is set to −36 dBm0 and the NLP_ON threshold to −42 dBm0. However, in alternate embodiments, they can be set to any appropriate value.

Note that in the embodiment described above, the different between the NLP_OFF threshold and the NLP_ON threshold (which, in one embodiment, is −15 dBm0) is a "dead zone" for nonlinear processor 32 that helps to avoid rapid switching between NLP_ON and NLP_OFF.

If it is determined that $P_{error}$ is not less than the NLP_ON threshold (at decision diamond 444) or the AVG $P_{Rin}$ is not greater than the $P_{Rin}$ threshold (at decision diamond 446), flow proceeds to decision diamond 450 where it is determined whether NLP_ON is set (i.e. whether nonlinear processor 32 is on). If NLP_ON is not set, flow proceeds to block 232 of FIG. 9; however, if it is set (or after exiting block 448), flow proceeds to decision diamond 456 where it is determined whether comfort noise is on. If not, flow proceeds to block 232 of FIG. 9; however, if it is on, flow proceeds to block 458 where comfort noise is generated. After block 458, flow proceeds to block 460 where the comfort noise level is determined, and then to block 462 where the comfort noise is mixed with the background noise. Flow then proceeds to block 464 where the noise ramping factor is adapted and then to block 232 of FIG. 9.

Therefore, comfort noise signals will be generated when nonlinear processor 32 is on. White noise is generally not a preferred choice for the comfort noise because it is spectrally far from the true background noise signals of everyday life. Some embodiments of the present invention therefore use pink noise, brown noise, or Hoth noise as comfort noise. For example, in one embodiment, pink noise is chosen because of its low complexity in terms of computations. A pink-like noise is generated (e.g. in block 458) by using two consecutive realizations of uniformly distributed pseudo-random variable X as shown in equation 13 below.

$$Y_{pink}(n)=C_1*X(n)+C_2*X(n-1) \qquad \text{Equation 13}$$

In equation 13 above, X(n) is the pseudo-random variable (−1≦X(n)<1) generated at time n, $C_1$ and $C_2$ are constants for modifying the mixture of the two random samples and the magnitude of $Y_{pink}$. $Y_{pink}(n)$ is therefore the pink-like noise sample being generated at time n. The two constants $C_1$ and $C_2$ are chosen to ensure that the average power level of the pink noise signals is about 2 dB lower than $P_{background}$. For example, in one embodiment, $C_1$ and $C_2$ are chosen as 0.75 and 1, respectively. Therefore, in one embodiment, the comfort noise matching levels range from 0 to 4 dB than the estimated background noise levels.

The generated comfort noise, $Y_{pink}$ in this embodiment, is then mixed with the background noise as shown in equation 14 below (see also block 462 of FIG. 18).

$$Sout(n)=\alpha(n)*(\text{error signal } 46)-(1-\alpha(n))*A*Y_{pink}(n) \qquad \text{Equation 14}$$

In equation 14 above, A is the magnitude of the background noise level to be matched (corresponding to block 460). For example, in one embodiment, A=square root of ($P_{background}$). In alternate embodiments, A=$P_{background}$, if $P_{background}$ is represented in magnitude, rather than power. In equation 14, α(n) is a noise ramping factor (where 0≦α<1) at time n which allows for a smooth transition from one level to another at the onset of nonlinear processor 32, and Sout(n) is the final output of nonlinear processor 32 at time n (i.e. Sout(n) is Sout 42 of FIG. 2). The noise ramping factor (adapted in block 464) is calculated per sample as shown in equation 15.

$$\alpha(n)=b*\alpha(n-1) \qquad \text{Equation 15}$$

In equation 15, b is the ramping constant which is chosen to be less than 1. In one embodiment is approximately 0.9986 which approximately attenuates to its half in 500 ms, because $0.9986^{500}$=0.496. During this ramping process, Sout(n) starts from error signal 46 (which is Sin 39−error estimation signal 48 of FIG. 2) and gradually switches to $A*Y_{pink}(n)$, as α(n) changes from 1 to 0, if the ramping process continues. The ramping can be applied on both the onset and offset of nonlinear processor 32. However, in one embodiment, the ramping only applies to the onset of nonlinear processor 32. The reason is that when nonlinear processor 32 is turned off, it normally detects a significant level of the near-end talker signals, and gradual switching back from the comfort noise (pink noise signals, in one embodiment) to the near-end talker signal may not be desirable. However, alternate embodiments may apply this ramping when nonlinear processor 32 is turned both on and off.

FIG. 7 illustrates a portion of monitor and control unit 30 which functions to estimate the pure delay. The pure delay estimation is intended for reducing the number of taps of adaptive filter 28 and thus gaining faster and deeper convergence with smaller computational effort, as was discussed above. That is, the portion of monitor and control unit 30 illustrated in FIG. 7 and the flow diagrams of FIGS. 20–24 may be used to detect pure delay and position a sparse window (block 211 of FIG. 9). In one embodiment, pure delay is detected, and a filtering window with proper size (sparse window) is positioned such that the length (i.e. number of taps) for adaptive filter 28 is reduced. Therefore, FIG. 7 will be discussed in reference to the flows of FIGS. 20–24.

FIGS. 7 and 20–24 provide one embodiment used to achieve an estimation of the pure delay (i.e. T1 of FIG. 37) of echo signals for dynamic positioning of a sparse window in echo canceller 20. The pure delay estimation, as will be described in more detail below, is performed to reduce the computational cost associated with covering large echo path delay spans by replacing a full-window adaptive filter with a properly positioned narrow-window adaptive filter. That is, rather than using a full-window adaptive filter covering the entire impulse response of FIG. 37, large enough to cover both T1 and T4+T2, a smaller window may be used (a sparse window) which excludes the pure delay portion and is positioned in order to capture T4+T2, the part during which significant responses occur. Also, the pure delay estimation increases the convergence speed and depth of adaptive filter 28 through the use of a shorter length adaptive filter. Also, the pure delay estimation may be used to monitor dynamically changing pure delay of the echo (e.g. during a phone call) and to adjust the adaptive filter window (e.g. sparse window) accordingly.

The embodiments that will be described herein may include a passive approach (e.g. sub-rate filter adaptation using the speech signal only) as well as an active approach (e.g. injecting a short, narrow-band very low level noise pulse at the beginning of the call and concurrently performing sub-rate adaptation in order to establish pure delay for calls which begin with silence on both directions, where generally, a silence lasting 300 ms is long enough to inject a low-level probing signal and determine pure delay). The embodiments to be described herein also include two scenarios for handling the pure delay. The first scenario relates to the beginning of a telephone call, where Quality of Service (QoS) principles require immediate reduction of echo. The second scenario relates to changes of the echo path in the middle of the telephone call. Typically, the sparse window (and the associated the pure delay) does not vary throughout the duration of a telephone call. However, on some calls (particularly those where, for example, 'call forward' or 'conference call' features are activated) the pure delay may change considerably. Therefore, various embodiments discussed herein support dynamics of the pure delay corresponding to up to one variation of the sparse window per second. Note that the embodiments discuss herein may use proprietary (i.e., non-standard) signaling provided via control signals 17 to determine whether a telephone is on or off hook in order to determine the beginning or end of a call.

The embodiments of FIG. 7 and FIGS. 20–24 may use a sub-rate adaptation process which allows for a computationally efficient estimation of pure delay. However, alternate embodiments may not use a sub-rate process. Also, in one embodiment, in order to deal with inherently variable estimations of pure delay, raw measurement results of pure delay may be nonlinearly filtered (i.e. processed using a decision or qualification process, an example of which will be described in reference to FIG. 23) before they are returned to adaptive filter 28. The sub-rate process mentioned above may use an NLMS (Normalized Least Mean Square) adaptive filter (for adaptive filter 122 of FIG. 7). However, adaptive filter 122 is not limited to this type of adaptive filtering. For example, PNLMS, RLS, or other adaptive filters may be used. Note that the NLMS adaptive filtering algorithm is generally simple and has acceptable convergence characteristics. Other adaptive filter algorithms are computationally more demanding. PNLMS (Proportionate Normalized LMS) algorithm offers a tangible improvement of the convergence properties at a moderate computational cost. RLS (Recursive Least Squares) adaptive algorithm is generally significantly faster (yet computational cost is also significantly greater). However, it is sensitive to numerical errors and manifests numerical instability. Other adaptive filters (such as subband, affine and their variants) may be more attractive from the viewpoint of convergence properties; in comparison with the NLMS, they are computationally more demanding though. However, the embodiments discussed herein are not limited to the use of the NLMS adaptive filtering. Both main rate adaptive filter as well as the sub-rate adaptive filter could be based on other types of adaptive filtering solutions.

The pure delay estimation may be controlled by such mechanisms as short-term sub-rate signal power estimation and sub-rate near-end talker signal detection in order to prevent generating measurements which could be inherently unreliable (as affected by either noise or near-end talk) and thus possibly causing the divergence of the sub-rate adaptive filter 122. Note that as discussed above with reference to adaptive filter 28 where the adaptation process is stopped upon the detection of Sgen in order to avoid developing false coefficients, the same principle may apply to adaptive filter 122 used in determining pure delay.

In addition to shortening the adaptive filter length, the estimation of pure delay may be used to address other situations, such as, for example, when a far-end echo canceller is turned off, when calls are switched from local to long distance (such as via a call forward feature, call transfer feature, etc.), when conference call operations are with calling/called parties dispersed over large geographical regions, etc.

FIG. 7 illustrates in block diagram form, a portion of monitor and control unit 30 used for providing estimated delay 130. Adaptive filter 122 (which, in one embodiment utilizing sub-rate processing, is a sub-rate adaptive filter) provides a short-term estimate of the band-pass impulse response on a continuous basis, through the duration of a telephone call. The pure delay measurements of the impulse response are continuously filtered using a qualification process or decision block (e.g. FIG. 23), which, as discussed above, may be a nonlinear filter. This filter allows for fast determination of the pure delay at the beginning of the call and allows for adjustment of pure delay or new pure delay selection in the middle of the call provided the new pure delay value passes criteria related to validation of the new value. That is, to minimize occurrences of echo, switching from one pure delay to another in the middle of a call may be predicated upon adequate verification of the pure delay measurement. In one embodiment, the verification provides a conservative mechanism for changing the pure delay in the middle of a call (such as by analyzing three or more measurement results of the position of the sub-rate impulse response maximum value).

In an optional version, as will be discussed in reference to FIG. 24, echo canceller 20 may operate in a monitoring mode. In this mode, the system of FIG. 7 is active (i.e. pure delay is estimated) only at the beginning of the telephone call, and then, if certain conditions are met, it enters into a dormant state. During the dormant state, an ERLE estimator continuously checks the ERLE corresponding to adaptive filter 28 against a threshold and if the ERLE drops below the threshold and remains there for a predetermined duration, the system of FIG. 7 returns to the active mode and continues to estimate the pure delay.

Figure 20:
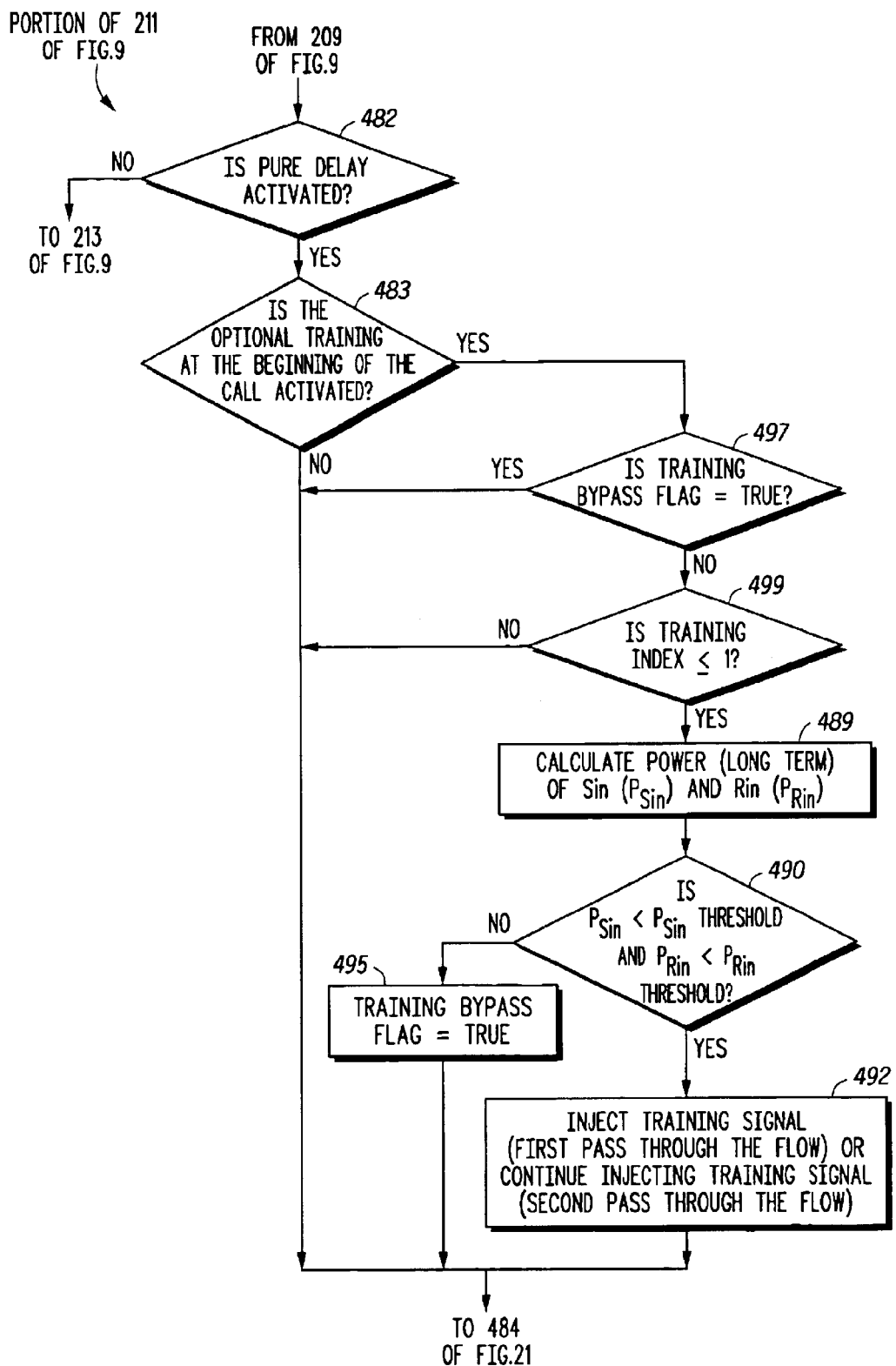
FIGS. 20–24 illustrate, in flow diagram form, estimation of pure delay and the position of a sparse window, in accordance with one embodiment of the present invention.

The flow of FIG. 20 begins with decision diamond 482 where it is determined whether a pure delay estimation option is activated. Note that this option may correspond to a setting that is programmed into echo canceller 20. In this case, determining whether the option is activated need not be done on a per sample basis as illustrated in FIG. 20. In alternate embodiments, the determination of decision diamond 482 can be done at the beginning of a phone call. However, only if the pure delay estimation option is activated does flow proceed to decision diamond 483. If it is not activated (whether determined at the beginning of the call or on a per sample basis), flow proceeds to block 213 of FIG. 9 since pure delay estimation is not to be performed.

Figure 21:
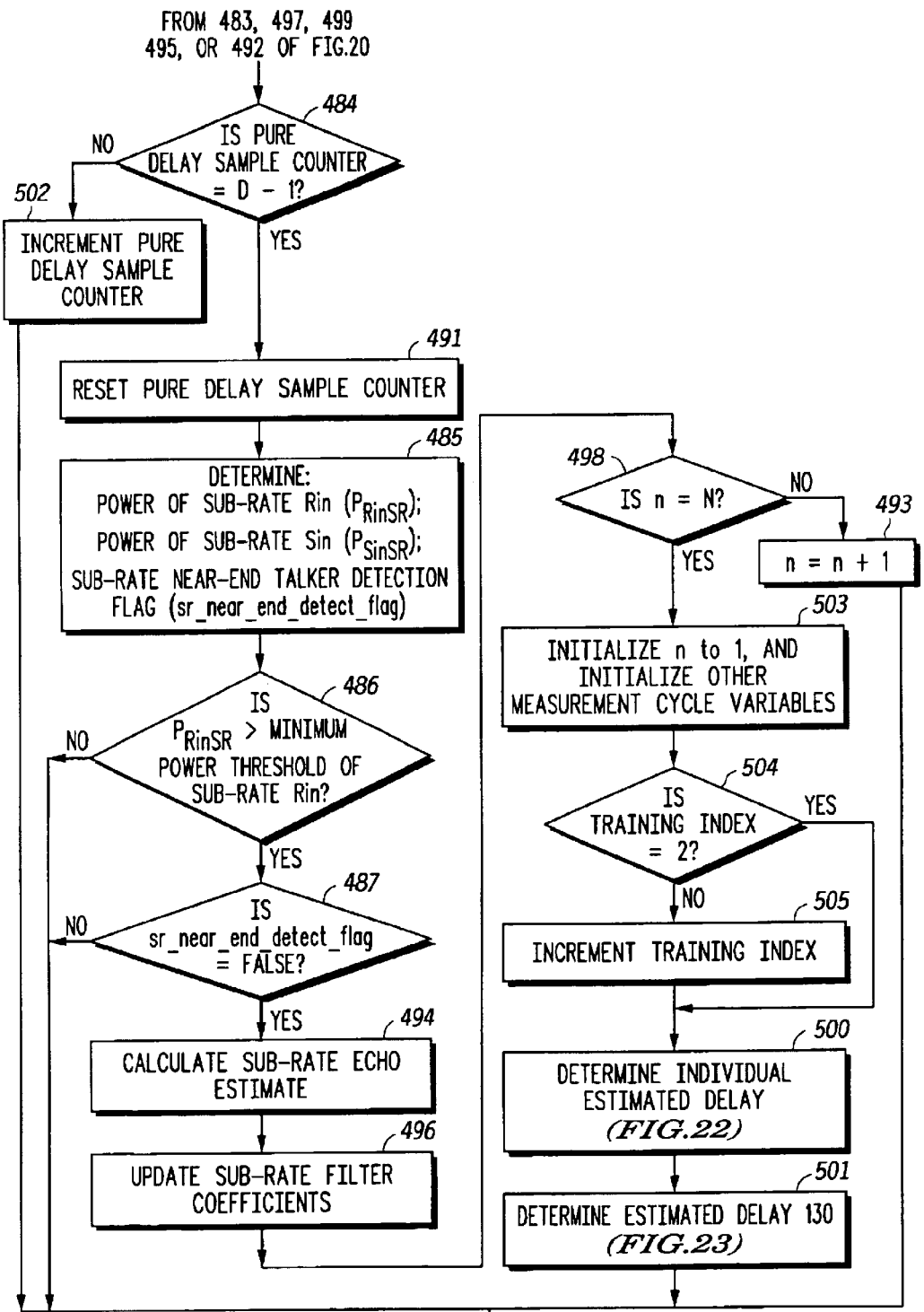

Decision diamond 483 determines whether the optional training at the beginning of the call is activated. As with the pure delay estimation option, the training option can also be programmed into echo canceller 20 and thus checked at the beginning of a phone call rather than at each sample as illustrated in FIG. 20. If optional training is not activated, flow proceeds to decision diamond 484 of FIG. 21. However, if the optional training is activated, flow proceeds to decision diamond 497. In summary, if the optional training is not activated, the flow of FIG. 20 is not necessary. Similarly, if the pure delay estimation option is not activated, then the flow of FIGS. 20 and 21 are not necessary. Therefore, echo canceller 20 may operate in a variety of different ways, depending on the settings and options chosen.

Also note that at the beginning of each phone call, many variables may be initialized for use in the flows of FIGS. 20–24. For example, in one embodiment, training bypass flag is set to FALSE, pure delay sample counter is reset, training index is reset, and ERLE counter is reset. These variables will be described throughout the flow of FIGS. 20–24. Also, some values may be programmed or hardwired within echo canceller 20. For example, the measurement cycle, N, may be initialized at the start of each call to a particular value or may be hardwired within echo canceller 20. Note that other variables described throughout this description may be initialized at the start of a call or hardwired or programmed (permanently or not) in echo canceller 20.

If, at decision diamond 483 it is determined that the optional training at the beginning of the call is activated, flow proceeds to decision diamond 497. The optional training allows for a pure delay to be estimated at the beginning of a call. Since, at the very beginning of a call, there is generally no talking yet, a training signal can be injected into Rin 43 to produce Rout 40 (see training signal 41 of FIG. 2 which may be injected into Rin 43 via adder 36). That is, in the absence of adequate Rin 43 energy, it is not possible to determine the pure delay; therefore, an injection of training signal 41 can be used to determine a pure delay estimate. Generally, training signal 41 is a short burst of relatively low energy that is injected at the beginning of a phone call, prior to a conversation. That is, training signal 41 is generally less than an injection threshold, which, in one embodiment, is in the range of −30 dBm0 to −55 dBm0. Therefore, if the optional training is activated, flow proceeds to decision diamond 497 where it is determined whether the training bypass flag is TRUE. If so, flow proceeds to decision diamond 484 of FIG. 21, bypassing the training all together and continuing with the pure delay estimation of FIG. 21, as will be described below.

If, at decision diamond 497, it is determined that the training bypass flag is not set to TRUE, flow proceeds to decision diamond 499 where it is determined whether the training index is less than or equal to 2. The training index ensures that the training signal, if used, is injected only at the beginning of the call. As was mentioned above, the training index may be reset at the beginning of a call, and therefore, upon reaching decision diamond 499 for the first time, the training index should be less than or equal to 1 (since it is originally reset to zero). As will be discussed below, though, after a first measurement cycle (which, in one embodiment, is 300 milliseconds), the training index will be incremented to one (e.g. in block 505 of FIG. 21). This still allows for an injection of a training signal because the training index is still less than or equal to one. However, after a subsequent measurement cycle, the training index will be incremented to two (e.g. in block 505 of FIG. 21), and from this point on, at decision diamond 499, flow will proceed to decision diamond 484 of FIG. 21 without the possibility of injecting training signal 41 anymore because a training index of 2 indicates that it is no longer considered the beginning of the call. It is generally undesirable to inject a training signal at another time other than the beginning of the call because it may be audible to the parties on the call.

If, at decision diamond, training index is less than or equal to one, then flow proceeds to block 489, which indicates that it is still considered the beginning of the call. In block 489, the long term power of Sin ($P_{Sin}$) and Rin ($P_{Rin}$) are calculated (which may be done using equations 1, 3, and 4 discussed above). Flow then proceeds to decision diamond 490 where it is determined whether $P_{Sin}$ is less than a $P_{Sin}$ threshold and $P_{Rin}$ is less than a $P_{Rin}$ threshold. The first check (whether $P_{Sin}$ is less than the $P_{Sin}$ threshold) ensures that there is no near end talker signal, Sgen. In one embodiment, this $P_{Sin}$ threshold is −50 dBm0. The second check (whether $P_{Rin}$ is less than a $P_{Rin}$ threshold) ensures that a far-end talker signal is not present. In one embodiment, this $P_{Rin}$ threshold is −50 dBm0. If both conditions are met, then flow proceeds to block 492 indicating that a conversation has not yet started and a training signal can be injected. Therefore, in block 492, a training signal is injected (e.g. training signal 41 of FIG. 2) or continued to be injected if this is the second pass through block 492. However, if at decision diamond 490, both conditions are not met, then flow proceeds to block 495 where the training signal flag is set to TRUE. That is, once $P_{Sin}$ or $P_{Rin}$ surpass their respective thresholds, training is bypassed (at decision diamond 497) regardless of the training index, thus preventing a training signal from being injected during the current call. After blocks 495 and 492, flow proceeds to decision diamond 484 of FIG. 21.

FIG. 21 illustrates one embodiment of performing a pure delay estimation. The flow of FIG. 21 uses sub-rate processing, such that the flow is only entered every D samples, where D corresponds to decimators 106 and 110 of FIG. 7. For example, in one embodiment, D is 8 where only every $8^{th}$ sample of Rin 44 and Sin 38 is processed. However, in alternate embodiments, D can be any value (including 1, which indicates that sub-rate processing is not used because every sample is processed). Therefore, every D-th sample is considered a sub-rate sample. A pure delay sample counter is used to keep track of the incoming samples of Rin 44 and Sin 38 in order to capture every D-th sample. Generally, the pure delay sample counter is incremented after each sample, and reset every D-th sample. The pure delay sample counter can also be reset at the beginning of each phone call, as mentioned above. Also, the delay sample counter may be shared with sample counters of other flows discussed herein, or may be a specific counter used only for estimating the pure delay.

At decision diamond 484, it is determined whether the pure delay sample counter is equal to D−1. Note that in the embodiment where the pure delay sample counter is reset (i.e. set to zero), reaching D−1 corresponds to reaching the D-th sample. However, in alternate embodiments, the pure delay sample counter may be initialized to 1 and would be checked against D rather than D−1. Also, other embodiments may initialize the pure delay sample counter to D or D−1 and decrement until 1 or 0 is reached, respectively. Therefore, various embodiments of a decimation filter and decimator may be used for decimation filters 104 and 108 and decimators 106 and 110 of FIG. 7. Note also that the output of decimator 106 are sub-rate samples of Rin 44, which may be referred to as RinSR, and the output of decimator 110 are sub-rate samples of Sin 38, which may be referred to as SinSR.

At decision diamond 484, if it is determined that the pure delay sample counter has not yet reached D−1, then flow proceeds to block 502 where the pure delay sample counter is incremented by one, and flow proceeds to block 213 of FIG. 9. However, if the pure delay sample counter has reached D−1, flow proceeds from decision diamond 484 to block 491 indicating that a sub-rate sample has been reached. In block 491 the pure delay sample counter is reset in order to detect the next sub-rate sample as was described above.

Flow proceeds to block 485 where the power of sub-rate Rin ($P_{RinSR}$), the power of sub-rate Sin ($P_{SinSR}$), and the sub-rate near-end talker detection flag (sr_near_end_detect_flag) are determined. For example, the following equations may be used to determine $P_{RinSR}$, $P_{SinSR}$, and $P_{errorSR}(k)$:

$$P_{RinSR}(k)=(1-\alpha)\cdot P_{RinSR}(k-1)+\alpha\cdot RinSR^2(k); \qquad \text{Equation 16}$$

$$P_{SinSR}(k)=(1-\alpha)\cdot P_{SinSR}(k-1)+\alpha\cdot SinSR^2(k); \qquad \text{Equation 17}$$

$$P_{errorSR}(k)=(1-\alpha)\cdot P_{errorSR}(k-1)+\alpha\cdot errorSR^2(k); \qquad \text{Equation 18}$$

Note that in the above equations (equations 16–18), k is the signal sub-rate sample number such that, for example, SinSR(k)=Sin(k·D). Equation 18 corresponds to the sub-rate error, errorSR, which corresponds to the difference between SinSR and a sub-rate echo estimate, y(k), which is determined by sub-rate adaptive filter 122 of FIG. 7, and will be described below in reference to block 494. Therefore, errorSR(k) and $P_{errorSR}(k)$ will be described in more detail below. Also, in one embodiment of the above equations, α is set to 1/280 which corresponds to statistics of human speech as observed in a telephony channel; note that 1/280 corresponds also to approximately a 70 millisecond sliding window averaging in terms of filter bandwidth. However, alternate embodiments may use different values of alpha. (Note that the sub-rate power calculations above can be calculated by power estimator 120 and power estimator 118 of FIG. 7.)

The determination of the sr_near_end_detect_flag may be done analogously to the near-end signal detection described above with respect to FIG. 11. Therefore, the minimum of $P_{errorSR}(k)$ and $P_{SinSR}(k)$ is compared against an NESD sub-rate threshold (NESD_SR_threshold) to determine whether a near-end talker signal (Sgen) is present. (Note that this may be performed by near-end signal detector 114 of FIG. 7.) If so, the sr_near_end_detect_flag is determined to be true and is set to TRUE. This flag is used to bypass the update of filter coefficients of sub-rate filter 122 because if a near-end talker signal is present, as was described above, Sin 38 is no longer representative of the pure residual echo but instead is a mixture of both Sgen and the residual echo. Therefore, as discussed above with reference to adaptive filter 28, sub-rate adaptive filter 122 should adapt only when SinSR includes only the sub-rate echo (i.e. when a near-end talker signal is not present). Also, as discussed above with reference to adaptive filter 28, sub-rate adaptive filter 122 should adapt when $P_{RinSR}$ is sufficiently high to prevent adaptation to channel noise.

Note that as above with reference to adaptive filter 28, a near-end talker signal can be detected during both a single talk and a double talk situation. That is, using the above algorithm, Sgen can be detected when only a near-end talker is present or when both a near-end and a far-end talker are present. Also note that alternate embodiments may use other methods for determining if a near-end talker signal is present. For example, one embodiment may use a Geigel algorithm, which is known in the art to detect a near-end talker signal.

After block 485, flow proceeds to decision diamond 486 where it is determined whether $P_{RinSR}$ is greater than a minimum power threshold of sub-rate Rin. If not, then flow proceeds to block 213 of FIG. 9, bypassing the updating of sub-rate adaptive filter 122. As mentioned above, this prevents sub-rate adaptive filter 122 from adapting to channel noise. In one embodiment the minimum power threshold of sub-rate Rin is set to −45 dBm0. If the minimum threshold is met, flow proceeds to decision diamond 487 where it is determined whether the sr_near_end_detect_flag is FALSE. If minimum threshold is not met, then flow proceeds to block 213 of FIG. 9, bypassing the updating of sub-rate adaptive filter 122 due to the presence of a near-end talker signal, as discussed in the previous paragraph. If the sr_near_end_detect_flag is FALSE, flow proceeds to block 494, which indicates that $P_{RinSR}$ is sufficient and no near-end talker signal is present.

In block 494, the sub-rate echo estimate, y(k), is calculated, and then in block 496, the coefficients of sub-rate adaptive filter 122 are updated. In one embodiment, a modified NLMS algorithm (modified for use in a sub-rate process) may be used to calculate y(k) and update the coefficients.

$$y(k)=X^T(k)\cdot H(k) \quad \text{Equation 19}$$

Equation 19 above represents FIR filtering of the input signal X where $X(k)=[x(k), x(k-1), \ldots, x(k-N+1)]^T$ is the input signal vector (at the sub-rate D) extending over the duration of the FIR filter span. Therefore, x(n)=RinSR(n). Also, in equation 19, H(k) is filter coefficient vector (at the sub-rate sampling) for the k-th iteration where:

$$H(k)=[h_0(k), h_1(k), \ldots, h_{N-1}(k)]^T \quad \text{Equation 20}$$

$$H(k+1)=H(k)+\text{step\_size}\cdot \text{errorSR}(k)\cdot X(k) \quad \text{Equation 21}$$

Equation 21 above represents the filter coefficients update formula, as per an NLMS algorithm, where the NLMS sub-rate step_size can be expressed as follows.

$$\text{step\_size}=\beta/[\gamma+P_{RinSR}(k)] \quad \text{Equation 22}$$

In equation 22, β is an adaptation constant and γ is a 'protection' term, which ensures that the update term in the adaptation formula does not become excessively large when $P_{RinSR}(k)$ temporarily becomes small, and where $P_{RinSR}(k)$ is the input signal power at the sub-rate sampling (see equation 16).

$$\text{errorSR}(k)=\text{SinSR}(k)-y(k) \text{(adaptation error at the sub-rate)} \quad \text{Equation 23}$$

In the above equations, RinSR corresponds to the filtered and decimated far-end signal (which corresponds to the output of decimator 106 of FIG. 7) and SinSR corresponds to the filtered and decimated echo signal (at the output of decimator 110 of FIG. 7). Note that during the times when no Sgen is present, Sin 38 includes only the residual echo, and therefore SinSR at the output of decimator 110 can be used as the filtered and decimated echo signal. The variable H (discussed in reference to equation 19) corresponds to a column vector representing the sub-rate adaptive filter 122 coefficient estimates, and the "T" following the H indicates a vector transposition. The signal y represents the estimate of SinSR provided by adaptive filter 122, and errorSR is the difference between SinSR and y. Also, in one embodiment of the above equations, β is set to $2^{-9}*2.5$, and α to 1/128. In one embodiment, γ is set to a small value (comparing to $P_{RinSR}(k)$). For example, if $P_{RinSR}(k)$ is represented as a 16-bit fractional number, a typical value for γ is $k \cdot 2^{-15}$, where k is a small integer.

Flow then proceeds to decision diamond 498 where it is determined whether n is equal to N, where in the current embodiment, N corresponds to the duration of a single measurement cycle. In one embodiment, N corresponds to 300 ms, and therefore, corresponds to 300 sub-rate samples (assuming D=8). For example, if the signals (e.g. Rin 44 and Sin 38) are being sampled at a rate of 8 kHz, then a sample is received every 125 microseconds. In the current example, D is 8; therefore, every D-th sample corresponds to 8*125 microseconds, which equals 1 millisecond. Therefore, every N sub-rate samples, flow proceeds to blocks 503, 500 and 501 where, in the current embodiment, N is 300 such that 300*1 millisecond is 300 milliseconds. Therefore, N can be defined as either a time window having a predetermined duration or as a predetermined number of sub-rate samples that must be processed prior to determining the estimated delay in blocks 500 and 501. The value for N may be programmed or hardwired within echo canceller 20, and may be any value, depending on the desired frequency of calculating a new estimated delay value. Note that N corresponds to the convergence time (i.e. a short-term convergence time) for sub-rate adaptive filter 122. For example, if a window of 1024 samples (which, in the current embodiment, corresponds to 1024*125 microseconds which equals a window size of 128 milliseconds, assuming a base sampling rate of 8 kHz) is used to capture the impulse response (such as T3 in FIG. 37), then 1024/D sub-rate samples are taken (e.g. 1024/8=128 sub-rate samples in the current embodiment). That is, the current embodiment allows a convergence time of 300 ms to achieve the values of the 128 sub-rate samples of the sub-rate impulse response of the channel (as seen from the Rin-Sin termination of the echo canceller) and to find its maximum value. As mentioned above, though, alternate embodiments may use different convergence times (i.e. different size measurement cycles N), different window size (i.e. not limited to 1024 base rate samples or 128 milliseconds), different sub-rates (where D can be any value, including 1), and different sampling rates other than 8 kHz.

If, at decision diamond 498, it is determined that the index n (which may be initialized at the beginning of the call to a starting value such as 1 or 0, for example) has not yet reached N, flow proceeds to block 502 where n is incremented, and flow continues to block 213 of FIG. 9. However, if at decision diamond 498, it is determined that n is equal to N, indicating that 300 samples have been processed (corresponding to a duration of 300 milliseconds), flow proceeds to block 503 where n is initialized to 1, and other measurement cycle variable are also initialized (e.g. $P_{RinSR}$, $P_{SinSR}$, sr_near_end_detect_flag, etc.). Flow then proceeds to decision diamond 504 where it is determined whether the training index is 2. If so, flow proceeds to block 500, bypassing block 505. However, if training index is not 2, flow proceeds to block 505 where the training index is incremented. As described above in reference to FIG. 20, the training index is used by the optional training mode, where the training signal can only be injected during the beginning of a telephone call. Therefore, the training index is used to indicate the beginning of the call.

Flow proceeds from block 505 or decision diamond 504 to block 500 where the individual estimated pure delay is calculated. Note that, as will be described in more detail in reference to FIG. 22, the individual estimated pure delay corresponds to the pure delay estimated for each measurement cycle (i.e. for each N sub-rate samples). After the individual pure delay is estimated, flow proceeds to block 501 where, using several (2, 3 or more, depending on a particular implementation as well as depending on the stage of the call) valid individual pure delay estimations, an estimated delay 130 is determined, as will be discussed in more detail in reference to FIG. 23.

Figure 22:
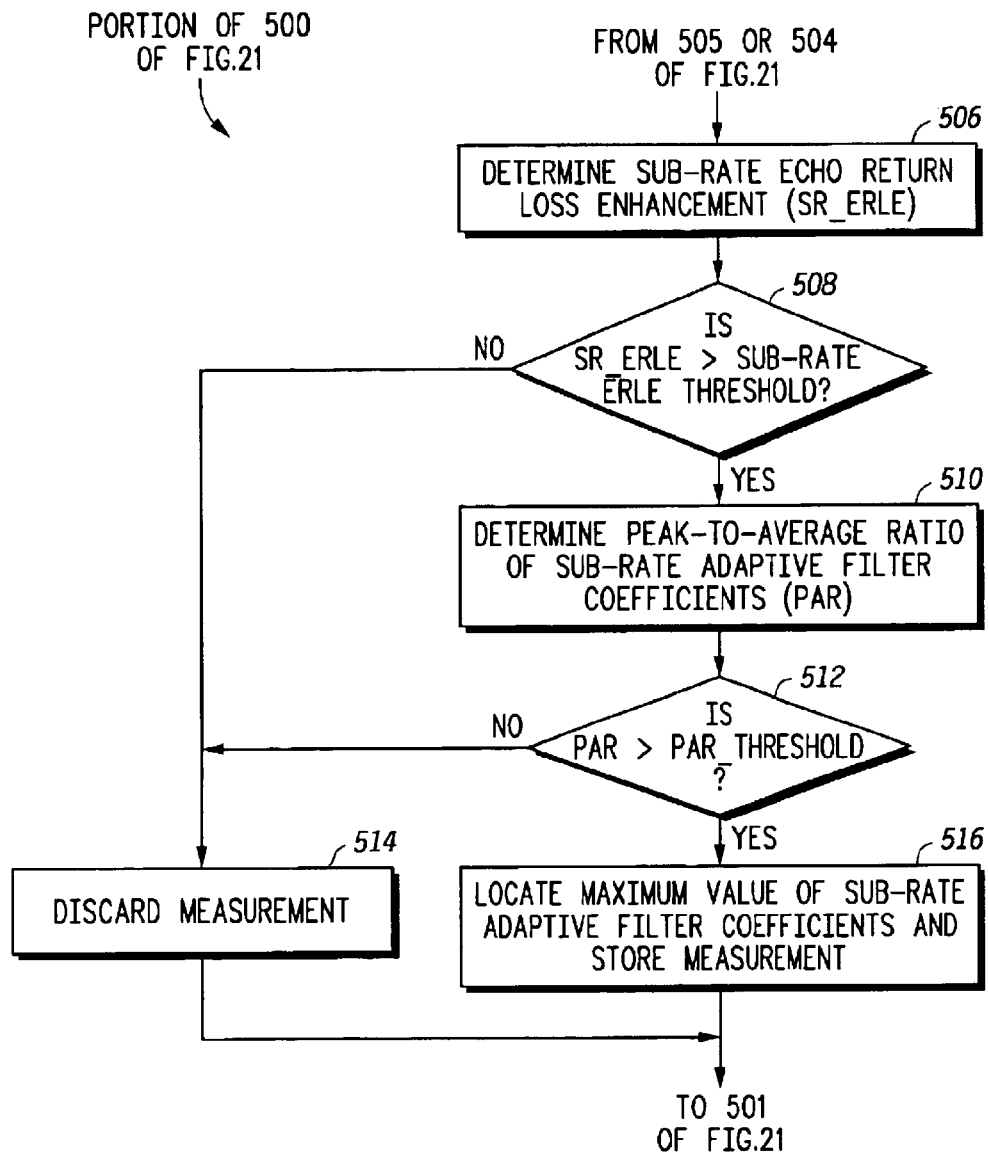

FIG. 22 illustrates one embodiment of block 500 of FIG. 21 where the individual estimated delay is determined. Flow begins with block 506 where the sub-rate echo return loss enhancement (SR_ERLE) is determined. The following equation may be used to determine the SR_ERLE:

$$SR\_ERLE(k)=10*\log_{10}(P_{SinSR}(k)/P_{errorSR}(k)) \quad \text{Equation 24}$$

The SR_ERLE therefore corresponds to a ratio between $P_{SinSR}$ and $P_{errorSR}$, which is used for validating the pure delay measurements. SR_ERLE provides information on the "goodness" of the convergence of sub-rate adaptive filter 122 (i.e. how much echo was cancelled). That is, a higher SR_ERLE (such as, for example, 5 dB or more) indicates that within the current measurement cycle, adaptive filter 122 has converged sufficiently. (Note that SR_ERLE can be determined by ERLE estimator 116 operating at the given sub-rate, see FIG. 7.) Therefore, after block 506, flow proceeds to decision diamond 508 where SR_ERLE is compared to a sub-rate ERLE threshold, and if it not greater than this threshold, flow proceeds to block 514, indicating that the current measurement cycle should not be used due to its poor SR_ERLE. Therefore, the current measurement (for the current measurement cycle) is discarded and flow proceeds to block 501 of FIG. 21. However, if SR_ERLE does surpass the sub-rate ERLE threshold, then flow proceeds to block 510 which performs another check on the convergence of sub-rate adaptive filter 122.

In block 510, the peak-to-average ratio (PAR) of sub-rate adaptive filter 122 coefficients is determined. Referring to FIG. 37, the peak corresponds to the largest value of $|h|$ (meaning the peak is the greatest distance from the zero axis in either the positive or negative direction). In FIG. 37, the peak is as labeled. The average is computed using absolute values of the sub-rate adaptive filter coefficients. If the PAR is not greater than a PAR_Threshold, then from decision diamond 512, flow proceeds to block 514, where the current measurement is discarded because the current measurement cycle did not provide for adequate convergence of sub-rate adaptive filter 122. However, if the PAR is greater than the PAR_Threshold, flow proceeds to block 516, indicating that two conditions were met to ensure that sub-rate adaptive filter sufficiently converged during the current measurement cycle. In block 516, the maximum value of the sub-rate adaptive filter 122 coefficients (corresponding to the peak) is located (which may be performed by maximum value locator 124 of FIG. 7) and its corresponding time value (Tpeak in FIG. 37). Flow then proceeds to block 501 of FIG. 21, which is described in more detail in FIG. 23.

Figure 23:
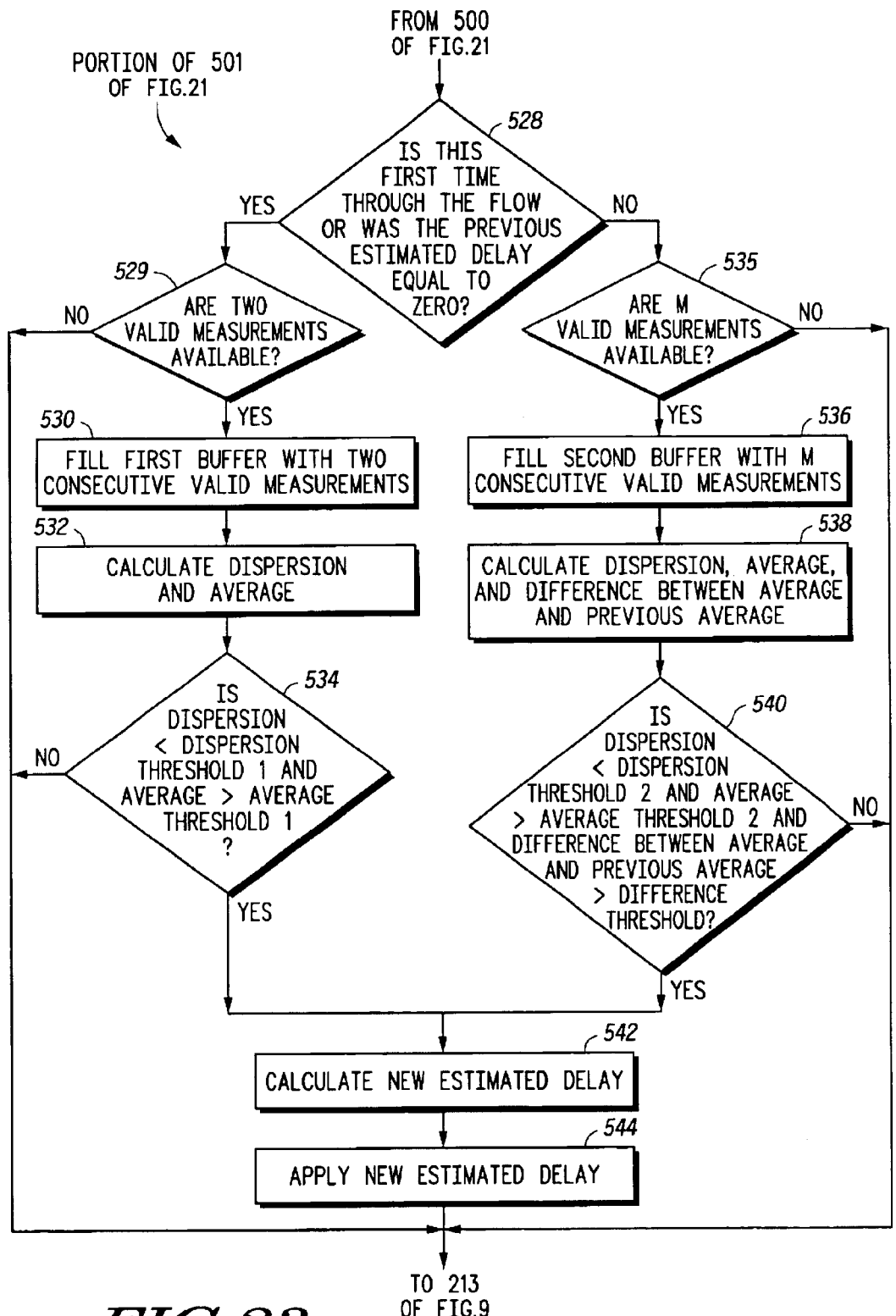

FIG. 23 illustrates one embodiment of block 501 of FIG. 21, which determines the pure delay estimation (corresponding to delay determination 126 and estimated delay 130 of FIG. 7). As discussed above, a pure delay is estimated generally at the beginning of a call, and may be changed during the middle of a call if certain conditions are met. Generally, the conditions for changing the pure delay estimation in the middle of a call are more conservative because (a) statistics of telephone calls (both PSTN calls and Packet Telephony calls) indicate that pure delays do not change very often in the middle of calls, and (b) changing the pure delay estimation too often (by trying to track them too closely) can be disruptive from the viewpoint of telephone user. Therefore, flow begins with decision diamond 528, where it is determined whether this is the first time through the flow (i.e. indicating the beginning of a phone call) or if the previous estimated delay was equal to zero (which may correspond to either the beginning of a call or the middle of call having a previous estimated delay value of zero). If either one of these cases is true, flow proceeds to decision diamond 529 where it is determined if two valid measurements are available. As discussed above in reference to FIG. 22, each individual estimated delay is verified using both the SR_ERLE and PAR, and only if the individual estimated delay is verified, is the corresponding delay measurement stored. Therefore, every measurement cycle (every 300 milliseconds in the current embodiment), a possibility exists for obtaining another valid measurement. Assuming there are at least two available (which takes at least two measurement cycles to obtain), flow proceeds to block 530 where a "fast track" calculation of the estimated delay begins with block 530.

In block 530, a first buffer is filled with two consecutive valid measurements. Flow proceeds to block 532 where the dispersion between these two measurements and the average of the two measurements are taken. The dispersion, for example, can be the difference between the two measurements. Flow proceeds to decision diamond 534 where it is determined whether the dispersion is less than a dispersion threshold 1 and the average is greater than an average threshold 1. If not, a new estimated delay is not calculated and flow proceeds to block 213 of FIG. 9. However, if these conditions are met, flow continues to block 542 where a new estimated delay is calculated. Therefore, dispersion threshold 1 and average threshold 1 ensure that a new estimated delay is calculated only if the two measurements are consistent enough with each other. In other words, if the subsequent measurements of the time for which the impulse response reaches its maximum value differ too much, the estimate of the delay is put on hold until the subsequent measurements are more consistent (i.e., closer to each other). In block 542, the following equation can be used to calculate the new estimated delay:

new estimated delay=average−offset    Equation 25

In the above equation, the average corresponds to the average taken in block 532 of the two measurements, and the offset is the value corresponding to the amount of time before reaching the peak within the impulse response that a substantial response began. That is, referring to FIG. 37, the peak corresponds to a time greater than T1 (the pure delay) by an amount of T4. Therefore, T4 must be subtracted from the value of the time at the peak (Tpeak). The offset corresponds to this T4 value, and the offset can be determined using statistical information about impulse responses of different yet typical hybrid circuits present in the field and can be programmed in echo canceller 20. The new estimated delay (corresponding to estimated delay 130) is then applied in block 544. For example, applying estimated delay 130 may correspond to enabling the optional delay block 66 in FIG. 4 which illustrates one embodiment of adaptive filter unit 28. Therefore, through the use of the pure delay estimation, the number of filter taps required by adaptive filter unit 28 is reduced because the coefficients for the pure delay portion of the response can be considered to be zero.

Note that alternate embodiments may require more or less than two measurements in decision diamond 529 to continue with the "fast track" calculation. In one embodiment, only one valid measurement may be required, and in this case, the dispersion and average are not calculated (since only one measurement is used). Also, the actual value can therefore be checked against the average threshold 1 before determining whether to proceed to block 542, and the dispersion comparison would not be needed. In an alternate embodiment where more than two valid measurements are required, the dispersion may correspond to a variance taken with respect to the valid measurements. Therefore, alternate embodiments may require any number of valid measurements.

If, at decision diamond 528, it is determined that this is not the first time through the call (i.e. generally indicating that the estimation of pure delay is performed in the middle of the call) and the previous delay estimate was not zero, flow proceeds to decision diamond 535 where it is determined whether M valid measurements are available. In one embodiment, M is selected to be 3, or 4, or 5 (depending on the particular setting chosen by the echo canceller installer). The value of M may be chosen such that more or less valid measurements are required before the possibility of updating (i.e. changing) the current estimated delay value. The higher the M value, the less often flow will proceed to block 536. Therefore, M may be chosen to be any value and is not limited to 3 through 5. If M valid measurements are not available, flow proceeds to block 213 of FIG. 9, bypassing the possibility of having the estimated delay value changed. However, if M valid measurements are available, flow proceeds to block 536 where a second buffer is filled with M consecutive valid measurements.

In block 538, a dispersion, average, and a difference between the average and a previous average are calculated. As described above, the dispersion may be calculated in a variety of ways. For example, if M is only 2, the dispersion can simply be a difference. Alternatively, the dispersion can be calculated as a variance. The previous average corresponds to the average calculated in the previous pass through either block 538 or 532. After the calculations of block 538, flow proceeds to decision diamond 540 where various thresholds are used to determine whether a change in the estimated delay is worth while. Therefore, the thresholds of decision diamond 540 can be used to set up more conservative criteria for changing the estimated pure delay in the middle of a call.

At decision diamond 540, the dispersion is compared to a dispersion threshold 2, the average to an average threshold 2, and the difference between the average and the previous average to a difference threshold. If the dispersion is less than the dispersion threshold 2, or the average is greater than the average threshold 2, or if the difference is less than the difference threshold, flow proceeds to block 213 of FIG. 9 and a new estimated delay is not calculated (i.e. the current estimated delay is maintained). However, if all these conditions are met (dispersion is less than dispersion threshold 2, average is greater than average threshold 2, and the difference is greater than the difference threshold), then flow proceeds to block 542 where a new estimated delay is calculated (as explained in reference to equation 25) and applied in block 544, as described above. As with the "fast track", the dispersion threshold 2 ensures that the M valid measurements do not deviate from each other too much and the average ensures that the M valid measurements are large enough to warrant the necessity of changing it (for example, if the average is relatively small, there may not be a need to change the pure delay of the echo canceller, as the small pure delay can be accommodated by the adaptive filter 28 if properly provisioned). The comparison of the difference to a difference threshold prevents the current estimated delay from being changed if the difference is too small (i.e. less than the difference threshold) and therefore not worth changing.

Figure 24:
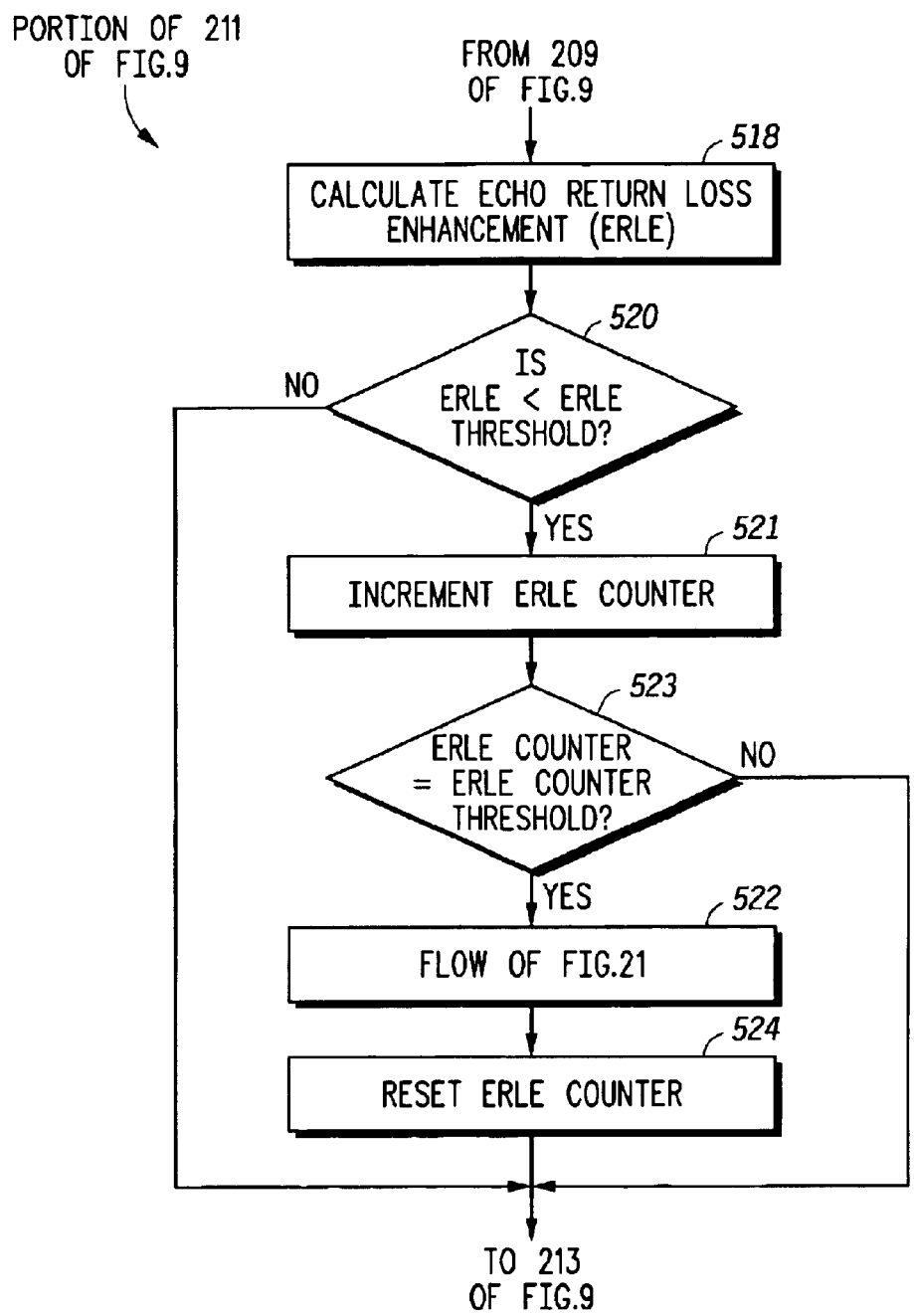

FIG. 24 illustrates one embodiment of an optional monitoring mode that can be used to reduce MIPS (million instructions per second, a common measure of digital signal processor usage) by echo canceller 20. The flow of FIG. 24 is a portion of 211 of FIG. 9 which can be used to determine when the flow of FIG. 21 should be performed. Flow begins with block 518 where the echo return loss enhancement (ERLE) is calculated. This ERLE corresponds to the "goodness" of the convergence of adaptive filter 28 (i.e. provides information as to how much echo was actually not cancelled out by adaptive filter 28). The following equation may be used to calculate ERLE:

$ERLE(n)=10*\log_{10}(P_{Sin}(n)/P_{error}(n))$    Equation 26

The ERLE therefore corresponds to a ratio between $P_{Sin}$ and $P_{error}$ where n is the sample number. (Note that $P_{Sin}$ and $P_{error}$ can be calculated using equations 1 and 2 described above.) This ERLE value is therefore used during the monitoring mode for entering the pure delay adjustment process of FIG. 21. Flow proceeds to decision diamond 520 where ERLE is compared against an ERLE threshold. If ERLE greater than or equal to the ERLE threshold, the convergence of adaptive filter 28 is sufficient and the pure delay estimation need not be performed; therefore, flow proceeds to block 213 of FIG. 9. However, if ERLE is less than the ERLE threshold, then the convergence of adaptive filter 28 is not sufficient, and flow proceeds to block 521 where an ERLE counter is incremented. (Note that this ERLE counter can be initialized at the beginning of each call.). Flow then proceeds to decision diamond 523 where the ERLE counter is compared to an ERLE counter threshold. If the ERLE counter has not reached the ERLE counter threshold, flow bypasses block 522 (corresponding to the flow of FIG. 21) and proceeds to block 213 of FIG. 9. However, if the ERLE counter has reached the ERLE counter threshold, flow proceeds to block 522 where the entire flow of FIG. 21 (as discussed above) is performed. Flow then proceeds to block 524 where the ERLE counter is reset, and then to block 213 of FIG. 9.

The ERLE counter and ERLE counter threshold ensure that if the ERLE calculated in block 518 is borderline (changes from above the ERLE threshold to below the ERLE threshold occur too frequently), the pure delay does not get recalculated and updated. That is, the ERLE has to fall below the ERLE threshold for a period of time (controlled by the ERLE counter and ERLE counter threshold) before the flow of FIG. 21 can be entered. This helps to prevent rapid and unnecessary changing of the pure delay estimate.

Figure 25:
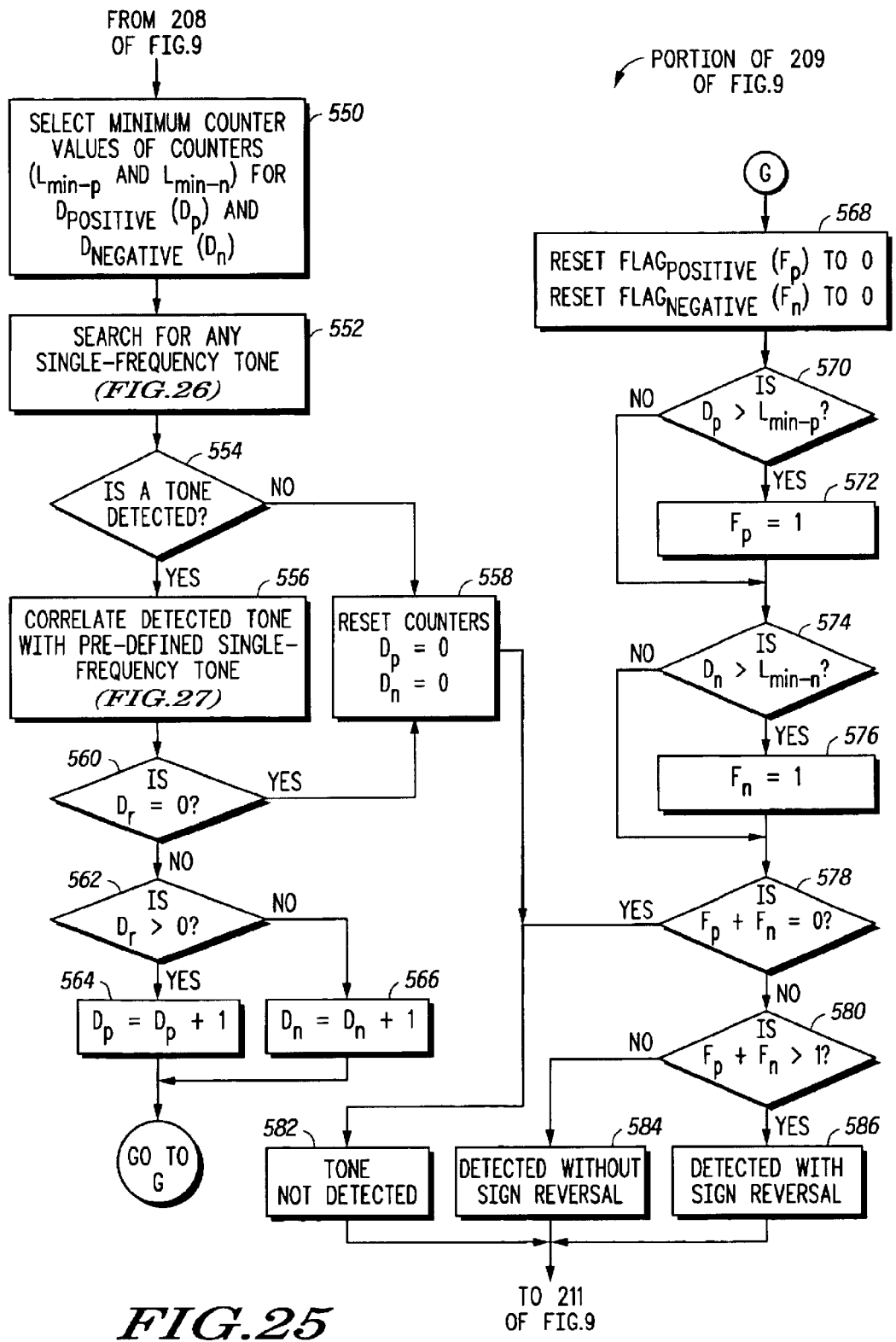
FIGS. 25–27 illustrate, in flow diagram form, a method for tone detection, in accordance with one embodiment of the present invention.
Figure 26:
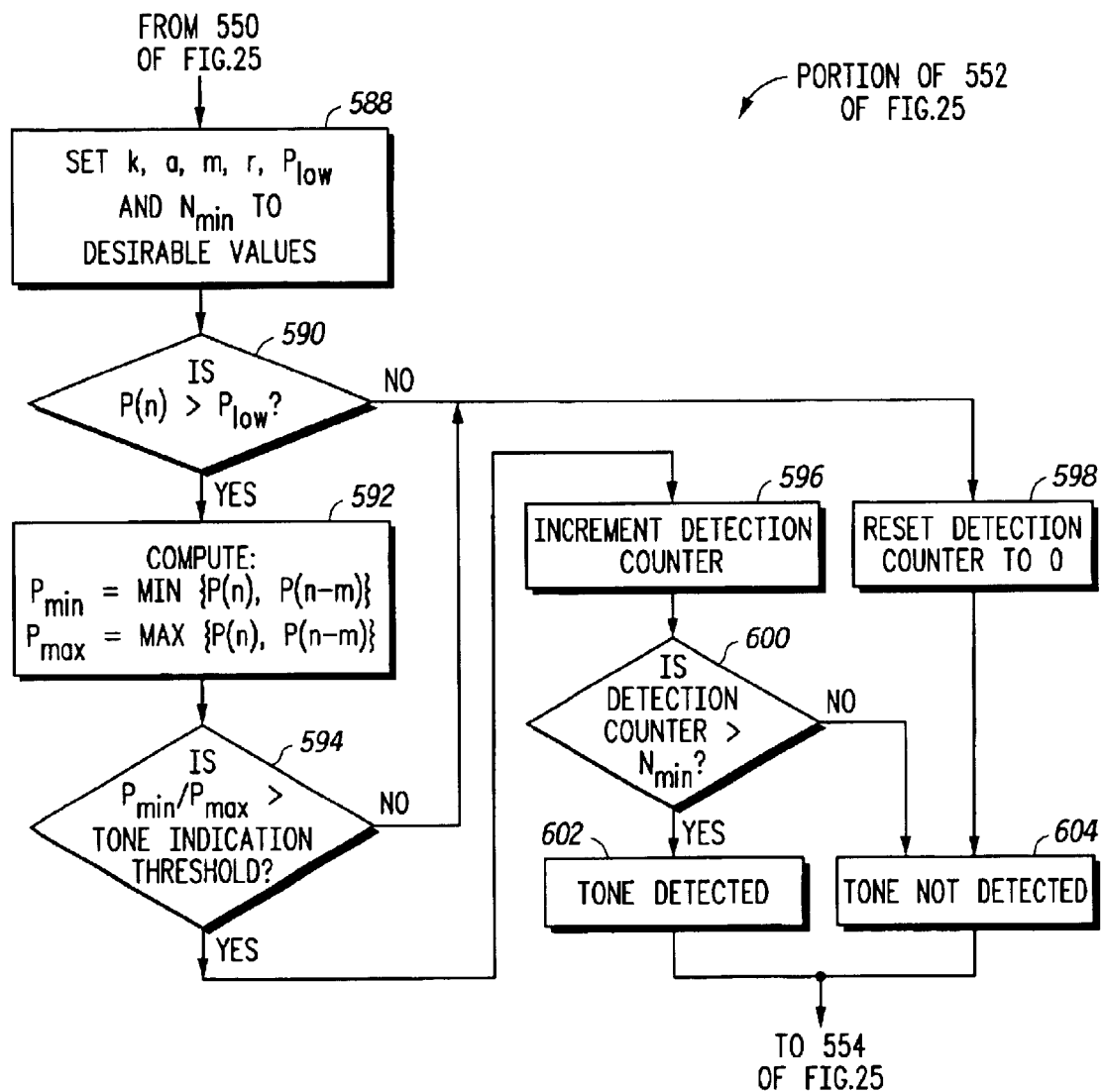
Figure 27:
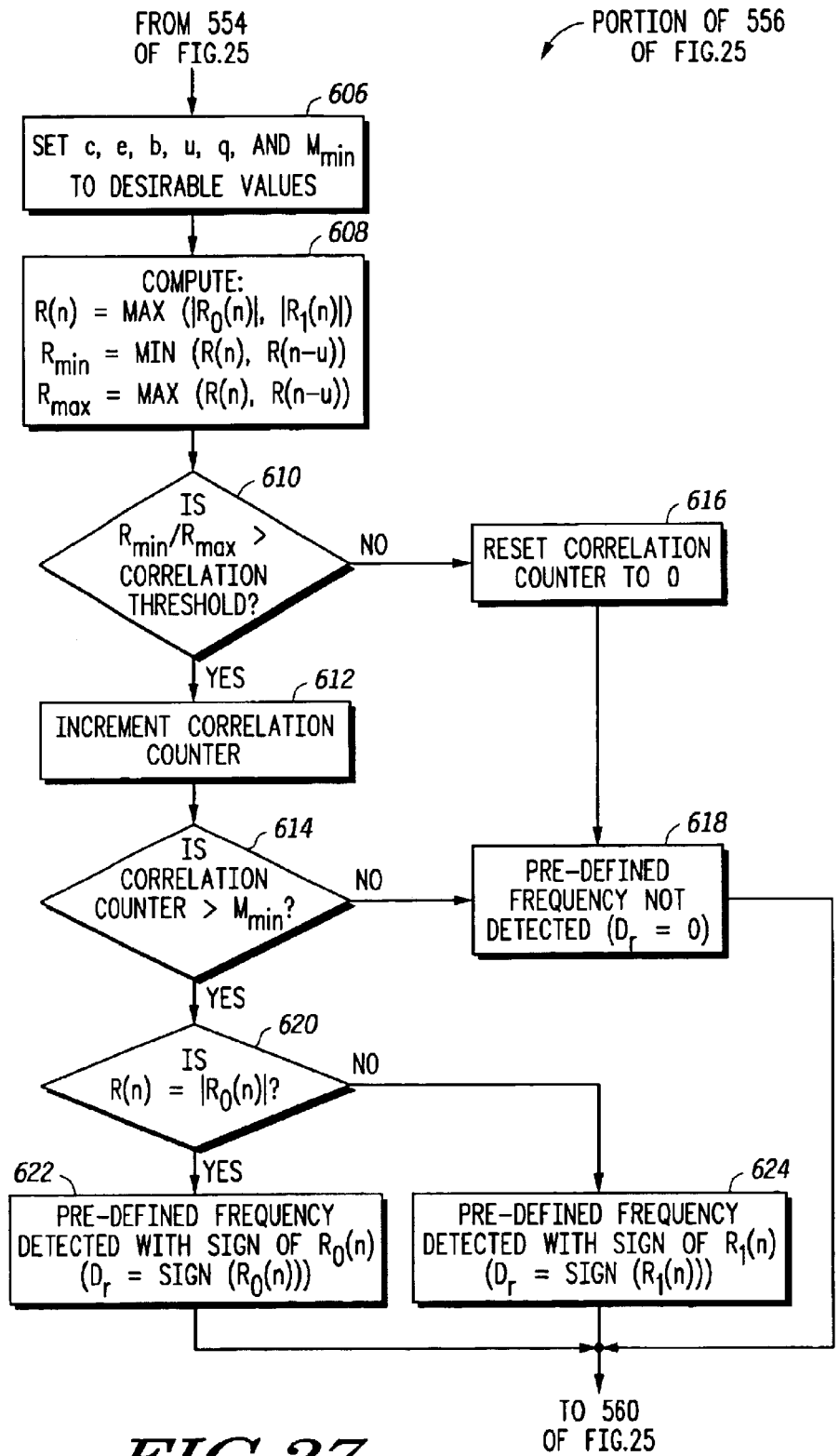

FIGS. 8 and 25–27 relate to one embodiment of tone detection that may be used within echo canceller 20, where FIG. 8 illustrates, in block diagram form, a portion of monitor and control unit 30, and FIGS. 25–27 illustrate, in flow diagram form, a portion of block 209 of FIG. 9. When at least one of the inputs to echo canceller 20 (e.g. Rin 44 or Sin 38) is a tone, stability of adaptive filter 62 may be affected, resulting in undesirable distortion and degraded quality of service in telecommunication networks. A tone is a signal composed of a number of sinusoidal components with constant magnitude, frequency and phase over a certain period of time.

Any adaptive algorithm (such as that used by adaptive filter 62 ) attempting to minimize the average power of the residual echo will have a dynamic behavior that depends on the auto-correlation matrix of Rin 44. Certain classes of receiving path signals can make this matrix singular, which can temporarily disrupt the adaptation process and make the filter coefficients of adaptive filter 62 deviate from desirable values. Sinusoidal signals (single-frequency tones), for example, can create this condition. In this case, the auto-correlation, r(k), of a sinusoidal signal Rin(n)=A cos($\Omega n+\phi$) is given by r(k)=$A^2$cos($\Omega k$)/2, which leads to a singular auto-correlation matrix in most practical cases (i.e. when its dimension is large). When that happens, a possible outcome of the adaptive algorithm is a set of filter coefficients (for adaptive filter 62 ) with sinusoidal form, which is an incorrect estimate of the actual hybrid circuit impulse response, an example of which is given in FIG. 37.

Similarly, multi-frequency tones can also generate a similar problem because their auto-correlation $$r_M(k) = \sum_{m=1}^{M} A^2 \cos(\Omega_m k)/2$$

can still generate singular auto-correlation matrices when the number of components, M, is not large enough or the matrices have a large dimension. Note that the matrix dimension depends on the number of filter coefficients being used to estimate the impulse response of the hybrid circuit. Therefore, it is desirable to detect the presence of any signaling and controlling tones and then to stop the adaptation process of adaptive filter 62, thus preventing divergence from a good set of filter coefficients.

One embodiment which will be described in reference to FIGS. 25–27 uses polynomial filters such as a modified version of the Teager-Kaiser filter for indicating the presence of a sinusoidal signal of any frequency, a smooth correlation approach for identifying a pre-defined single-frequency tone, and decision logic for reliably detecting tones. Note that any appropriate polynomial filter maybe used. The polynomial filter illustrated in FIG. 8 is just one example. Although the embodiments described herein are generally in reference to echo canceller 20, they may be used in any device or telecommunication device that requires tone indication and detection, and is not limited to echo cancellers alone.

FIG. 8 includes one embodiment of power estimator 134 which maps any single-frequency tone to a constant via a modified energy operator. That is, a single-frequency tone can be expressed as follows.

$$x(n)=A\cos(\Omega n+\phi) \quad \text{Equation 27}$$

The modified energy operator, $\Psi k$, can be expressed as follows.

$$\Psi_k(x(n))=x^2(n-k)-x(n)x(n-2k)=A^2\sin^2(k\Omega) \quad \text{Equation 28}$$

In the above equation, note that $x^2(n-k)-x(n)x(n-2k)$ corresponds to the output of adder 144 in FIG. 8 (i.e. the output of delay 136 is x(n-k), the output of delay 138 is x(n-2k), the output of multiplier 140 is x(n)x(n-2k), the output of multiplier 142 is $x^2(n-k)$, and the output of adder 144 is the sum of the output of multiplier 142 and the negative of the output of multiplier 140). Note that the input signal x(n) can correspond to either Rin 44 or Sin 38. Furthermore, by substituting x(n) of equation 27 into $x^2(n-k)-x(n)x(n-2k)$, the result $A^2\sin^2(k\Omega)$ is obtained. Therefore, note that $\Psi$ depends both on the magnitude A and the normalized frequency $\Omega$ of the tone ($\Omega=2\pi f/f_s$, where f is the tone frequency and $f_s$ is the sampling frequency, which, in one embodiment, is 8 kHz). The parameter k in these equations defines the underlying sub-rate processing, where k can be any integer value, including 1. Therefore, applying $\Psi_k$ at a sampling rate $f_s$ is equivalent to applying $\Psi_1$ at a sampling rate of $f_s/k$. As described above, sub-rate processing may be used to reduce computational requirements, where only every kth sample is processed. Note also that $\Psi_k(x(n))$ does not depend on the initial phase $\phi$, but does generate a short-term transient upon abrupt phase changes, which maybe used to detect phase changes in the communication signal x(n).

The power of x(n) (equation 27) can be expressed using the following equation.

$$\text{Power}_{x(n)}=A^2/2 \quad \text{Equation 29}$$

Therefore, note that $\Psi_k(x(n))$ provides the power of x(n) scaled by $2\sin^2(k\Omega)$, such that:

$$\Psi_k(x(n))=\text{Power}_{x(n)}*2\sin^2(k\Omega) \quad \text{Equation 30}$$

Solving for $\text{Power}_{x(n)}$ in terms of $\Psi_k(x(n))$ therefore provides the following equation:

$$\text{Power}_{x(n)}=\Psi_k(x(n))csc^2(k\Omega)/2 \quad \text{Equation 31}$$

However, in practice, the signal x(n) (which, as mentioned above, may correspond to either Rin 44 or Sin 38 in the embodiment illustrated in FIG. 8) may be corrupted by noise, resulting in a noisy estimation $\Psi\text{noisy}_k(x(n))$. Any low pass filter can then be used to smoothen the result, such as, for example, a single-pole low pass filter. Therefore, as can be seen in FIG. 8, power estimator 134 includes a low-pass filter which receives the output of magnitude 146 (corresponding to the absolute value of the output of adder 144) and a from storage 150, and provides a smooth estimate P(n) of $\Psi noisy_k(x(n))$. P(n) can be expressed with the following equation.

$$P(n)=\alpha P(n-1)+(1-\alpha)|x^2(n-k)-x(n)x(n-2k)| \qquad \text{Equation 32}$$

In the above equation, $\alpha$ is a smoothing parameter (0<a<1) that controls the bandwidth of the smoothing low pass filter. Note that either a fixed or variable smoothing parameter, a, may be used. P(n) is then provided to tone indication decision unit 166 of FIG. 8 which indicates whether a tone is present based on the variance of the estimate P(n), as will be described in more detail below in reference to FIG. 26. Although FIG. 26 refers to power, other functions of the communication signal maybe used, such as correlation (see FIG. 27), or even the communication signal itself.

Once a tone is present, one embodiment detects any pre-defined single-frequency tone, with or without phase reversal, such as a 2100 Hz signaling tone. One embodiment for detecting the pre-defined tone will be discussed in more detail below with reference to FIG. 27. Therefore one embodiment may include only the tone detection of FIG. 26, while an alternate embodiment, as illustrated in FIG. 25, includes the interaction between the algorithms of FIGS. 26 and 27. Furthermore, the embodiment of FIG. 26 may also be used in a monitoring mode to re-enable the adaptive process of adaptive filter 62 after a tone is received. That is, the transition between signaling tones and voice signals can also be detected using the variance of P(n) (i.e. the transition being detected when the variance is larger than some pre-defined threshold).

Given estimates P(n), tone indication decision unit 166 may be used to detect a tone according to the flow of FIG. 26. The flow of FIG. 26 detects the time intervals in which the variance of P(n) is small. A constant level of P(n), corresponding to a small variance of P(n), is expected whenever a single-frequency tone is present on x(n). If a tone is composed by more than one frequency, the variance of P(n) will increase, but the average level will stay constant. Therefore, depending on the variance level, either single- or multi-frequency tones can be indicated. In FIG. 26, flow therefore begins with block 588 where k, a, m, r, $P_{low}$, and $N_{min}$ are set to desirable values. Depending on the expected tone frequency range and the noise level in the system, those values could be, for example, k=2, a=0.9, m=1, r=0.95, $P_{low}=2^{-8}$. $N_{min}$ depends on the sampling rate and the minimum required duration of the tone to be detected. Flow proceeds to decision diamond 590 where it is determined whether P(n) is greater than $P_{low}$, where $P_{low}$ corresponds to a threshold indicating the lowest signal level to be considered. If not, flow proceeds to block 598 where a detection counter is reset (to zero) and then to block 604, indicating a tone is not detected, and then to block 554 of FIG. 25. However, if P(n) is at least greater than $P_{low}$, flow proceeds from decision diamond 590 to block 592 where $P_{min}$ and $P_{max}$ are computed. $P_{min}$ corresponds to the minimum of two estimates of P(n) separated by m samples, and $P_{max}$ corresponds to the maximum of two estimates of P(n) separated by m samples.

$$P_{min}=\text{MIN}(P(n), P(n-m)) \qquad \text{Equation 33}$$

$$P_{max}=\text{MAX}(P(n), P(n-m)) \qquad \text{Equation 34}$$

The variance level is estimated by comparing $P_{min}$ and $P_{max}$. Therefore, flow proceeds to decision diamond 594 where the ratio of $P_{min}$ to $P_{max}$ (i.e. $P_{min}/P_{max}$) is compared to a tone indication threshold. If it is not greater than the tone indication threshold r, flow proceeds to block 598 where the detection counter is reset, then to block 604 indicating that a tone is not detected, and then to block 554 of FIG. 25. However, if $P_{min}/P_{max}$ is greater than the tone indication threshold, then P(n) is considered sufficiently constant (i.e. $P_{min}$ and $P_{max}$ are close enough) indicate the possibility of the presence of a tone. In this case, flow proceeds to block 596 where the detection counter is incremented (note that the detection counter can be initialized or reset at the beginning of a call or at any other appropriate time prior to entering the flow of FIG. 26).

Flow proceeds to decision diamond 600 where it is determined whether the detection counter is greater than $N_{min}$. If the detection counter has not reached $N_{min}$, then flow proceeds to block 604 indicating that a tone was not detected, and then to block 554 of FIG. 25. However, if the detection counter is greater than $N_{min}$, flow proceeds to block 602 where a tone is detected (which corresponds with the assertion of tone indicator signal 168 in FIG. 8). Flow then proceeds to block 554 of FIG. 25. Therefore, a tone is detected when P(n) is larger than a minimum level ($P_{low}$), the variance of P(n) is smaller than a minimum value (related to the tone indication threshold), and the detection counter is larger than a minimum value ($N_{min}$). The detection counter ensures that a tone has been present for at least a predetermined amount of time (corresponding to $N_{min}$) before detecting a tone and asserting tone indicator signal 168. This helps to prevent rapid switching between detecting a tone and not detecting a tone which may result in enabling or disabling the adaptive process of adaptive filter 62 too frequently.

FIG. 8 includes one embodiment of smooth correlator 152. This correlator can be used in a variety of ways, including detection of any predefined single frequency tone, detection of a carrier of amplitude-modulated signals, detection of multi-component tones whose frequencies are close to a nominal frequency. Smooth correlator 152 receives samples of the input signal x(n) (which, as mentioned above, can be Rin 44 or Sin 38 ) and three control parameters (c, b, and e) from storage 150 and generates two correlation estimates $R_0(n)$ and $R_1(n)$. These correlations are used to indicate the presence of a predefined tone, as will be explained as follows. The control parameter c defines one of the coefficients of a second order digital oscillator w(n) that generates a pre-defined single-frequency tone with normalized frequency $\Omega_d=2\pi f_d/f_s$, where, as above, $f_s$ is the input sampling frequency. The oscillator is initialized with the states w(−1)=1 and w(−2)=c=cos($\Omega_d$), and uses the standard second order digital oscillator given by w(n)=2*c*w(n−1)−w(n−2). (Note that the oscillator may correspond to oscillator 164 of FIG. 8, receiving c and providing w(n) as an output to multipliers 156 and 158. ) The input signal x(n) and a delayed version x(n−e) (i.e. the output of delay 154 of FIG. 8) are correlated with w(n) (via multipliers 156 and 158) and then passed through low-pass filters (i.e. low-pass filter 160 of FIG. 8 receives the output of multiplier 158 which can be represented as x(n)w(n), and low-pass filter 162 of FIG. 8 receives the output of multiplier 156 which can be represented as x(n−e)w(n)). The parameter, b, provided as an input to low-pass filters 160 and 162 where 0<b<1 defines the bandwidth of the low-pass filters. Also, one embodiment of smooth correlator 152 may use smoothing single pole low-pass filters for low-pass filters 160 and 162. Also, in an alternate embodiment, the oscillator signal w(n) and a delayed version w(n−e) may be correlated with x(n) rather than correlating w(n) to x(n) and x(n−e). Also, in one embodiment, e is a delay factor expressed as follows.

Equation 35:

$$e = \left\lceil \frac{\pi}{2\Omega_d} \right\rceil$$

The above equation corresponds to a phase difference close to 90°, where ⌈x⌉ indicates the smallest integer larger than or equal to its argument, x.

Referring back to FIG. 8, the output of low-pass filter 160 is correlation estimate $R_0(n)$ and the output of low-pass filter 162 is correlation estimate $R_1(n)$, both of which are provided to tone indication decision unit 166. $R_0(n)$ and $R_1(n)$ can be expressed as $R_0(n)=b \cdot R_0(n-1)+(1-b) \cdot w(n) \cdot x(n)$, and $R_1(n)=b \cdot R_1(n-1)+(1-b) \cdot w(n) \cdot x(n-e)$. Therefore, given that an unknown tone has been indicated by tone indication decision unit (using the flow of FIG. 26 described above), $R_0(n)$ and $R_1(n)$ are analyzed using the flow of FIG. 27 for identifying the presence of a pre-defined single-frequency tone (corresponding to oscillator 164).

The flow of FIG. 27 correlates a detected tone with the pre-defined single-frequency tone in order to detect a particular tone. In FIG. 27, flow begins with block 606 where c, e, b, u, q, and $M_{min}$ are set to desirable values. The parameter c is directly related to the frequency of the target tone to be detected, which also defines the delay value e. Depending on the noise level in the system, the remaining values could be, for example, b=0.9, u=1, q=0.95, $P_{low}=2^{-8}$. $M_{min}$ depends on the sampling rate and the minimum required duration of the target tone to be detected. Flow then proceeds to block 608 where R(n), $R_{min}$, and $R_{max}$ are evaluated, as shown in the following equations.

$R(n)=\text{MAX}(|R_0(n)|,|R_1(n)|)$  Equation 36

$R_{min}=\text{MIN}(R(n),R(n-u))$  Equation 37

$R_{max}=\text{MAX}(R(n),R(n-u))$  Equation 38

R(n) refers to the peak magnitude correlation between $R_0(n)$ and $R_1(n)$. $R_{min}$ corresponds to the minimum of two estimates of R(n) separated by u samples, and $R_{max}$ corresponds to the maximum of two estimates of R(n) separated by u samples. Flow then proceeds to decision diamond 610 where the ratio of $R_{min}$ to $R_{max}$ ($R_{min}/R_{max}$) is compared to a correlation threshold q (which, in one embodiment, is set to 0.95). If the ratio is not greater than the correlation threshold, flow proceeds to block 616 where the correlation counter is reset (to zero), then to block 618 indicating that the pre-defined frequency is not detected ($D_r=0$), and then to block 560 o FIG. 25. However, if the ratio is greater than the threshold, flow proceeds to block 612 where the correlation counter is incremented. (Note that the correlation counter can also be initialized or reset at the beginning of a call.) Flow proceeds to decision diamond 614 where the correlation counter is checked against $M_{min}$. If the correlation counter is not greater than $M_{min}$, flow proceeds to block 618 indicating that the pre-defined frequency is not detected ($D_r=0$).

However, if at decision diamond 614, it is determined that the correlation counter is greater than $M_{min}$, flow proceeds to decision diamond 620 where it is determined if R(n) is equal to the absolute value of $R_0(n)$. If so, flow proceeds to block 622 where the pre-defined frequency is detected with a sign of $R_0(n)$, i.e. $D_r=\text{sign}(R_0(n))$. If not, flow proceeds to block 624 where the pre-defined frequency is detected with a sign of $R_1(n)$, i.e. $D_r=\text{sign}(R_1(n))$. From block 622 or 624, flow proceeds to block 560 of FIG. 25. Therefore, similar to the flow described in FIG. 26 for detecting any tone, a pre-defined tone is detected when the variance of R(n) is small for a predetermined amount of time as defined by the correlation counter and $M_{min}$. This helps prevent rapid switching, as described above with respect to the detection counter and $N_{min}$. The method of FIG. 27 is equivalent to using an effective smooth correlation given by the following equation:

$R_{eff}(n)=\frac{1}{2}\{[R_0(n)-R_1(n)]\text{sign}(|R_0(n)|-|R_1(n)|)+[R_0(n)+R_1(n)]\}$  Equation 39

The above equation generates either $R_0(n)$ or $R_1(n)$ depending on the component with the largest magnitude.

One embodiment of an overall process flow including the flows of FIGS. 26 and 27 is illustrated in FIG. 25 where FIG. 25 illustrates a portion of block 209 of FIG. 9, in accordance with one embodiment. In FIG. 25, flow begins with block 550 where minimum counter values ($L_{min-p}$ and $L_{min-n}$) are selected for $D_{positive}$ ($D_p$) and $D_{negative}$ ($D_n$), respectively. These values are selected such that desirable minimum durations of positive and negative phases are met. $D_p$ corresponds to a counter for positive phase and $D_n$ for negative phase.

Flow then proceeds to block 552 where a search for any single-frequency tone is detected. The flow of FIG. 26 may be used to determine the existence of any single-frequency tone. Flow proceeds to decision diamond 554, where, if no tone is detected, flow proceeds to block 558 where the $D_p$ and $D_n$ counters are reset (to zero) and flow proceeds to block 582, indicating that a tone is not detected, and then to block 211 of FIG. 9. However, if a tone is detected, flow proceeds to block 556 where the detected tone is correlated with a pre-defined single-frequency tone. Therefore, the flow of FIG. 27 may be used to perform block 556. Flow proceeds to decision diamond 560 where it is determined whether $D_r$ is zero. If so, the pre-defined frequency was not determined in block 556 (e.g. block 618 of FIG. 27) and flow proceeds to block 558 where counters $D_p$ and $D_n$ are reset. However, if not, flow proceeds to decision diamond 562 where it is determined whether $D_r$ is greater than zero. If so, flow proceeds to block 564 where the positive phase counter is incremented; otherwise, flow proceeds to block 566 where the negative phase counter is incremented.

After block 564 or 566, flow proceeds, via point G, to block 568 where $\text{Flag}_{positive}$ ($F_p$) and $\text{Flag}_{negative}$ ($F_n$) are reset (to zero). Flow proceeds to decision diamond 570 where, if $D_p$ is greater than $L_{min-p}$, $F_p$ is set to one in block 572, otherwise flow proceeds to decision diamond 574, bypassing block 572. At decision diamond 574, it is determined whether $D_n$ is greater than $L_{min-n}$, and if so, $F_n$ is set to one in block 576. If not, flow proceeds to decision diamond 578, bypassing block 576. At decision diamond 578, if $F_p$ and $F_n$ are zero (i.e. if $F_p+F_n$ is zero), flow proceeds to block 582 indicating that a tone was not detected. That is, if none of the counters ($D_n$ or $D_p$) are larger than some minimum value (e.g. $L_{min-p}$ or $L_{min-n}$, respectively), the desired tone is not detected.

However, if Fp+Fn is not zero, flow proceeds to decision diamond 580 indicating that a tone is detected. If only one counter is larger than $L_{min}$ ($D_p$ or $D_n$) then $F_p+F_n$ is not greater than one, and flow proceeds to block 584 indicating that the desirable tone is detected without correlation sign reversal. If both $D_p$ and $D_n$ are larger than their respective $L_{min}$, flow proceeds to block 586 indicating that the desirable tone is detected with correlation sign reversal. If the average level of R(n) is the same during a correlation sign reversal, then a phase reversal is indicated. Therefore, the flow of FIG. 25 combines the flows of FIGS. 26 and 27 and detects phase reversal. An alternate embodiment identifies phase changes (not necessarily 180°) in a given single-frequency tone by detecting abrupt changes in P(n).

Note that the description up to this point has assumed that optional non-adaptive filter 64 within adaptive filter unit 28 was not present (see FIG. 4); therefore, any reference to the coefficients or taps of adaptive filter 28 was analogous to referring to the coefficients or taps of adaptive filter 62 within adaptive filter unit 28. Therefore, in the previous descriptions, it was not necessary to refer to adaptive filter 62 separately from adaptive filter unit 28. However, in the descriptions to follow of FIGS. 28–36, non-adaptive filter 64 may be present and may be considered as a portion of adaptive filter unit 28. Therefore, the coefficients of adaptive filter 62, as was used throughout the above descriptions, will now be more specifically referred to as the coefficients or taps of adaptive filter 62 since adaptive filter unit 28 may include a combination of various different filters such as adaptive filter 62 and non-adaptive filter 64.

As described above, adaptive filter 62 tracks the echo introduced by hybrid 16, thus generally requiring a large number of taps. For example, in order to track the entire impulse response of FIG. 37, adaptive filter 62 of adaptive filter unit 28 (assuming a sampling rate of 8 kHz) requires 256 taps which span 32 milliseconds, thus covering the entire impulse response. As the number of taps of adaptive filter 62 increases, computation complexity increases and usually degrades the speed of convergence. The methods described above with respect to FIGS. 20-24 allow for the detection of pure delay in order to allow adaptive filter 62 to use a sparse window covering the impulse response after the pure delay. The methods that will be described below in reference to FIGS. 28–36 relate to a mechanism for shortening the echo path span. That is, in addition to detecting a finer tuned pure delay, the dispersion time is also detected and compacted, in order to shorten the echo path span of the impulse response. As will be described, one embodiment adds fixed or adaptive filters for the purpose of shortening the effective number of taps required to minimize residual echo.

Intrinsic to the impulse response, as illustrated in FIG. 37, are zeroes and poles. Zeroes prevent a response at the corresponding frequencies, but poles enhance the response at corresponding frequencies. Therefore, by adding a filter or filters to compensate for the poles, the impulse response can be compacted, thus requiring a fewer number of taps. For example, assuming an IIR filter having a transfer function H(z) represented as a ratio B(z)/A(z), a filter A'(z) can be designed to compensate for the poles of H(z) such that H(z)*A'(z)≈B(z). One embodiment, as illustrated in FIG. 2, uses optional non-adaptive filters 31 and 35 such that the output of non-adaptive filter 31 (i.e. Sin 39) is equivalent to the echo convolved with non-adaptive filter 31. However, the presence of non-adaptive filter 31 following DC notch filter 45 introduces distortion into Sin 37 which needs to be compensated for. Therefore, non-adaptive filter 35 can be introduced to receive error signal 46 and produce filtered error signal 47. Assuming non-adaptive filter 31 is an FIR filter having a transfer function A'(z), non-adaptive filter 35 is an inverse IIR filter having a transfer function 1/A'(z). However, restrictions are needed on A'(z) because the zeroes of A'(z) of FIR filter 31 become poles of 1/A'(z) of inverse IIR filter 35. These restrictions on the zeroes of A'(z) will be described further below and prevent the poles of non-adaptive IIR filter 35 from blowing up the error signal 47.

An alternate embodiment may use a different arrangement of the non-adaptive filters. For example, non-adaptive filter 35, rather than being placed at the output of adder 34, can be placed prior to adder 34 at the output of both non-adaptive filter 31 and adaptive filter 62 (which would result in the same net effect). In this embodiment, non-adaptive filter 31 followed immediately by non-adaptive filter 35 would effectively cancel each other out, so as to require no filter between Sin 38 and Sin 39 (i.e. Sin 39 and Sin 38 would be equivalent). Adaptive filter 28 can then be designed to include optional non-adaptive filter 64 (analogous to the non-adaptive filter 35). Therefore, in this embodiment, only one additional filter is needed. However, if an IIR filter is used for non-adaptive filter 64, restrictions on stability are still required. That is, all roots of the polynomial defined by the coefficients of filter 64 should be less than one (i.e. within a unit circle), as will be described in more detail below. Note that as used throughout the description, for a transfer function H(z)=W, the roots of W correspond to the zeroes of H(z), while for H(z)=1/W, the roots of W correspond to the poles of H(z). The optional filters 31, 35 and 64 are non-adaptive in the sense that their coefficients are not periodically adapted as the coefficients of the main adaptive filter 62. In general, they can be viewed as adaptive filters whose adaptive rates are event driven.

Figure 28:
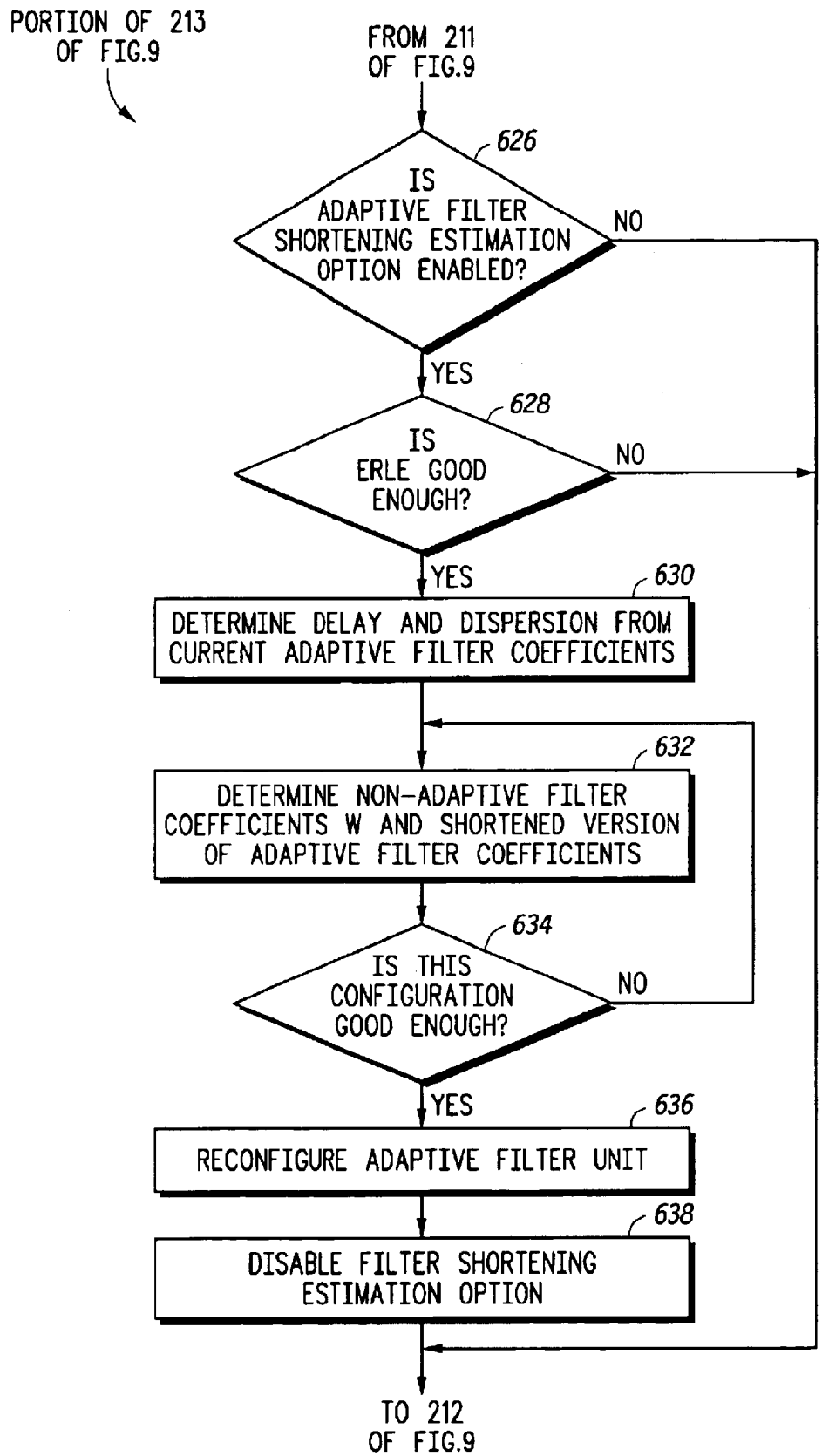
FIGS. 28–36 illustrate, in flow diagram form, a method for shortening echo path scan, in accordance with one embodiment of the present invention.

FIG. 28 illustrates a portion of block 213 of FIG. 9 in accordance with one embodiment of the present invention. Flow begins with decision diamond 626 where it is determined whether the adaptive filter shortening estimation option is enabled. If not, flow bypasses the flow of FIG. 28, continuing to block 212 of FIG. 9. However, if enabled, flow proceeds to decision diamond 628. The adaptive filter shortening estimation option can be enabled in a variety of different ways. For example, it can be self enabled, such as in response to a system reset. Alternatively, it may be enabled any time a different delay is detected within delay unit 66 (if present) of FIG. 4 or whenever a new hybrid is detected. The coefficients chosen for non-adaptive filter 64 or non-adaptive filters 31 and 35 depend on the particular hybrid 16 because each different hybrid may have a different impulse response with different pure delay or different dispersion times.

In one embodiment, the pure delay estimation described above in reference to FIGS. 20–24 quickly detects a pure delay, estimated using the sub-rate processing, at the beginning of a call or upon a change which affects the hybrid (such as upon a call transfer or call forward, for example). The method described in reference to FIG. 28 determines both pure delay and dispersion in order to obtain filter coefficients for non-adaptive filter 64 or non-adaptive filters 31 and 35. The pure delay calculation in FIG. 28 is generally more precise; however, it generally takes a longer amount of time to determine. Therefore, the method of FIG. 28 is able to "fine tune" the pure delay estimate provided by FIGS. 20–24 in addition to reduce the effective number of coefficients required by adaptive filter 62. The method of FIG. 28 determines any additional pure delay that needs to be added to delay unit 66 to compensate for the added filter (64 or filters 31 and 35). That is, as will be described below, the addition of filters to shorten the dispersion time also tends to slightly increase the pure delay amount, and therefore, the delay of delay unit 66 (originally determined by the method of FIGS. 20–24) can be updated accordingly. If the monitoring mode of FIG. 24 is used, then each time the ERLE falls below the ERLE threshold, a new pure delay is determined for delay unit 66. Furthermore, the adaptive filter shortening estimation option of FIG. 28 can be enabled in response to the ERLE falling below the ERLE threshold (i.e. in response to a new pure delay being determined for delay unit 66 by the flow of FIG. 21).

In alternate embodiments, the flow of FIGS. 20–24 can be used without the adaptive filter shortening estimation option; or similarly, the adaptive filter shortening estimation option may be present in an echo canceller without the pure delay estimation method of FIGS. 20–24. Alternatively, in an echo canceller having the method of FIGS. 20–24, the adaptive filter shortening estimation option can be enabled independent of the method of FIGS. 20–24. Also, if the option is not enabled, (or if the option is still functioning to determine the new coefficients of adaptive filter 62 as well as the coefficients of the additional non-adaptive filter 64 or additional non-adaptive filters 31 and 35), the additional filter or filters may simply be bypassed (or they may pass the signal through unfiltered).

If the option is enabled at decision diamond 626, flow proceeds to decision diamond 628 where it is determined whether ERLE is good enough. (The ERLE can be calculated as shown above in equation 26 where the ERLE corresponds to a ratio between $P_{Sin}$ and $P_{error}$, and where $P_{Sin}$ and $P_{error}$ can be calculated using equations 1 and 2 described above.) To determined if ERLE is good enough, it can be compared to a threshold. For example, the threshold can be set to a value of greater than 20 dB, or alternatively, can be set within a range of 30 to 40 dB. Generally, the higher the ERLE, the better the signal (because the lower the error, $P_{error}$). A high enough ERLE occurs when no Sgen (near-end talker signal) is present, because otherwise, the ERLE drops. Alternatively, it can be determined from near-end signal detector 26 described above whether a near-end talker signal exists before continuing to determine the ERLE and comparing it against a threshold. If a near-end talker signal exists, or if ERLE is not good enough, flow continues to block 212 of FIG. 9, bypassing the remainder of FIG. 28. However, if the ERLE is good enough (higher than the threshold), flow proceeds to block 630. That is, the adaptive filter shortening estimation option should be performed when a good signal is present and error signal 46 is obtained from a good echo estimation 48. Note that in alternate embodiments, many signals within the system may be used to determine whether good signals are present for performing the option.

In block 630, the pure delay and dispersion based on the current coefficients of adaptive filter 62 are determined. (Note that the details of block 630 will be described in reference to FIG. 29) After block 630, flow proceeds to block 632 where, based on the pure delay and dispersion determined in block 630, the coefficients, W, of the additional non-adaptive filter 64 or filters 31 and 45 as well as the new coefficients of adaptive filter 62 corresponding to the new shortened version of adaptive filter 62 are determined. (Note that the details of block 632 will be described in reference to FIG. 30). Flow then proceeds to decision diamond 634 where it is determined if the new configuration is good enough. That is, different criteria may be used to determine whether the new configuration is satisfactory. For example, in one embodiment, if the reduced number of coefficients of the new configuration is still greater than the desired number of reduced coefficients, the process of block 632 can be repeated in an effort to obtain a further reduced number of coefficients. Alternatively, decision diamond 634 may not be present, such that only one iteration is performed, and the result of block 632 is considered sufficient.

If the new configuration is good enough at decision diamond 634, flow continues to block 636 where adaptive filter 62 is reconfigured. That is, the new coefficients for adaptive filter 62 determined in block 632 are loaded into adaptive filter 62 and adaptive filter 62 is used in combination with non-adaptive filter 64 or in combination with non-adaptive filters 31 and 35. (Note that the details of block 636 will be described in reference to FIG. 31.) Also note that in block 636, the delay value in delay unit 66 can be updated by adding any necessary delay resulting from the addition of non-adaptive filters to the existing delay value in delay 66. Flow then proceeds to block 638 where the filter shortening estimation option is disabled. That is, the flow of FIG. 28 is generally not performed on a per sample basis. It is only performed when needed, such as in those situations described above in reference to the examples for enabling the adaptive filter shortening estimation option. However, in alternate embodiments, the flow of FIG. 28 can be performed on a per sample basis.

Note that in the embodiment illustrated in FIG. 28, blocks 630–638 are performed serially after determining that the ERLE is good enough. However, in alternate embodiments, blocks 630–638 (or a subset of blocks 630–638) can be launched as a separate thread performed in parallel to other tasks of echo canceller 20. Upon completion of the flow of FIG. 28, the method of FIG. 28 can alert echo canceller 20 that the results are ready such that adaptive filter 62 can be updated. Alternatively, echo canceller 20 can be alerted that the entire filter shortening has been completed. For example, a signal or interrupt may be provided to echo canceller 20 to indicate completion of blocks 630-638 (or a subset of blocks 630-638).

Figure 29:
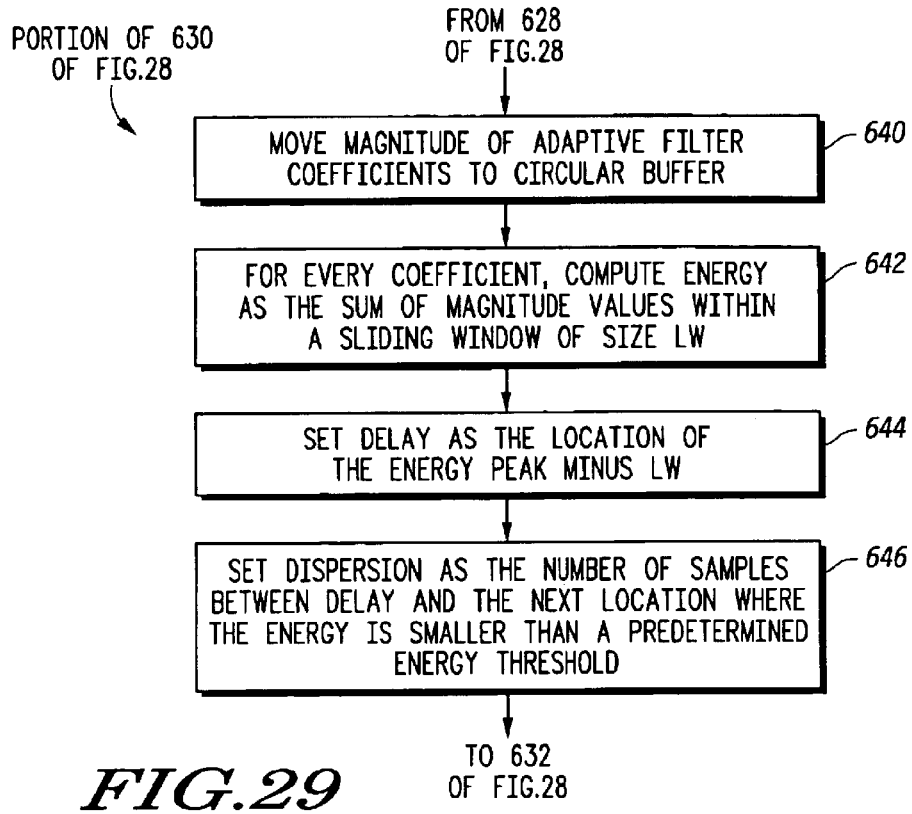

FIG. 29 illustrates a portion of block 630 of FIG. 28. That is, the flow of FIG. 29 illustrates one embodiment of determining the pure delay and dispersion from the current coefficients of adaptive filter 62. Flow begins with block 640 where the magnitude of the coefficients of adaptive filter 62 are moved to a circular buffer. That is, a snapshot of the filter coefficients of adaptive filter 62 is taken and stored in a circular buffer of size N, having locations 0 to N−1. The current coefficients of adaptive filter 62, H, can be represented as $H=[h_0, \ldots, h_{N-1}]$, where $h_0, \ldots, h_{N-1}$ correspond to the coefficients and N corresponds to the number of coefficients or taps of adaptive filter 62. Therefore, the values corresponding to $|h_n|$ are stored in a circular buffer at location "n MOD N", where n corresponds to the sample number, and "|x|" indicates the "magnitude of x" (and corresponds to positive values). The expression "n MOD N" corresponds to the modulus of n which refers to the remainder of the operation n/N. For example, if N is 256 and the value of n is 270, n MOD N refers to 14, where the value of $|h_{270}|$ is wrapped around from "location 270" (which is beyond the range of the circular buffer of size N) to location 14 of the circular buffer. Therefore, if the value of n is greater than N, the value of N can be continuously subtracted from n until n falls within the range of 0 to N−1. Similarly, if the value of n is less than 0, then the value of N can be continuously added to n until n falls within the range of 0 to N−1.

Flow then proceeds to block 642 where for every coefficient, h, the energy E(n) (for n=0 to N−1) is computed as the sum of the magnitude values within a sliding window of size LW. In one embodiment, LW is related to the length of the target window size, i.e. the target number of taps or coefficients after reducing the effective number of coefficients of adaptive filter 62. For example, in one embodiment, LW may correspond to a sliding window of size 10 samples, where 10 taps is the desired filter length. Therefore, if N is 256 (indicating 256 coefficients h of adaptive filter 62), then 256 values of E(n) are determined where each of the 256 values of E(n) is a sum of 10 magnitudes (corresponding to the 10 samples within LW). E(n) can therefore be expressed as shown below in equation 40.

Equation 40:

$$E(n) = \sum_{l=0}^{LW-1} |h_{[n+l-LW]_N}| \quad \text{for } n = 0, 1, \ldots, N-1$$

In the above equation (and other equations described herein), note that the notation $[X]_N$ corresponds to X MOD N. Flow then proceeds from block 642 to block 644 where the delay, D, is set as the location of the energy peak minus LW. That is, after N values of E (the energy within the sliding window LW) are determined, the point (sample time) at which the maximum E occurs minus LW corresponds to the pure delay of the impulse response. Therefore, D can be expressed as shown in equation 41.

$$D = \arg(\max E(n)) - LW \text{ for } n=0, 1, \ldots, N-1 \quad \text{Equation 41}$$

In the above equation, max E(n) refers to the maximum value of E of the N values of E taken, and arg(max E(n)) refers to the argument or point at which the maximum E occurs, where the "argument" corresponds to the sample time. Therefore, D corresponds to the pure delay.

Flow then proceeds to block 646 where the dispersion time corresponds to the number of samples between D and the next location where the energy, E, is smaller than a predetermined threshold. That is, the general trend of E(n) (corresponding to the magnitude of the impulse response) over the range of n=0, 1, ..., N−1 can be described as generally increasing to a maximum peak, and then decreasing back down. Therefore, after reaching the maximum value, E(n) decreases, and the point at which it decreases beyond a predetermined threshold corresponds to the end of the dispersion time, where the dispersion time is therefore the number of samples between D and the point (sample time) at which E(n) reaches the predetermined threshold after having achieved its peak value. The predetermined value can be set to any value which can indicate the end of the dispersion time. For example, in one embodiment, it may be set to 192 samples (i.e. 24 milliseconds at an 8 KHz sampling rate).

Figure 30:
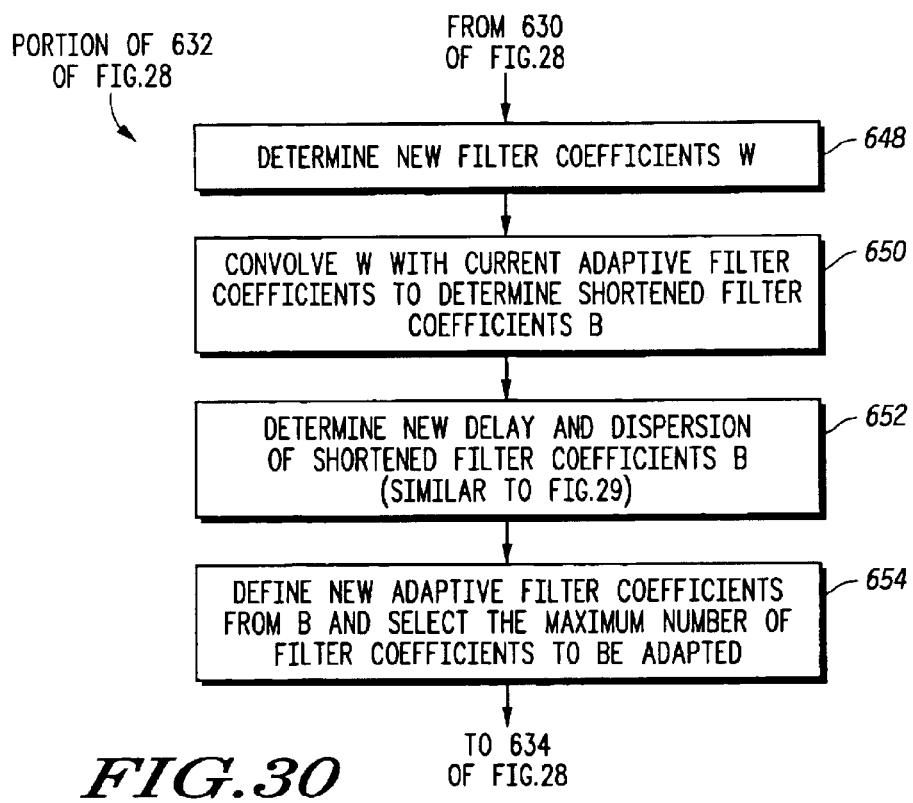

FIG. 30 illustrates one embodiment of a portion of block 632 of FIG. 28 where both (1) the non-adaptive filter coefficients W (for either non-adaptive filter 64 or non-adaptive filters 31 and 35) and (2) the shortened version of the coefficients of adaptive filter 62 are determined. Flow begins with block 648 where the new filter coefficients W (for either non-adaptive filter 64 or non-adaptive filters 31 and 35) are determined (note that the details of block 648 will be described in reference to FIGS. 32–36). Flow then proceeds to block 650 where the coefficients W are convolved with the current adaptive filter 62 coefficients (i.e. with the snapshot taken in block 640 of FIG. 29) to determine the shortened filter coefficients B, where B contains the new coefficients of adaptive filter 62 after the addition of non-adaptive filters 64 or 31 and 35. Flow proceeds to block 652 where a new pure delay, D, and dispersion time of the shortened filter coefficients B are determined. Therefore, the flow of FIG. 29 and equations 40 and 41 may be used to accomplish block 652. Flow then proceeds to block 654 where the new adaptive filter coefficients for adaptive filter 62 are determined from B (i.e. a portion of B with predefined length), and the maximum number of filter coefficients to be adapted is selected (i.e. number of samples in the selected portion of B).

Figure 31:
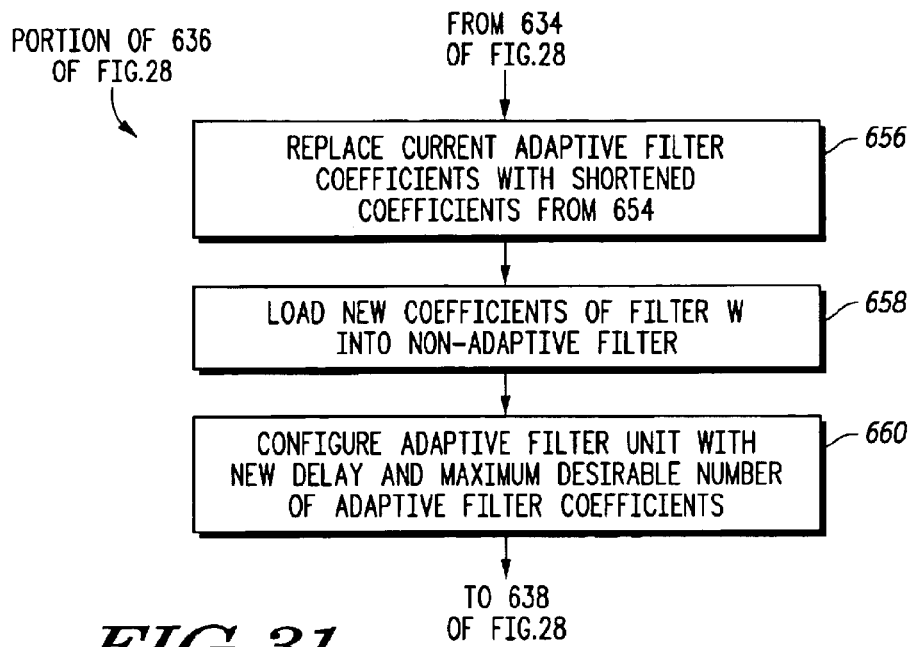

FIG. 31 illustrates one embodiment of a portion of block 636 of FIG. 28 where adaptive filter 62 is reconfigured. Flow begins with block 656 where the current adaptive filter coefficients, H, are replaced with the shortened coefficients determined previously in block 654 of FIG. 30. Flow proceeds to block 658 where the new coefficients W (determined in block 648 of FIG. 30) are loaded into the non-adaptive filter (filter 64 or filters 31 and 35). Therefore, by loading W into the non-adaptive filter or filters, they are enabled to allow adaptive filter 62 to have a reduced filter length. Flow then proceeds to block 660 where delay unit 66 within adaptive filter 28 is updated with a new delay. For example, one embodiment may simply update delay unit 66 with the newly determined pure delay, D. An alternate embodiment may determine the delay currently stored in delay unit 66 and update the existing value as necessary. Alternatively, if the new delay does not vary much from the existing delay within delay unit 66, delay unit 66 may not be updated at all. Also, in block 660, once the adaptive filter 62 is loaded with the new coefficients in block 656, it must be configured to adapt the new number of coefficients.

Figure 32:
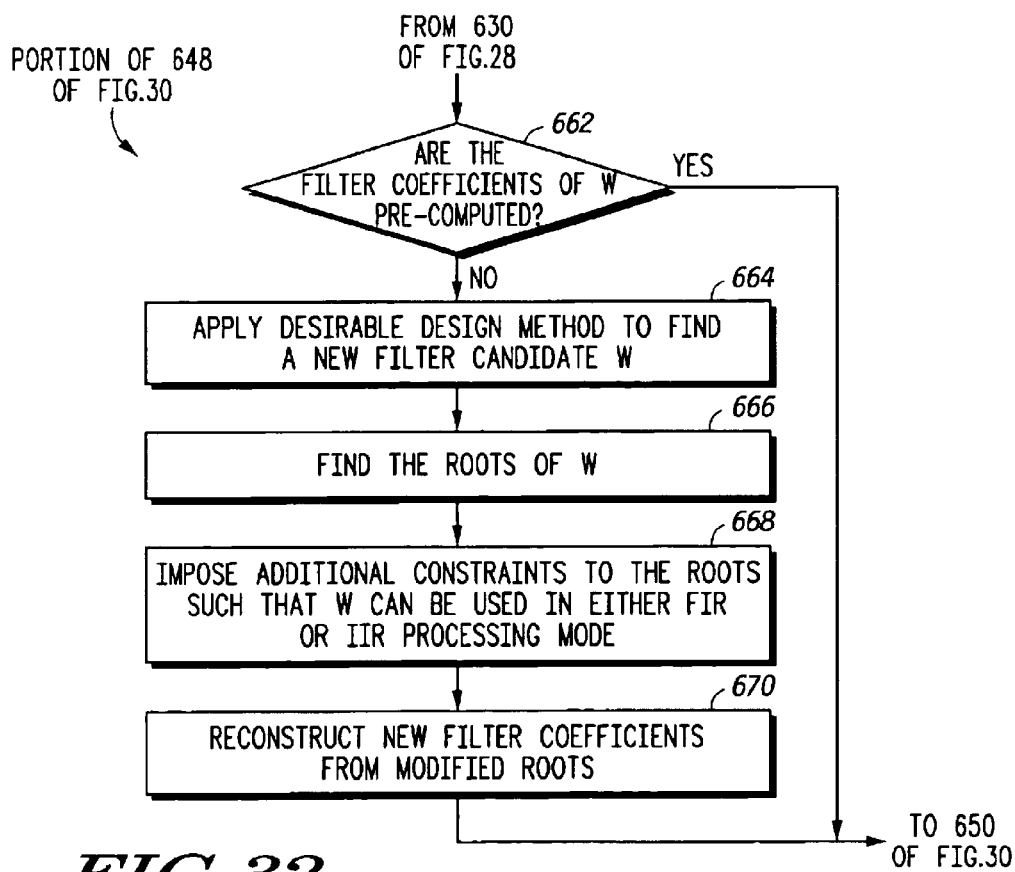

FIG. 32 illustrates one embodiment of block 648 of FIG. 30 where the new filter coefficients W are determined (corresponding to filter 64 or filters 31 and 35). Flow begins at decision diamond 662 where it is determined whether any pre-computed filter coefficients W exist. For example, a library including a variety of different possible sets of W corresponding to different hybrid and channel conditions may exist which have been precomputed, and therefore a new W can simply be selected from the library and flow would proceed to block 650 of FIG. 30 by convolving the adaptive filter coefficients with all existing W's from the library and picking the one that provides the best performance. Alternatively, a single pre-computed W may be used which is most representative of different scenarios. Therefore, W can be computed off-line in a variety of different ways, one of which will be described in reference to FIG. 36, and the pre-computed W can therefore be used. If the filter coefficients W are not pre-computed, flow proceeds to block 664 where any method to determine new filter candidates may be used to find W. Various embodiments for determining W will be described in more detail in reference to FIGS. 33–35.

Flow then proceeds to block 666 where the roots of W are determined. For example, W can be expressed as W=[$W_0$, $W_1$, ..., $W_{M-1}$] where $W_0$, $W_1$, ..., $W_{m-1}$ correspond to the filter coefficients and M corresponds to the number of filter coefficients such that W(z) can be expressed as shown below in equation 42:

$$W(z) = (w_0 z^{M-1} + w_1 z^{M-2} + \ldots + w_{M-2} z + w_{M-1}) z^{1-M} \quad \text{Equation 42}$$

To determine the roots of W, W(z) is set to 0 and solved for z, where z has M−1 solutions. Therefore, the roots R of W(z) can be expressed as R=[$r_0$, $r_1$, ..., $r_{M-1}$] where the roots include complex numbers and their conjugates. W(z)=0 can therefore also be expressed as shown below in equation 43:

$$W(z) = 0 = (z - r_0)(z - r_1) \ldots (z - r_{M-2})(z - r_{M-1}) z^{1-M} \quad \text{Equation 43}$$

Flow then proceeds to block 668 where additional constraints to the roots are imposed such that W can be used in either FIR or IIR processing mode and remain stable. For example, if W is used in an FIR implementation, no imposition of constraints is necessary to ensure stability, but if in an IIR implementation, the roots must be within the unit circle. The unit circle refers to a circle in a plane defined by an x-axis corresponding to real numbers and a y-axis corresponding to imaginary numbers. The unit circle is drawn about the origin (the intersection of the x- and y-axis, corresponding to 0 on both the x- and y-axes), and has a radius of 1. For each root $r_k$ of W(z) that does not lie within the unit circle, $r_k$ is transposed such that it does lie within the unit circle. Alternatively, rather than imposing that the roots be within the unit circle, the constraints can be imposed such that the roots of W(z) be within a circle centered about the origin having a radius of $\rho$, where $\rho$ is less than 1. Therefore, in this embodiment, for each root $r_k$ of W(z) that does not lie within the circle having radius $\rho$, the root $r_k$ is transposed such that it does lie within the circle having radius $\rho$. Therefore, if $|r_k|$ (i.e. the magnitude of $r_k$) is greater than $\rho$, the transposition can be expressed as shown in equation 44:

Equation 44:

$$r_k^{new} = \rho \frac{|r_k|}{r_k^*} \quad \text{for } \rho < 1$$

Note that in the above equation $r^*_k$ denotes the complex conjugate of $r_k$. Flow then proceeds to block 670 where the new filter coefficients $W_{new}$ are constructed from the modified roots. That is, if any of the roots had to be modified due to the constraints imposed in block 668, $W_{new}$ is determined using the modified roots. The new roots can be substituted into equation 43 above for $r_0, \ldots, r_{M-1}$ to provide a new W(z) (i.e. $W_{new}$). $W_{new}$ is then used as the filter coefficients W for the remainder of the flow (which continues with block 650 of FIG. 30). Therefore, FIG. 32 may be used to condition or project the roots of W.

Figure 36:
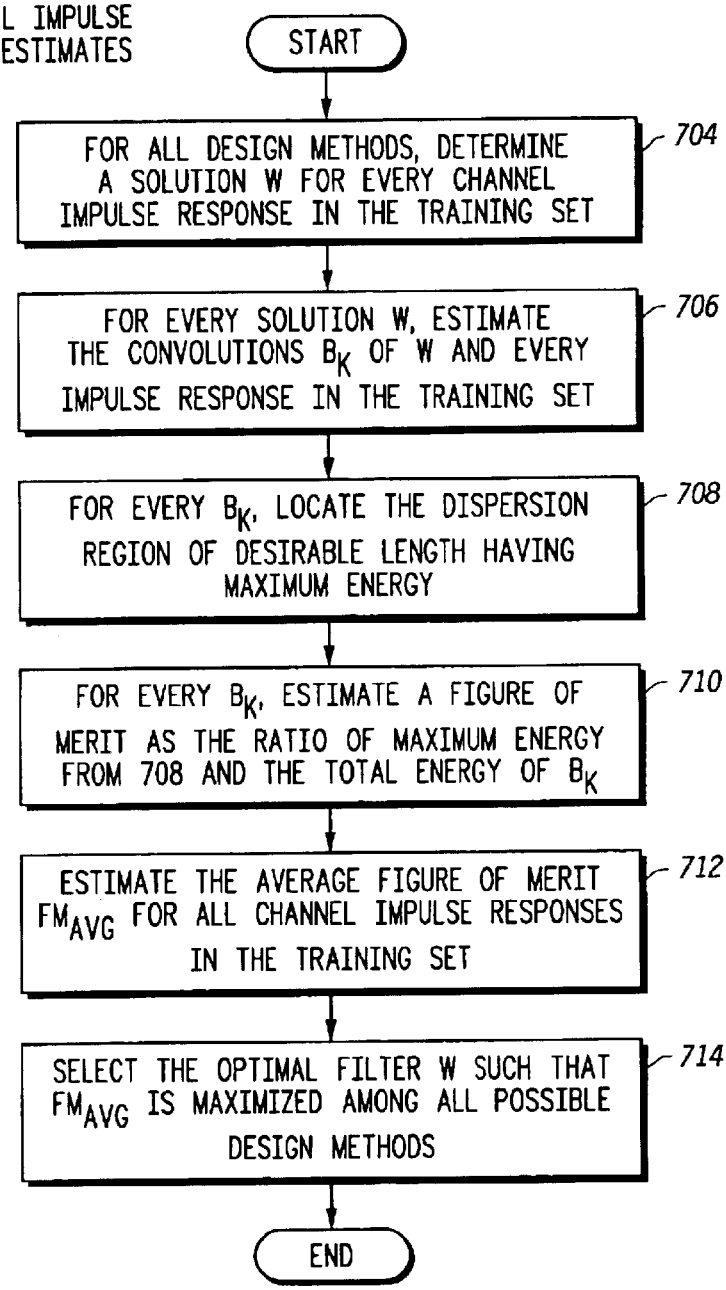

FIG. 36 illustrates one embodiment of a method used to design the filter coefficients W off-line given a training set of impulse response estimates. Flow begins with block 704 where, for all design methods, a solution W is determined for every channel impulse response in the training set. Therefore, if 2 design methods are used for 8 channel impulse responses in the training set, a total of 16 solutions ($W_0$–$W_{15}$) are determined. Furthermore, the method of FIG. 36 is not limited to any particular method of determining W. Flow then proceeds to block 706 where, for every solution W, a convolution, $B_k$, of W and every impulse response in the training set is estimated. Therefore, in the current example where there are 16 solutions ($W_0$–$W_{15}$) and 8 impulse responses in the training set, a total of 128 convolutions are estimated. For any solution W, each $B_k$ can therefore be expressed as $B_k=[b_{k,0},b_{k,1}, \ldots, b_{k,N-1}]$ where $b_{k,0},b_{k,1}, \ldots, b_{k,N-1}$ are the coefficients and N is the length of $B_k$. Note that $[k]_8$ indicates the channel number in the training set.

Flow then proceeds to block 708 where for every $B_k$, the dispersion region of desirable length (i.e. target filter length) having the maximum energy is located. That is, the dispersion region of maximum energy can be located using equations 40 and 41 above, where LW corresponds to the desirable length of the dispersion region. Therefore, the equations for block 708 can be expressed as follows.

Equation 45:

$$E_k(n) = \sum_{l=0}^{LW-1} |b_{k,[n+l-LW]_N}| \quad \text{for } n = 0, 1, \ldots, N-1$$

The above equation is analogous to equation 40 described above. In equation 45, N is the length of the particular $B_k$ and $E_k(n)$ corresponds to the energy within a sliding window LW (corresponding to the desirable length of the dispersion regions). Therefore, N energy values ($E_k(0), \ldots, E_k(N-1)$) are determined for each $B_k$. The dispersion region having maximum energy for each $B_k$ can therefore be determined using the following equation.

$$D_k = \arg\ (\max E_k(n)) - LW \text{ for } n=0, 1, \ldots, N-1 \qquad \text{Equation 46}$$

Equation 46 is analogous to equation 41 described above. In equation 46, $D_k$ corresponds to the pure delay of $B_k$ at the maximum energy, and the dispersion region is therefore the region beginning with $D_k$, ending with $D_k+LW$, and having maximum energy. (Alternatively, the ending of the dispersion region can be defined as the point at which the energy $E_k(n)$ falls below a predetermined threshold, as was described above in reference to equation 41.) Therefore, for each $B_k$, a dispersion region of maximum energy is determined. Flow then proceeds to block 710 where, for every $B_k$, a figure of merit, $FM_k$, is estimated. The figure of merit is defined as the ratio of maximum energy, max $E_k(n)$ (from block 708) and the total energy, $E_k$, of $B_k$. Therefore, $E_k$ can be determined using the following equations:

Equation 47:

$$E_k = \sum_{l=0}^{N} |b_{k,l}|$$

In the above equation, N refers to the length of $B_k$. The figure of merit can therefore be expressed as follows.

Equation 48:

$$FM_k = \frac{\max E_k(n)}{E_k} \quad \text{for } n = 0, 1, \ldots, N-1$$

In the above equation, N refers to the length of $B_k$. Flow proceeds to block 712 where an average figure of merit $FM_{AVG}$ for all channel impulse responses is determined. Every solution $W_k$ (k=0,1, ... 15, in the above example) will have its own average figure of merit $FM_{AVG}$. Flow proceeds to block 714 where the optimal filter W is selected such that $FM_{AVG}$ is maximized among all possible design methods. The method of FIG. 36 can be performed offline and the final selected W can be stored within echo canceller 20 and loaded into non-adaptive filters 64, 31, or 35, as needed.

Note that although the above descriptions of W assume the additional filters are non-adaptive, adaptive filters may be used in place of non-adaptive filters 64, 31, and 35. However, constraints may need to be imposed on W, as described above to ensure stability, and if the filters are adaptive, then the stability constraints may need to be imposed on a per-sample basis, since the filter adaptation may result in an unstable filter.

Figure 33:
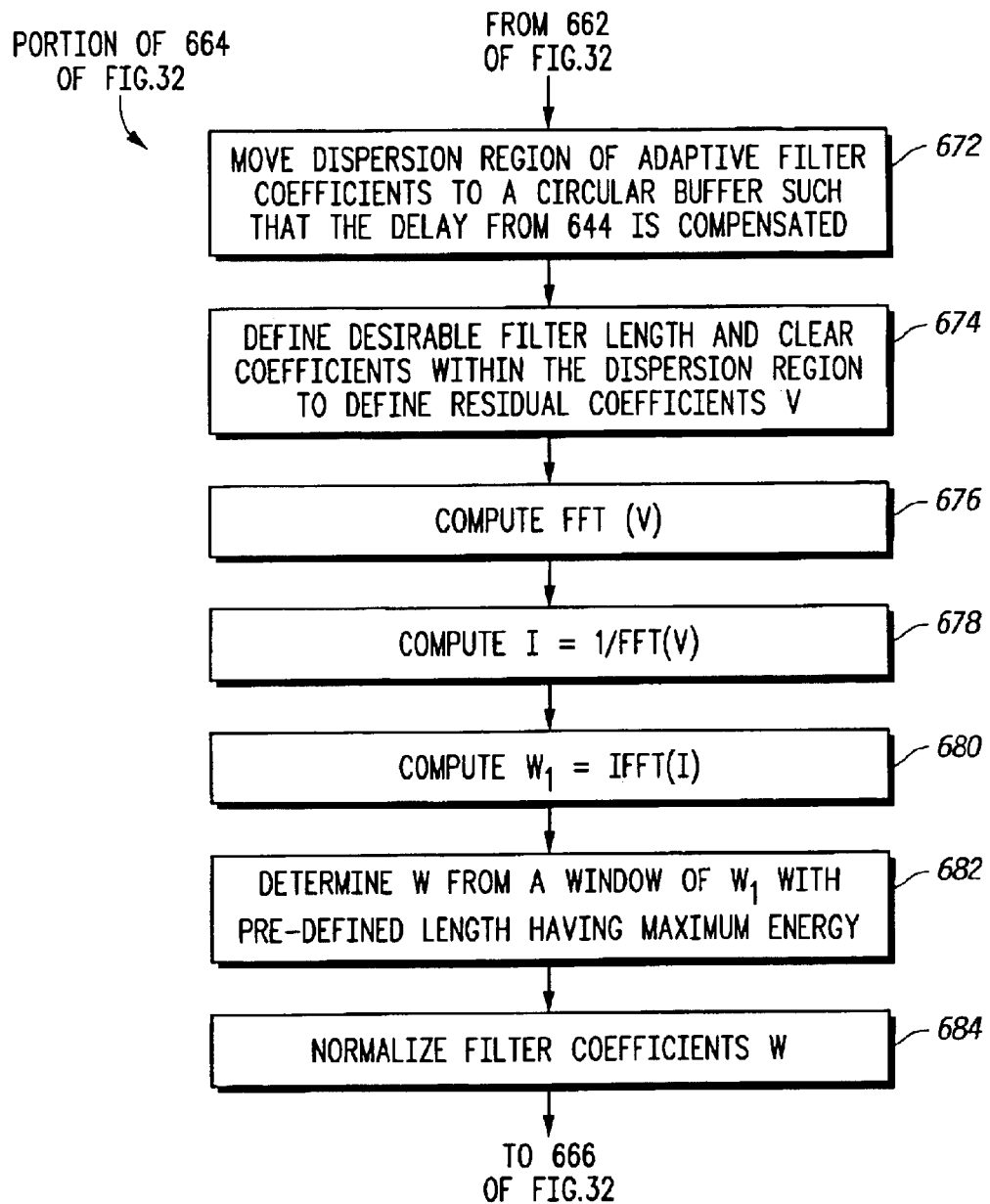
Figure 34:
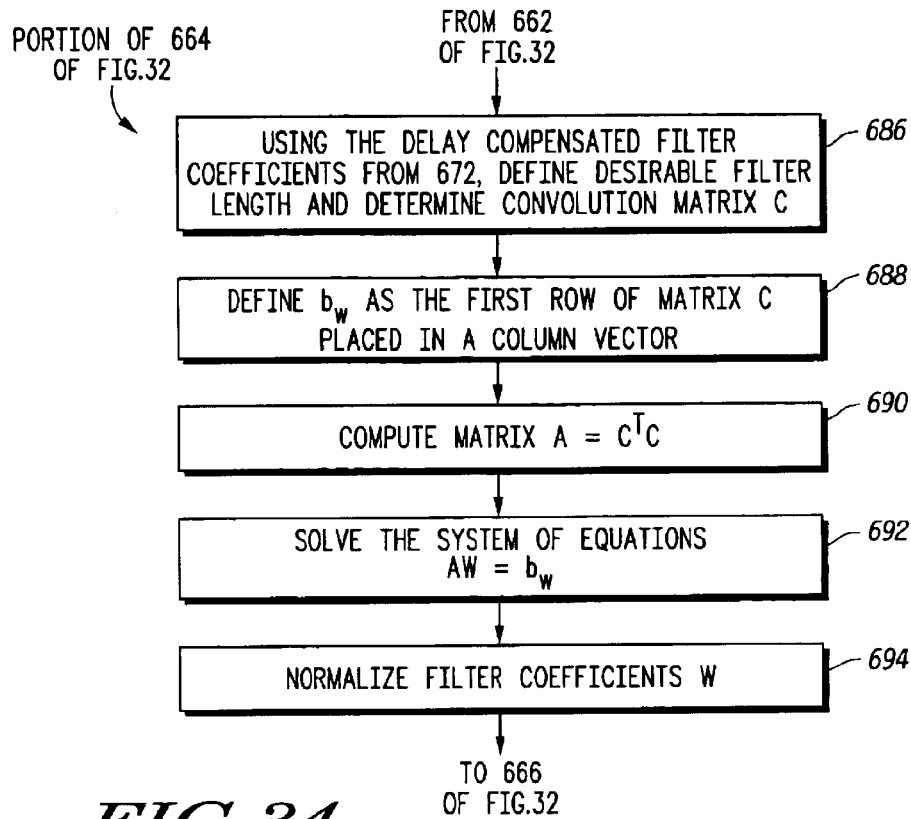
Figure 35:
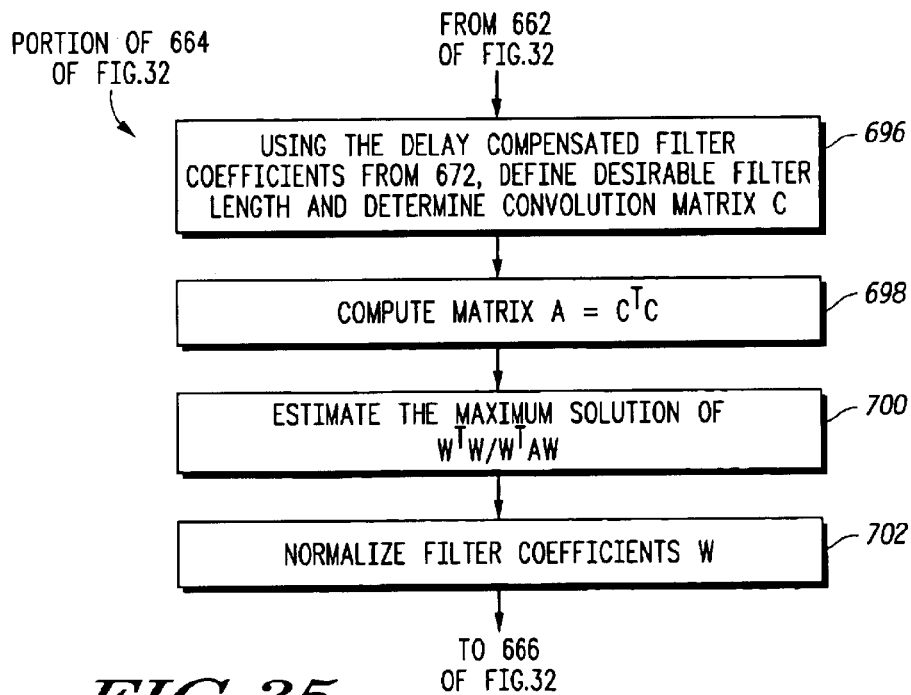

FIGS. 33–35 present possible design methods for determining W. For example, FIGS. 33–35 may correspond to three of the design methods used in block 704 of FIG. 36. Alternatively, any or all of the methods of FIGS. 33–35 can be performed by echo canceller 20 during its operation. In one embodiment, echo canceller 20 may perform all three design methods to determine W (in block 664 of FIG. 32, for example) and in the end (after block 632 of FIG. 28) determine which provided the best solution. Note that a different method may provide the best solution prior to modifying the roots or W (block 668 of FIG. 32) as compared to the best solution after reconstructing the new filter coefficients from the modified roots. Therefore, the different methods may be analyzed or selected at different times by echo canceller 20, depending on the embodiment. Alternatively, a single design method may be used by echo canceller 20.

FIG. 33 illustrates a portion of block 664 of FIG. 32 which corresponds to one design method for determining the new filter coefficients W, in accordance with one embodiment of the present invention. Flow begins with block 672 where the dispersion region of the adaptive filter 62 coefficients are moved to a circular buffer such that the delay, D, (computed in block 644) is compensated. Therefore, the delay compensated coefficients G can be expressed as $G=[g_0, g_1, \ldots, g_{N-1}]$ where $g_0, g_1, \ldots, g_{N-1}$ are the coefficients of the delay compensated coefficients G and N is the length of adaptive filter 62. Therefore, the relationship between H (the uncompensated coefficients of adaptive filter 62 corresponding to the original snapshot taken in block 640 of FIG. 29) and G can be expressed as follows.

$$g_i = h_{[D-i]_N} \text{ for } i=0, 1, \ldots, N-1 \quad \text{Equation 49}$$

Figure 38:
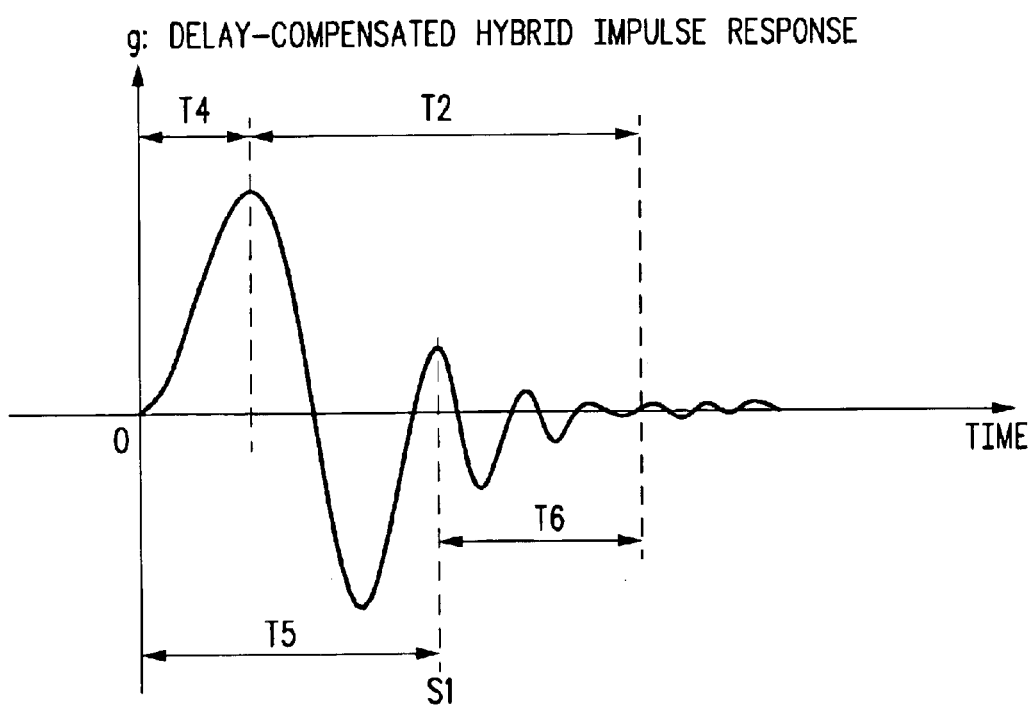

In equation 49, $g_1$ are the delay compensated coefficients which are stored in the ith location of the corresponding circular buffer. FIG. 38 illustrates one embodiment of the example impulse response of FIG. 37 that has been time compensated by the delay, D, (corresponding to T1 of FIG. 37) such that the impulse response begins with the dispersion time (defined by T4+T2 in FIG. 37). Therefore, the coefficients of H are representative of the impulse response of FIG. 37 while the coefficients of G represent the time compensated impulse response of FIG. 38. Flow then proceeds to block 674 where the desirable filter length is defined. For example, in one embodiment, as described above, the desirable filter length is defined to be 10 (where the dispersion time of the impulse response is desired to be compacted into 10 samples). Referring to the example of FIG. 38, the desirable filter length corresponds to T5, the time between 0 and S1, where 0 defines the beginning of the dispersion time (and also corresponds to the first coefficient of G, since G has been delay compensated) and S1 defines the end of the desirable filter length.

Once the desirable filter length is determined, the coefficients of the dispersion region within the desirable filter length are cleared to define the residual coefficients, V. That is, $g_i$ is set to 0 for $i=0, 1, \ldots, S1$. Therefore, V can be expressed as $V=[0, \ldots, 0, v_0, v_1, \ldots, v_{K-1}]$ where K is the number of non-zero components of V and each non-zero coefficient of V is defined as follows.

$$v_j = g_{S1+j} \text{ for } j=0, 1, \ldots, K-1 \quad \text{Equation 50}$$

Therefore, referring to the example of FIG. 38, the coefficients of G corresponding to time T5 are set to zero, and the coefficients of V represent the residual distortion, i.e. the portion of the impulse response corresponding to time T6. Flow proceeds to blocks 676–680 which operate to equalize the residual distortion, V.

In block 676, the fast Fourier transform (FFT) of V is computed. Flow proceeds to block 678 where the inverse, I, of the FFT(V) is computed, where I=1/FFT(V). Flow proceeds to block 680 where $W_1$ is computed as the inverse FFT (IFFT) of I, where $W_1$=IFFT(I). Therefore, $W_1$ is the inverse of V and can be used to equalize the residual distortion, V. Flow proceeds to block 682 where W is determined from a window of $W_1$ with a pre-defined length having the maximum energy (similarly to the estimation of channel dispersion on FIG. 29), where the pre-defined length is the desirable number of adaptive filter taps. Flow then proceeds to block 684 where the filter coefficients W are normalized, for example, by the Euclidean magnitude of W (i.e. $L_2$ norm).

FIG. 34 illustrates an alternate method for determining the coefficients W, according to one embodiment of the present invention. Flow begins with block 686 where, using the delay compensated filter coefficients G (from block 672 and equation 49), a desirable filter length, as described above, is defined and a convolution matrix C is determined. Convolution matrix C can be defined as follows.

$$C = S_L \cdot ConG \quad \text{Equation 51}$$

$S_L$ corresponds to the selection matrix which may be expressed as follows.

$$S_L = [0 \, \vdots \, I] \quad \text{Equation 52}$$

In equation 52, 0 is a $(N+M-L-1) \times L$ zero matrix and I is an $(N+M-L-1) \times (N+M-L-1)$ identity matrix. In this equation, N corresponds to the length of G, M to the length of W (the predefined number of non-adaptive filter taps to accomplish the desirable adaptive filter length), and L to the desirable adaptive filter length. ConG corresponds to the convolution matrix of G and can be expressed as follows.

Equation 53:

$$ConG = \begin{bmatrix} g_0 & 0 & \cdots & \cdots & 0 \\ g_1 & g_0 & 0 & \cdots & 0 \\ g_2 & g_1 & g_0 & \cdots & 0 \\ \vdots & \vdots & \vdots & \ddots & \vdots \\ 0 & 0 & 0 & \cdots & g_{N-1} \end{bmatrix}_{(N+M-1) \times M}$$

The matrix C is therefore obtained from the convolution matrix ConG of the delay compensated filter coefficients G by ignoring its initial L rows, which will define the coefficients of the shortened channel by the end of this design process.

Flow proceeds to block 688 where $b_w$ is defined as the first row of matrix C of equation 51 placed as a column vector. Flow proceeds to block 690 where a matrix A is computed.

$$A = C^T C \quad \text{Equation 54}$$

In equation 54, the notation $C^T$ refers to the transposition of matrix C. Flow proceeds to block 692 where the system of equations given by $AW=b_w$ is solved for W. Flow then proceeds to block 694 where the filter coefficients W are normalized. Anyone skilled in the art will immediately identify that the above solution corresponds to the minimum mean squared error solution of the system $CW=[1, 0, \ldots 0]^T$, which attempts to equalize distortion by considering the overall convolution of the adaptive filter 62 coefficients with W.

FIG. 35 illustrates an alternate method for determining the coefficients W in accordance with another embodiment of the present invention. Flow begins with block 696 where, using the delay compensated filter coefficients G (from block 672 and equation 49), a desirable filter length, as described above, is defined and a convolution matrix C is determined. Therefore, the same C matrix as defined in Equation 51 is used in FIG. 35. Flow then proceeds to block 698, where, as in block 690 of FIG. 34, the matrix A is computed (see equation 54). Flow proceeds to block 700 where the maximum solution of $W^TW/W^TAW$ is estimated.

Note that $W^TW/W^TAW$ provides a ratio of energy of the normalized taps of W weighted by the matrix A, therefore, the maximum solution of $W^TW/W^TAW$ minimizes the energy $W^TAW$ conditioned to $W^TW=1$. Note also that $W^TW/W^TAW$ is equivalent to $W^TIW/W^TAW$ where I is the identity matrix, such that the solution W is the generalized eigenvector corresponding to the largest eigenvalue of the pair (I, A), which can be computed using any off-the-shelf algorithm for estimating eigenvectors. Flow then proceeds to block 702 where the filter coefficients W determined in block 700 are normalized.

Therefore, FIGS. 33–35 provided three design methods that may be used to determine the filter coefficients W. Note that the method of FIG. 33 attempts to equalize residual distortion outside of the desirable (target) filter length. The method of FIG. 34 is more global in that it attempts to equalize distortion while considering the overall convolution of the adaptive filter 62 coefficients with W. However, FIG. 34 results in more complex equations. The method of FIG. 35 attempts to actually minimize the energy of the residual distortion after the convolution of the coefficients of adaptive filter 62 and W. As discussed above, all methods may be implemented by echo canceller 20 and the best solution is chosen either prior to modifying the roots of W or after reconstructing the new filter coefficients W from the modified roots.

In the foregoing specification, the invention has been described with reference to specific embodiments. However, one of ordinary skill in the art appreciates that various modifications and changes can be made without departing from the scope of the present invention as set forth in the claims below. For example, any of the methods taught herein may be embodied as software on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the block diagrams may different blocks than those illustrated and may have more or less blocks or be arranged differently. Also, the flow diagrams may also be arranged differently, include more or less steps, be arranged differently, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A filter having a first dispersion time for filtering a signal, comprising:
   an adaptive infinite impulse response (IIR) filter for processing the signal and producing an intermediate signal at a first adaptive rate, wherein the first adaptive rate indicates when filter coefficients of the IIR filter are changed; and
   an adaptive finite impulse response (FIR) filter having a second dispersion time for processing the intermediate signal at a second adaptive rate, wherein the second adaptive rate indicates when filter coefficients of the FIR filter are changed;
   wherein the first adaptive rate is less than the second adaptive rate, and the second dispersion time is less than the first dispersion time.

2. The filter as claim 1, wherein the second adaptive rate is periodic and the first adaptive rate is event driven.

3. The filter as claim 1, wherein the first adaptive rate is at least 10 times less than the second adaptive rate.

4. The filter as claim 1, wherein the filter is used in an echo canceller.

5. The filter as claim 1, wherein the adaptive IIR filter is stable.

6. The filter as in claim 1, further comprising:
   delay circuitry, coupled to at least one of the adaptive IIR filter or the adaptive FIR filter, for delaying the signal.

7. The filter as claim 1, wherein the first adaptive rate is zero and the adaptive IIR filter functions as a non-adaptive filter.

8. The filter as in claim 1, further comprising:
   control circuitry, coupled to at least one of the adaptive IIR filter or the adaptive FIR filter, for selectively pausing adaptation of a plurality of filter coefficients for the at least one of the adaptive IIR filter or the adaptive FIR filter.

9. The filter as claim 1, further comprising:
   initialization circuitry, coupled to at least one of the adaptive IIR filter or the adaptive FIR filter, for minimizing transients when a plurality of coefficients of the adaptive IIR filter are changed in response to a predetermined event.

10. The filter as claim 1, wherein altering a plurality of coefficients of the adaptive IIR filter to effectively bypass the adaptive IIR filter requires an increase in a filter length of the adaptive FIR filter.

11. The filter as claim 1, wherein altering a plurality of coefficients of the adaptive IIR filter to effectively bypass the adaptive IIR filter requires an increase in convergence time of the adaptive FIR filter.

12. A method for performing adaptive filtering of a signal based on an effective dispersion time, comprising:
   filtering the signal with an adaptive infinite impulse response (IIR) filter at a first adaptive rate to produce a first filtered output, wherein the first adaptive rate indicates when filter coefficients of the adaptive IIR filter are changed; and
   filtering the first filtered output with an adaptive finite impulse response (FIR) filter based on an intermediate dispersion time and at a second adaptive rate to produce a second filtered output, wherein the second adaptive rate indicates when filter coefficients of the adaptive FIR filter are changed,
   wherein the first adaptive rate is less than the second adaptive rate and the intermediate dispersion time is less than the effective dispersion time.

13. The method as claim 12, further comprising:

using the second filtered output to estimate echo for performing echo cancellation in a communication system.

14. The method as claim 13, further comprising:

enabling adaptation of the adaptive IIR filter in response to occurrence of a first event.

15. The method as claim 14, wherein the step of enabling comprises:

determining if a user programmable control flag is asserted.

16. The method as claim 15, wherein the step of enabling further comprises:

determining if a parameter of the communication system meets a predetermined criterion.

17. The method as claim 14, wherein there is no real time constraint for providing a new plurality of filter coefficients in response to the first event.

18. The method as claim 14, the method further comprising:

using a plurality of coefficients from the adaptive FIR filter to determine a plurality of coefficients for the adaptive IIR filter.

19. The method as claim 18, wherein the step using a plurality of coefficients from the adaptive FIR filter to determine a plurality of coefficients for the adaptive IIR filter comprises:

constraining at least one filter root.

20. The method as claim 19, wherein the adaptive FIR filter is stable.

21. The method as claim 14, further comprising:

disabling adaptation of the adaptive IIR filter in response to occurrence of a second event.

22. The method as claim 12, further comprising:

determining pure delay of the adaptive FIR filter; and determining dispersion of the adaptive FIR filter.

23. The method as claim 22, further comprising:

using the pure delay and the dispersion to selectively adjust at least one coefficient of the adaptive IIR filter; and using the pure delay and the dispersion to selectively adjust at least one coefficient of the adaptive FIR filter.

* * * * *